United States Patent
Bonke et al.

[11] Patent Number: 5,812,564
[45] Date of Patent: Sep. 22, 1998

[54] DISK DRIVE WITH EMBEDDED FINITE FIELD PROCESSOR FOR ERROR CORRECTION

[75] Inventors: Carl Bonke, Rancho Santa Margarita; Trinh Bui, Mountain View; Stanley Chang, Irvine; Joanne Wu, Diamond Bar; Phong Tran, Irvine, all of Calif.

[73] Assignee: Western Digital Corporation, Irvine, Calif.

[21] Appl. No.: 436,515

[22] Filed: May 8, 1995

[51] Int. Cl.[6] .............................. G11C 29/00; G11B 5/09
[52] U.S. Cl. ......................... 371/40.1; 371/40.2; 260/48
[58] Field of Search .................................. 371/37.1, 37.5, 371/37.4, 38.1, 39.1, 40.1, 40.2, 40.3, 40.4; 260/48

[56] References Cited

U.S. PATENT DOCUMENTS

| | | | |
|---|---|---|---|
| 4,730,321 | 3/1988 | Machado | 371/38.1 |
| 5,272,661 | 12/1993 | Raghavan et al. | 364/746.1 |
| 5,345,347 | 9/1994 | Hopkins et al. | 360/71 |
| 5,412,666 | 5/1995 | Squires et al. | 371/37.4 |
| 5,422,895 | 6/1995 | Nguyen et al. | 371/37.5 |
| 5,471,353 | 11/1995 | Codilian et al. | 360/73.03 |

*Primary Examiner*—Reba I. Elmore
*Assistant Examiner*—Emmanuel L. Moise
*Attorney, Agent, or Firm*—Leo J. Young

[57] ABSTRACT

A disk drive having error detection and correction capability includes a dedicated finite field processor for performing corrections and for generating software syndromes for miscorrection detection. The processor operates over a finite field under program control and performs parallel finite field multiplication and addition operations in a single execution cycle.

36 Claims, 28 Drawing Sheets

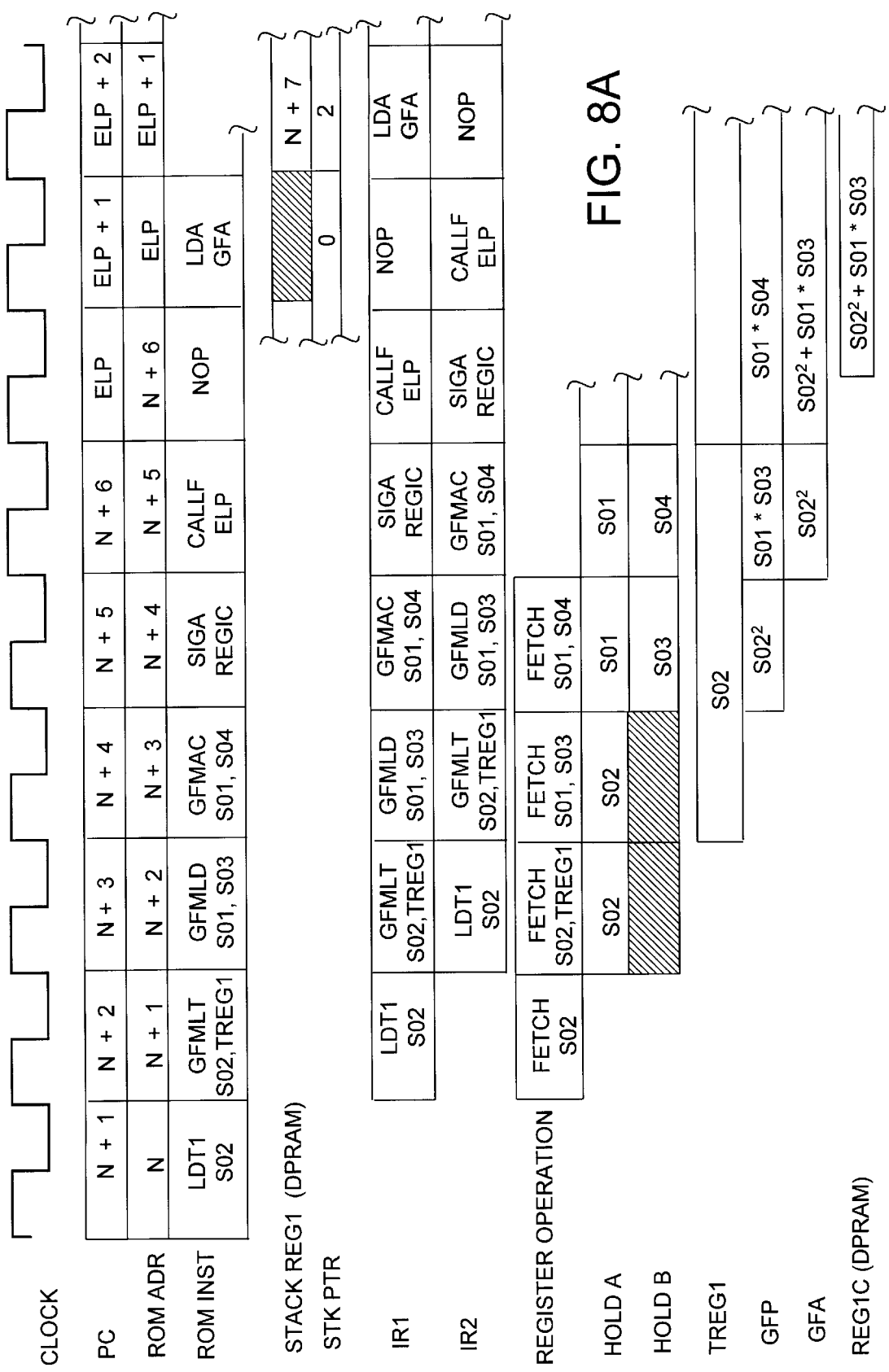

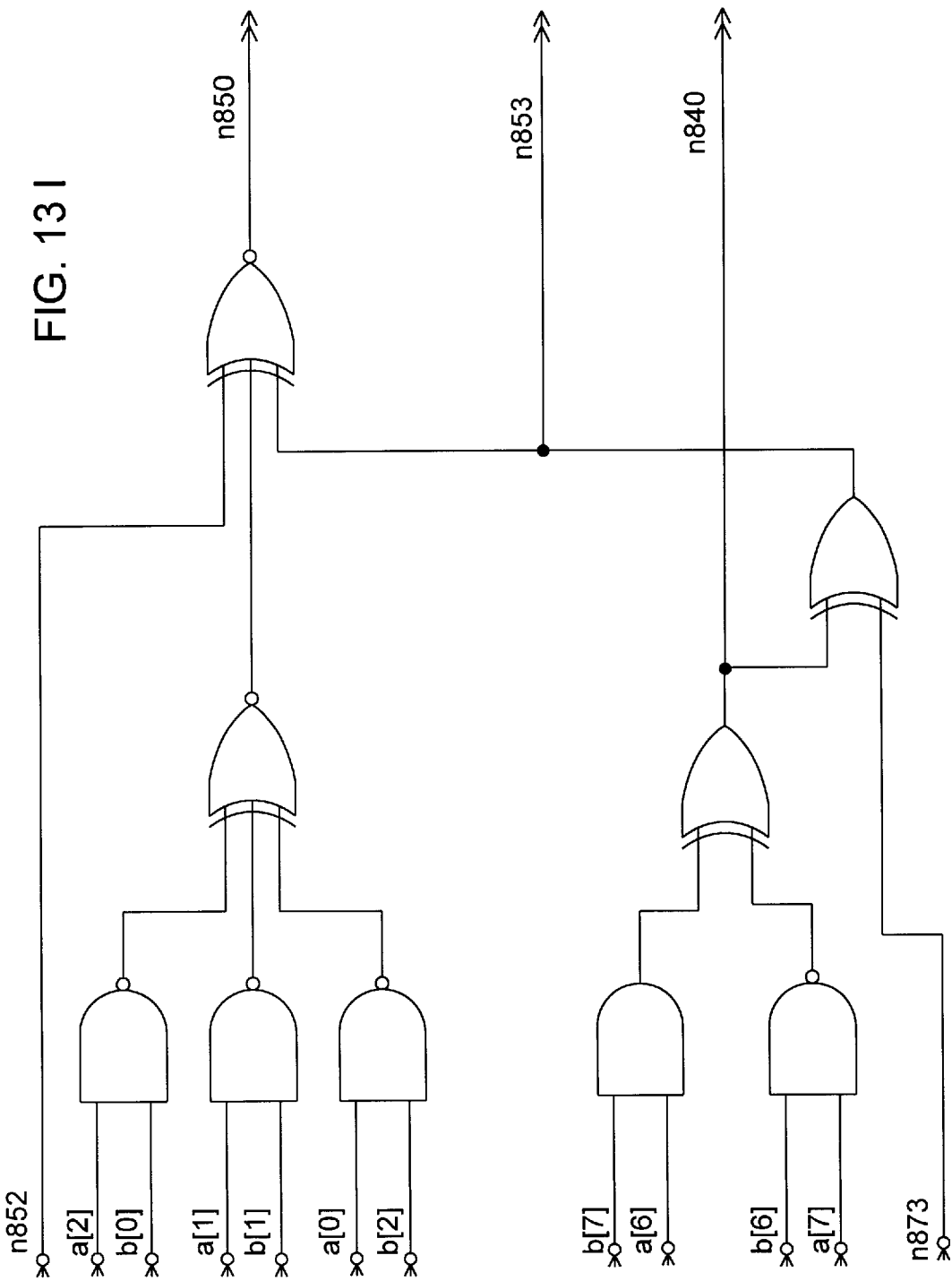

DISK DRIVE WITH EMBEDDED FINITE FIELD PROCESSOR FOR ERROR CORRECTION

BACKGROUND OF THE INVENTION

1. Field of the Invention

The present invention relates to data storage devices. More particularly, the present invention relates to rotating magnetic disk data storage devices.

2. Description of the Prior Art and Related Information

Rotating magnetic disk data storage devices, or "disk drives," are a key component in a majority of computer systems. This is due to their capability of providing reliable permanent data storage, along with rapid access to the data stored on the magnetic disks. A key requirement of data storage systems is the reliability of the stored and retrieved data provided to the host. Data read from the data storage disks may have errors therein for a variety of reasons. For example, physical defects on the disk surface, noise in the read channel, track centerline offset, temperature variations and the effects of certain patterns will cause occasional errors in the reading of data. Furthermore, the manner in which data is encoded before being written on the disk can cause a single bit error to propagate to form an error "burst". In order to prevent sending bad data to the host, and to obtain a cost effective design with high reliability and data integrity, most disk drives employ some type of error detection and correction system.

The speed of the disk drive is a key measure of the performance of the storage system. The speed of the disk drive is measured both by access time, i.e., the time to access and retrieve a given block of data, and the speed at which the data can be transferred to the host (i.e. throughput). The time required to detect and to correct errors can directly impact both the access time and the throughput of the disk drive.

For example, to allow error detection and immediate correction without affecting disk drive access time, the error correction circuitry must be able to complete the correction "on-the-fly". In other words, the error detection and correction circuitry must detect and correct errors without incurring significant disk rotational latency. Alternatively, error correction may be performed after multiple sectors are read on-the-fly into a buffer memory without correction. Such an "off-line" correction approach will impact throughput to the host, however, as the corrections are done on the buffered read data.

At the same time, as capacity and hence bit densities on the disks increase, the error tolerance requirements increase. For example, older systems with lower bit densities only needed to perform error correction at the rate of one error every $10^{10}$ bits or, at most, one error every $10^8$ bits. Disk drives having increased bit densities and complex data patterns may have to accommodate much higher error rates, e.g., one error every $10^6$ or $10^5$ bits. Such error rates result in multiple errors in a single sector being a likely occurrence. Also single or multiple errors in consecutive sectors becomes a more likely occurrence.

In order to perform error detection and correction on-the-fly and accommodate back-to-back sector errors, the error correction system has one sector time to detect errors and one sector time to correct them. Otherwise the data read operation must be halted for a disk revolution to allow the correction circuitry to catch up.

In order to improve end user data integrity while the read bit error rate rises, increasingly robust error detection and correction circuitry has been developed. For example, many error correcting circuits now employ complex error correction codes to perform error detection and correction instead of a simpler cyclic redundancy check code. Such increasingly robust codes can impose significant overhead in terms of disk drive performance, however.

Most error detection and correction systems employed in disk drives are based upon well known algebraic based codes such as the Reed-Solomon code. During a disk write operation user data is typically processed by a binary error detection code (EDC). The user data is also processed by an error correction code (ECC). The resulting data including user data, error detection and error correction check symbols form a codeword. The codeword is written onto the disk during a disk write operation.

During the disk read operation, the codeword is read from the disk. A syndrome generator is used to generate ECC syndromes and EDC syndromes from the codeword. A number of approaches have been implemented to analyze the syndrome to provide error detection and correction.

One approach to error correction uses a burst trapping algorithm (Meggitt decoder). In this method, the error corrector uses the composite syndrome generated by the syndrome generator. The composite syndrome is shifted through the inverse of the ECC generator polynomial until a correctable pattern is detected. The number of shifts needed to determine the correctable pattern supplies the location of the error. The magnitude of each error at each location is also calculated by the error corrector. While this approach may operate on-the-fly it is presently limited to correcting a single error "burst" per sector, even if the error correction code is capable of correcting more than one error.

Once the error corrector has calculated the error location and magnitude, the error corrector returns the corrected codeword to the syndrome generator for validation. The syndrome generator generates syndromes based on the corrected codeword. If the resulting syndromes equal zero, the error locations and magnitudes calculated by the error corrector are valid. This approach requires the syndrome generator to generate a minimum of two syndromes, one for the codeword and one for the corrected codeword. This delays syndrome generation and error correction for every codeword containing a detected error.

In a second approach, which may be combined with burst trapping, "heroic" error correction is performed by the disk drive microprocessor. That is, the microprocessor implements a complex algorithm on the data having a detected error. This approach is relatively slow since the microprocessor must be accessed each time an error is detected. Therefore, such approach cannot presently provide full error correction on-the-fly and data throughput to the host is negatively impacted.

In an alternate approach, a finite field processor has been proposed to perform Galois Field mathematical operations for error correction. This approach is set out in Glover and Dudley; Practical Error Correction Design for Engineers, 1988. However, this implementation requires multiple steps to complete each finite field multiplication calculation. Specifically, each such calculation requires a logarithm ROM table look-up operation, a binary addition and an anti-log table look-up operation. This multiple step approach requires significant time and is therefore undesirable for correcting errors on-the-fly.

Such error correction and detection prior art systems thus have disadvantages related to the number of bursts that can be corrected and/or the speed at which the errors can be corrected.

Accordingly, it will be appreciated that a need presently exists for a disk drive employing an improved error correction and detection system to allow increased bit density and capacity while maintaining or increasing data reliability. It will further be appreciated that a need presently exists for a disk drive which can correct errors in read data without incurring significant disk rotational latency and which can provide error corrected data to a host system at high data transfer rates.

SUMMARY OF THE INVENTION

The present invention provides solutions to the above noted problems. This solution provides an intelligent disk drive, adapted for use with a host, which is capable of correcting errors at high speed thus handling relatively high error rates without incurring significant disk rotational latency or reducing data throughput to the host. This solution permits increased disk bit density and corresponding capacity while maintaining or increasing data reliability through an improved error correction and detection system.

In one aspect, the invention can be regarded as a disk drive, adapted for storing user data provided from a host, which comprises a data storage disk having a plurality of data tracks on a disk surface. The disk drive provides means for reading and writing data to and from the data tracks on the data storage disk and a host interface and disk controller, coupled to receive host commands from, and provide and receive user data to and from, the host. The host interface and disk controller comprises a check symbol/syndrome generator means which generates error correction code and error detection code check symbols which are appended to the user data. The user data, including the error correction code and error detection code check symbols, is written to the data storage disk during write operations. The check symbol/syndrome generator means also generates error correction syndromes during read operations and provides error correction syndromes corresponding to detected errors.

The host interface and disk controller of the disk drive also provides a programmable error corrector means which employs the error correction code syndromes for correcting errors in the user data read from the data storage disk. The error corrector means provides finite field processor means for calculating over a finite field. Further, the error corrector means provides means for storing an error correction control program including instructions executable by the finite field processor means wherein the finite field processor means provides parallel execution of multiplying and accumulating operations during execution of the instructions.

The disk drive as summarized above has significant advantages because the programmable error corrector means provides maximum flexibility to perform error correction and validate error correction results with tailored error corrector microcode program instructions. The finite field processor means provides robust processing power dedicated to error correction and validation which permits rapid finite field calculations, in part, because the finite field processor means provides parallel execution of finite field multiplication and finite field addition. The finite field processor means performs calculations over $GF(2^8)$ and the error correction code check symbols are each 8 bits.

The parallel multiplication and addition operations may be performed in response to a single instruction. The results of the finite field multiplication are stored in a product register and the results of the finite field addition are stored in an addition register.

The programmable error corrector means of the disk drive further provides a dual ported register file which supports the parallel finite field processing means by providing two operands for processing at any time. In addition, the parallel structure of the programmable error corrector means is enhanced by the provision of an arithmetic logic unit, separate from the finite field processor means, for performing arithmetic and logic operations in parallel with the finite field operations performed by the finite field processor means.

In another aspect of the disk drive of the present invention, the finite field processor means includes a combinatorial logic array for providing single step finite field multiplication operations during execution of said instructions during a single clock cycle. The combinatorial logic array comprises a plurality of unclocked binary logic gates coupled in a combinatorial relationship defined by said finite field wherein the combinatorial logic array performs said multiplication operation in a time period equal to the propagation delay of said logic gates.

In another aspect, the invention can be regarded as a disk drive controller for use with a data storage mechanism including a data storage disk. The disk drive controller comprises check symbol generator means for generating error correction code check symbols; means for appending the error correction code check symbols to user data to be written to the data storage disk; syndrome generator means for generating error correction code syndromes from the codewords provided from the data storage disk during read operations and for providing error correction code syndromes corresponding to detected errors; and programmable error corrector means for correcting the detected errors employing the error correction code syndromes.

The programmable error corrector means of the disk drive controller includes finite field processor means for calculating over a finite field, and means for storing an error correction control program including instructions executable by the finite field processor means.

The finite field processor means comprises finite field multiplication means for performing a finite field multiplication operation in a single execution cycle; finite field addition means for performing a finite field addition operation in the same execution cycle as the multiplication operation; and means for storing the results of the finite field multiplication operation and the finite field addition operation. The disk drive controller uses separate circuitry for the finite field multiplication means and the finite field addition means and the means for storing comprises a product register and an addition register.

The finite field processor means further comprises first and second operand holding registers and means for selectively providing first and second operands from either: the first and second operand holding registers, the product register contents or the addition register contents, to the finite field multiplication means and the finite field addition means for further processing.

The multiplication and addition operations occur in response to a single instruction.

The means for storing an error correction control program further comprises memory for storing look-up tables used for performing finite field operations and wherein the finite field processor means includes means for generating look-up table addresses.

In another aspect of the disk drive controller of the present invention, the programmable error corrector means includes means for storing an error correction control program including instructions executable by the finite field processor means, said instructions including a multiply and accumulate instruction corresponding to combined finite field addition and multiplication operations, and means for decoding said instructions including said multiply and accumulate instruction, wherein said finite field processor means performs a finite field addition operation and a finite field multiplication operation in response to a single decoded multiply and accumulate instruction. The finite field processor means comprises: finite field multiplication means for performing a finite field multiplication operation; finite field addition means for performing a finite field addition operation; and means for storing the results of said finite field multiplication operation and said finite field addition operation, wherein said finite field processor means performs a finite field addition operation and a finite field multiplication operation in parallel in response to a multiply and accumulate instruction.

In yet another aspect of the invention said finite field processor means performs a finite field addition operation and a finite field multiplication operation in a time sequential manner in response to a multiply and accumulate instruction.

In another aspect, this invention provides a method for correcting data errors in data read from a disk drive, the data errors corresponding to syndromes detected in the read data, comprising the steps of: reading instructions in a stored error correction control program, the instructions including instructions corresponding to error correction calculations including finite field addition and multiplication operations; decoding the instructions and fetching stored operands corresponding to decoded instructions corresponding to finite field operations on the operands; and performing finite field multiplication and addition operations on selected ones of the operands in parallel. The operands corresponding to the decoded instructions are syndromes and the parallel finite field multiplication and addition operations are performed in a single execution cycle.

In yet another aspect, this invention provides a method for correcting data errors in data read from a disk drive, said data errors corresponding to syndromes detected in said read data, comprising the steps of: reading instructions in a stored error correction control program, the instructions including instructions corresponding to error correction calculations including multiply and accumulate instructions corresponding to combined finite field addition and multiplication operations; decoding the instructions including the multiply and accumulate instructions; fetching stored operands selected by the decoded instructions; and performing finite field addition and multiplication operations on selected operands time sequentially in response to a decoded multiply and accumulate instruction.

This method further comprises the steps of decoding an instruction corresponding to a table look-up operation and performing a table look-up operation. The step of performing a table look-up operation retrieves stored table values which may correspond to a finite field division operation or to other operations.

The time sequential finite field addition and multiplication operations are performed based on different clock signals.

Accordingly, this invention provides an apparatus and method for performing error correction and validation using a programmable error corrector having an embedded finite field processor. The parallel structure of the finite field processor provides robust error correction and validation. These and other features and advantages of the present invention are described and claimed in more detail below.

BRIEF DESCRIPTION OF THE DRAWINGS

FIG. 8A shows the contents of key elements of the error corrector of FIG. 5 on a cycle-by-cycle basis as a portion of the microcode performing an error location subroutine is processed by the error corrector.

FIGS. 13A–13K are schematic drawings of the Galois Field multiplier of FIGS. 6A and 6B in accordance with a preferred embodiment of the present invention.

DETAILED DESCRIPTION OF A PREFERRED EMBODIMENT OF THE INVENTION

For the following description of the present invention reference may be made to the Glossary at the end hereof for definitions of terms used herein.

Figure 1:
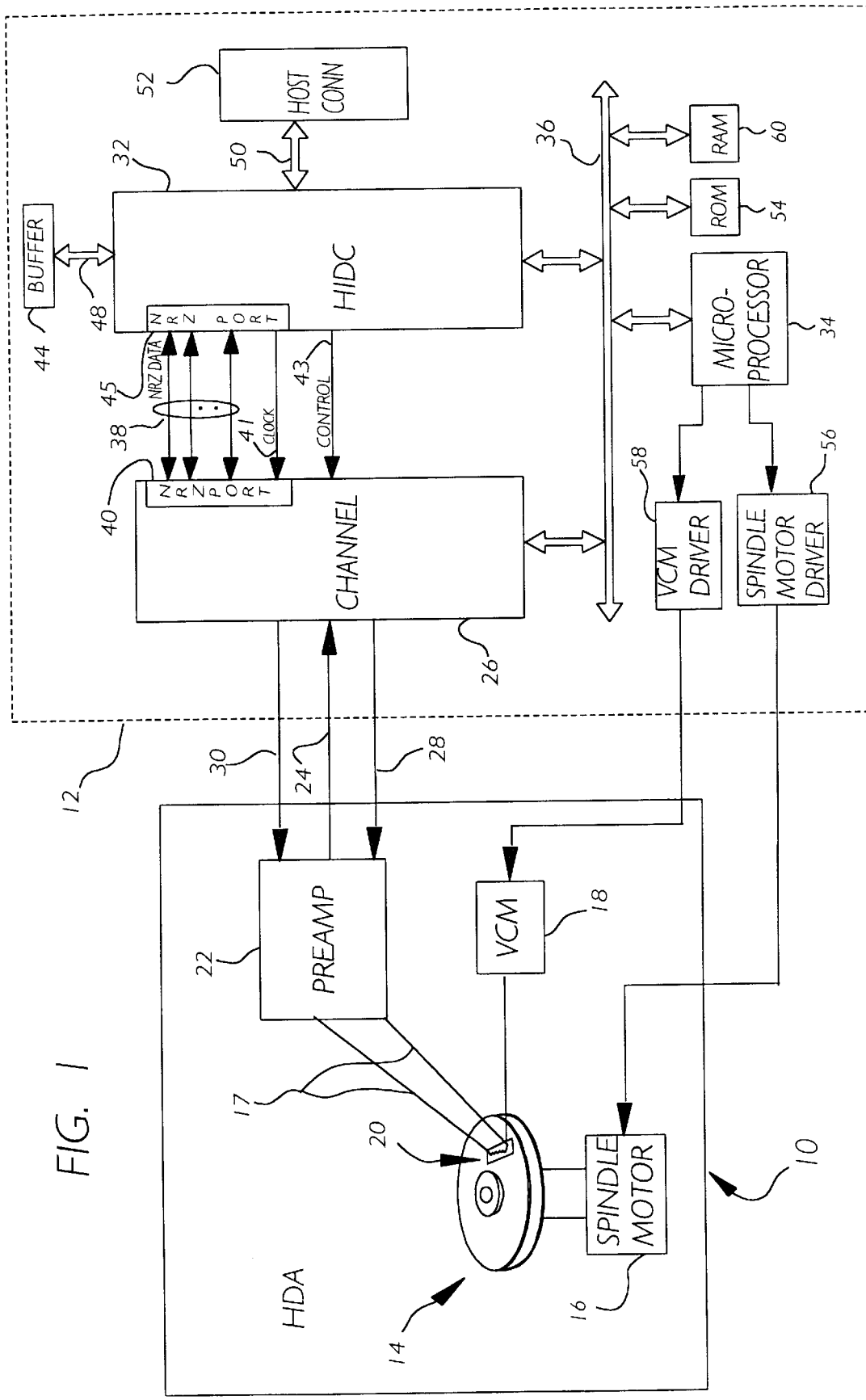
FIG. 1 is a block schematic drawing of the disk drive of the present invention illustrating the principal electromechanical components as well as the disk drive controller circuitry, in accordance with a preferred embodiment of the present invention.

Referring to FIG. 1, a disk drive in accordance with a preferred embodiment of the present invention is illustrated in a block schematic drawing. As shown in FIG. 1, the disk drive includes a head disk assembly (HDA) 10 which includes the electromechanical components of the disk drive and a printed circuit board (PCB) 12 which contains the disk drive control circuitry in a plurality of integrated circuits (ICs). The HDA 10 and PCB 12 are shown schematically for ease of illustration in FIG. 1 and will be described in more detail below with respect to a preferred physical layout.

More specifically, HDA 10 includes rotatable data storage disks 14 (only two of which are illustrated for convenience in FIG. 1) on which the data is stored in one or more tracks. These data storage disks may preferably be rigid magnetic data storage disks. The tracks preferably include embedded servo information which is interspersed with the data in a manner described in more detail below. The disks 14 are rotated by a spindle motor 16. HDA 10 also includes an actuator assembly including an actuator motor 18, in a preferred embodiment being a voice coil motor (VCM), which moves means for reading and writing data including read/write transducers 20 to the tracks at different radial positions on disk 14. (Although only a single transducer 20 is shown in FIG. 1 for convenience of illustration, it will be appreciated that a transducer 20 will be provided for each disk surface which has data written thereon.) The read/write transducers may preferably be magnetic transducers, and in a presently preferred embodiment a magneto-resistive read transducer mounted together with an inductive write transducer. HDA 10 also includes read/write preamplifier 22. Read/write preamplifier and head multiplexor ("preamp") 22 may be a commercially available integrated circuit; for example, an SSI 4670 integrated circuit manufactured by Silicon Systems Inc., Tustin, Calif. Preamp 22 includes an initial broad bandwidth preamplifier for amplifying analog read signals provided by a particular head 20 selected for reading. Preamp 22 provides the preamplified analog read signals along lines 24 to the PCB 12. During write operations preamp 22 receives write signals along line 28 from PCB 12 and provides a write current to the particular head 20 selected for writing. A mode select signal provided to preamp 22 along line 30 determines whether the preamp 22 needs to operate in a read mode or a write mode.

Still referring to FIG. 1, the disk drive controller circuitry provided on PCB 12 includes channel 26, host interface and disk controller (HIDC) 32, microprocessor 34, buffer 44, microprocessor Read Only Memory (ROM) 54, Random Access Memory (RAM) 60, spindle motor driver 56 and voice coil motor driver 58. Channel 26 provides the circuitry for conditioning the read back signals provided along line 24 from preamp 22, detecting and decoding servo and user data from the read back signals, demodulating analog servo bursts also provided along line 24. Channel 26 provides such detected and decoded servo and user data and demodulated servo bursts to HIDC 32. Channel 26 also communicates with the disk drive microprocessor 34 via local microprocessor bus 36. During write operations in turn, the channel 26 receives user data to be written to the disk 14 from the HIDC 32, encodes the user data in accordance with RLL code constraints, and provides additional conditioning of the user data signals before providing them along line 28 to preamp 22.

Channel 26 preferably provides servo and user data to, and receives user data from, HIDC 32 via a high speed direct connection 38. This high speed connection 38 allows user data to be communicated between channel 26 and HIDC 32 without waiting for access to the microprocessor bus 36 thereby allowing high speed data transfer in read/write operations. To further speed the transfer of user data along connection 38, the interface 38 may preferably be several bits wide; for example, an 8-bit wide interface provides a presently acceptable data transfer rate. Fewer bit lines may be employed, however; for example a 2-bit wide connection may be employed, depending upon the data transfer requirements for the specific implementation. This is illustrated schematically by the plural bit lines in FIG. 1. Alternatively, a single bit serial connection 38 may be employed.

The user data transferred along connection 38 may preferably be in NRZ form in the case of a sampled data detection channel 26. The HIDC 32 provides channel control signals via path 43 to channel 26 to cause user data to flow to and from each disk in HDA 10. A separate clock line 41 is also provided, which transfers NRZ user clock signals between channel 26 and HIDC 32.

Channel 26 preferably includes the circuitry for converting user data supplied from HIDC 32 to an encoded form suitable for writing onto the disk surface, synchronization circuitry for locking the decoding circuitry onto the timing of the user data read from the disk surface, as well as suitable filtering and equalization circuitry for converting the analog pulses read from the disk surface to desirable form for digital sampling. Channel 26 also preferably includes suitable circuitry for detecting servo signals written onto the disk surface for track centering and servo control functions. The construction and operation of circuitry for performing such channel functions is well known in the art. Furthermore, ICs are commercially available for performing such channel functions; for example, the SSI 32P4901 IC provided from Silicon Systems, Inc., of Tustin, Calif., may be employed for channel 26.

As further illustrated in FIG. 1, the disk drive control circuitry includes a data buffer 44. Buffer 44 stores user data read from the disk surface under the control of HIDC 32 as well as user data provided from the host prior to writing to the disk surface. Buffer 44 may preferably be a random access memory such as a dynamic random access memory (DRAM) or static random access memory (SRAM). Buffer 44 is preferably large enough to hold multiple sectors of user data, each sector of user data typically including 512 bytes of data, for both read and write operations and in a presently preferred embodiment may hold 64–256K (bytes) of data or more. As illustrated, buffer 44 is coupled to HIDC 32 via buffer bus 48. Microprocessor 34 may also have access to buffer 44, under the control of HIDC 32 which acts as a buffer manager to arbitrate access to buffer 44. For example, buffer 44 may temporarily store host commands which are read by microprocessor 34 for performing disk drive functions.

In addition to providing arbitrated access to the buffer 44, the HIDC 32 interfaces with the host along host interface bus 50 and host interface connection 52. The host may preferably be a computer system having a standardized input/output (I/O) bus and standardized interface connection adapted to couple to connection 52. In PC host computer systems, the I/O bus may typically take the form of the AT bus which has become a de facto standard for IBM PC compatible computer systems and is referred to as the Industry Standard Architecture (ISA). Various attachments to the AT bus have also become common for allowing peripherals, including data storage devices, to more efficiently couple to the AT bus. For example, the Integrated Drive Electronics (IDE) attachment to the AT bus has become a very common interface for attaching disk drives to the standardized AT bus and is commonly referred to as the ATA (for AT bus Attachment) standard. Similarly, an interface standard referred to as ATA2 is used to couple disk drives to the Enhanced AT bus. The disk drive may be coupled directly to the I/O bus, or via an attachment to the I/O bus, via a cable or other connector that is suitable for the specific computer and application. In a presently preferred embodiment the present invention may be adapted to attach to the host I/O bus via an IDE connector. Alternatively, connection 52 may be directly to the I/O bus without a connector cable.

To allow communication with the host along host interface bus 50, HIDC 32 preferably includes a set of ATA host interface task file registers which may be implemented in a conventional manner so as to be read by microprocessor 34 as well as by HIDC 32. HIDC 32 will also conventionally include a set of host command registers and host data registers for the parallel transfer of commands and data along bus 50.

It should be appreciated, however, that other interface specifications and connections may also be employed. Such alternate interfaces include the Small Computer Standard Interface (SCSI), the Serial Storage Architecture (SSA) interface, the P1394 interface, the Fibre Channel interface, and the parallel printer port interface. Accordingly, the present invention may be applied with any of the above-noted alternate interfaces, or other suitable interfaces, with the host.

In addition to the host interface functions and buffer management functions described above, HIDC 32 also preferably controls the disk formatting and the translation of the host's logical address for data to be written or read from the disk surfaces, to actual physical information (i.e. cylinder (or track)/head/sector information) for access to the proper location on the disk surface (s). This conversion from logical to physical address may include defect management. Furthermore, HIDC 32 preferably includes ECC (error correction code) detection and correction circuitry to allow correction of data read from the disks and stored in buffer 44.

Microprocessor 34 may be a commercially available microprocessor or microcontroller. For example, commercially available microprocessor Model No. 80C196NU available from Intel Corporation may be employed. Microprocessor 34 executes several disk drive functions under microprogram control. For example, in a preferred embodiment, these functions include reading and decoding of host commands, spindle motor 16 start-up and speed control via spindle driver circuitry 56, control of positioning of the actuator 18 via voice coil motor driver 58, control of reduced power modes of operation, as well as other functions which may be conventional in nature. As further shown in FIG. 1, the microprocessor 34 is coupled to ROM 54 via microprocessor bus 36. ROM 54 includes prestored control microprograms for microprocessor 34 to allow microprocessor 34 to monitor and control the basic disk drive functions noted above.

As further illustrated in FIG. 1, the microprocessor 34 may also be coupled to RAM 60. For example, to reduce the amount of control program code prewritten into ROM 54, control programs not required for the initial start-up of the disk drive may be prerecorded onto the disk surface and read, after initial start-up, and loaded into RAM 60 to control further microprocessor 34 functions. Depending upon the amount of such memory required, and the capacity of buffer memory 44, RAM 60 may optionally be dispensed with and the required storage provided by buffer 44.

Figure 2:
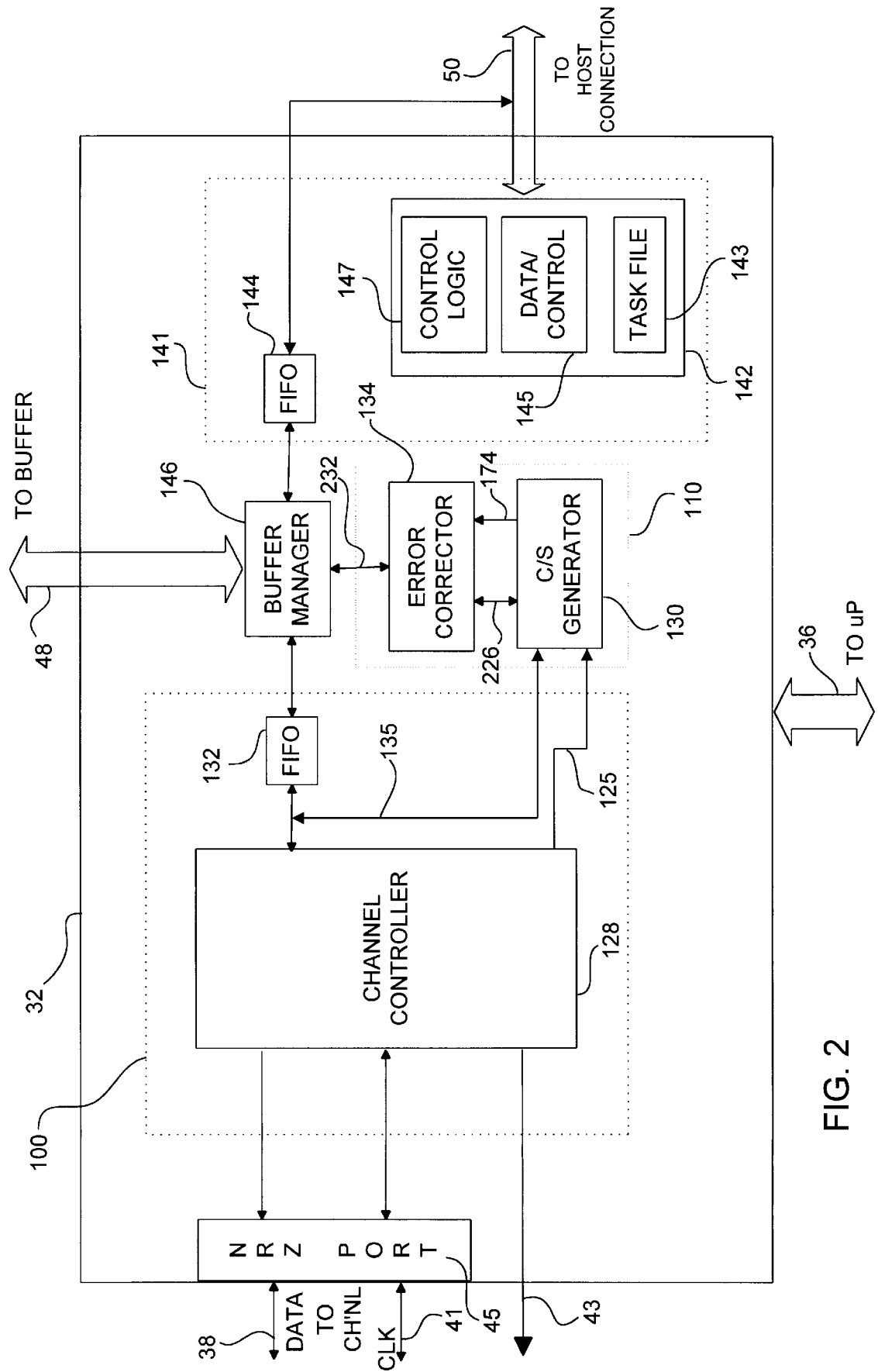
FIG. 2 is a block schematic drawing of the host interface and disk controller of FIG. 1 in accordance with a preferred embodiment of the present invention.

Referring to FIG. 2, the HIDC 32 in accordance with a preferred embodiment of the present invention is illustrated in a block schematic diagram. The HIDC 32 includes channel control circuitry 100, error detection and correction circuitry 110, host interface circuitry 141 and buffer manager 146. Additional circuitry which may be conventional in nature, and accordingly is not shown or described, may also be provided in HIDC 32. For example, servo control circuitry may be included in HIDC 32. Associated connections discussed in relation to FIG. 1 may also be provided, which are not shown in FIG. 2.

More specifically, the channel control circuitry 100 includes channel controller 128 which receives data, and a clock signal synchronized to the data, read from the data storage disks in the HDA from NRZ port 45 in 8-bit parallel form. Also, the channel controller 128 receives data from the buffer memory 44 (shown in FIG. 1) to be written to the data storage disks in the HDA in 8-bit parallel form and may provide a clock signal. The channel controller 128 further provides means for providing address information corresponding to the user data location on the disk which includes formatting the data into logical blocks, each having a logical block address (LBA) corresponding to a desired physical address on a disk surface, and provides the user data to NRZ port 45 to be provided to channel 26 (shown in FIG. 1). The LBA information includes the track identification and the sector number for a sector of data. These functions may be conventional in implementation and accordingly are not described in further detail herein.

The channel control circuitry 100 also includes FIFO (First In First Out) buffer 132. The FIFO buffer 132 acts as a buffer between the channel controller 128 and the buffer memory 44 (shown in FIG. 1) to allow arbitration by the buffer manager as discussed in more detail below.

In addition, channel controller 128 provides channel control signals along line 43 to channel 26 (shown in FIG. 1) during both read and write operations from/to the data storage disks in the HDA. For example, these control signals may include a write gate (WG) control signal and a read gate (RG) control signal. Channel controller 128 also provides control signals to check symbol/syndrome generator circuitry 130 along line 125.

The channel controller 128, in addition to providing read data from the data storage disks to buffer memory 44 via FIFO 132, also provides such read data to check symbol/syndrome generator circuitry 130 along line 135.

The error detection and correction circuitry 110 provides check symbol/syndrome generator means including check symbol/syndrome generator (C/S generator) 130 and programmable error corrector means including error corrector 134. C/S generator 130 generates error detection code (EDC) and error correction code (ECC) check symbols and provides means for appending the check symbols to user data including channel controller 128 during writes to the data storage disks in the HDA along line 135. Channel 26 provides means for providing the user data and the check symbols to the transducer for writing the user data and the check symbols on the data storage disk. C/S generator 130 is described in more detail below. During read operations from the magnetic disks in turn, the C/S generator 130 computes EDC and ECC syndromes from the data read from the data storage disks provided along line 135 and provides the computed EDC and ECC syndromes to error corrector 134. The error corrector 134 provides corrected data to the buffer manager 146 as described in more detail below.

Still referring to FIG. 2, the HIDC 32 provides means for receiving user data from the host including host interface circuitry 141. This includes a host interface logic and register block 142 to allow data and commands to flow from the host computer to the HDA. The host interface register block 142 includes task file 143 which includes a set of registers adapted to receive host address signals in accordance with a predetermined interface standard. Task file 143 preferably contains a single set of registers and thus a single physical address is provided for host communication for disk drive addressing. These task file registers are readable and writable by the microprocessor 34 (as shown in FIG. 1), via microprocessor bus 36, as well as by the host via bus 50, allowing decoding of host commands and control by microprocessor 34. Also, the host interface 142 includes a data/control register set 145 for data and control signals provided from the host, preferably in accordance with ATA specifications, and host interface control logic 147. The host interface circuitry 141 also includes FIFO buffer 144 which enables arbitration of the data flow by buffer manager 146 as discussed in more detail below.

Still referring to FIG. 2, the function of buffer manager 146 will be described. The data that is read from the disk is first stored in a local RAM, or buffer memory 44 (as shown in FIG. 1), prior to transferring to the host. Among other reasons, this permits the HIDC to insure that the data from the disk is correct, performing error correction if necessary, before transferring the data to the host. Buffer manager 146 allows the single buffer memory 44 to be shared, thereby providing a significant reduction in circuitry for the data storage system.

More specifically, buffer manager 146 receives data from the host via FIFO 144, data from the HDA via FIFO 132 and correction data (error offset and magnitude) from the error corrector 134 via buffers within corrector 134 all of which is directed to the buffer memory 44 for temporary storage. Buffer manager 146 arbitrates between these independent data input paths and controls the orderly flow of this data into the buffer memory 44. Buffer manager 146 also arbitrates data flow out of the buffer memory 44 via multiple data paths. More specifically buffer manager 146 arbitrates data to be written to several destinations, including the magnetic disks in the HDA via bi-directional FIFO buffer 132 and the host via bi-directional FIFO buffer 144.

Preferably, each of the data paths into and out of the buffer manager 146 include FIFO or LIFO (Last In First Out) buffers. As discussed above in relation to FIG. 1, the data input paths into the buffer manager 146 pass through respective FIFO buffers 132 and 144, which may preferably each have an independent address pointer into the buffer memory 44. These FIFO buffers provide relatively large data blocks to be moved into and out of the buffer memory 44, for example a sector of data (for example 512 words of data) may be moved at a time into the buffer memory 44 in this manner. In addition, buffer manager 146 arbitrates the bi-directional transfer of data between buffer memory 44 and error corrector 134 to allow error corrector 134 to correct data already stored in the buffer memory 44, as will be discussed in more detail below.

Figure 3:
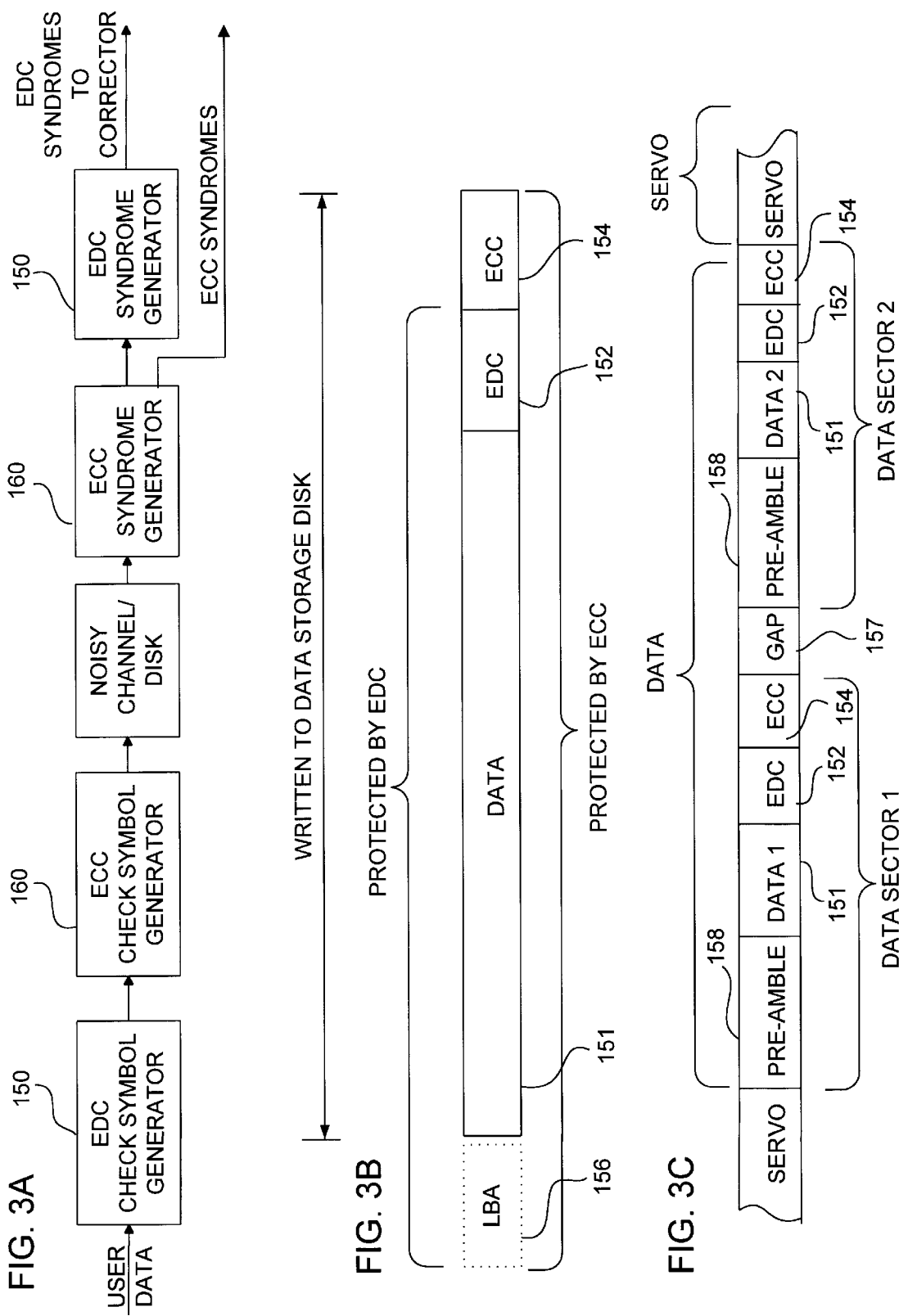
FIG. 3A is a block schematic drawing illustrating the operation of the check symbol/syndrome generator circuit of FIG. 2.
FIGS. 3B and 3C are drawings illustrating the error detection code and error correction code protection of data as recorded on the data storage disks.

Referring to FIGS. 3A and 3B, the operation of the C/S generator 130 shown in FIG. 2 will be described. In FIG. 3B the data, appended with EDC and ECC check symbols and written onto a data sector of a track, is illustrated.

C/S generator 130 provides means for generating check symbols and means for generating syndromes such that it operates as a check symbol generator during disk write operations and as a syndrome generator during disk read operations as illustrated in FIG. 3A. In a preferred embodiment, the means for generating check symbols generates multi-bit error correction code check symbols and multi-bit error detection code check symbols.

Also, as illustrated, the C/S generator 130 preferably implements a concatenated code including error detection code check symbols and error correction code check symbols. Thus, C/S generator 130 provides means for generating EDC check symbols and means for generating hardware EDC syndromes including an EDC check symbol/syndrome generator 150 which operates as an EDC check symbol generator during write operations and a hardware EDC syndrome generator during read operations. The term "hardware" will be described further below. Further, C/S generator 130 provides means for generating ECC check symbols and means for generating hardware ECC syndromes including an ECC check symbol/syndrome generator 160 which operates as an ECC check symbol generator during write operations and a hardware ECC syndrome generator during read operations. This dual function is shown in FIG. 3A. The concatenated code is employed to detect and correct errors in the user data and also to ensure accurate correction of the user data thereby reducing the probability of miscorrection. This is accomplished by protecting the user data by both EDC and ECC check symbols. FIG. 3B depicts the protection span for the detection and correction fields.

In a preferred embodiment, and for a 512 byte data sector 151, 4 bytes of error detection code (2 16-bit check symbols) may be provided for error detection field 152 while 18 bytes of error correction code (6 8-bit check symbols per interleave, 3 interleaves) may be provided for error correction field 154.

In operation, the user data during write operations is provided to the EDC check symbol generator 150 via line 135 (shown in FIG. 2) at the same time the user data is being provided to the channel controller 128 (also shown in FIG. 2). The EDC check symbol generator 150 then calculates the EDC check symbols to be appended to the user data. The user data with the appended EDC check symbols is then passed to ECC check symbol generator 160 which generates ECC check symbols based upon the user data and the appended EDC check symbols.

As further illustrated in FIG. 3B, the EDC and ECC check symbols are also calculated across a "transparent" logical block address (LBA) field 156. Each useable physical data section on the disk surface is uniquely associated with an LBA. The LBA thus provides the unique address of the data for subsequent accessing of the data in response to a host command to retrieve the data. The LBA is generated from address information provided from the host under microprocessor control and is provided to the channel controller 128. The LBA is provided to the C/S generator 130 (referring to FIG. 2) by the channel controller 128 along line 135 (referring to FIG. 2) prior to the provision of the user data also along line 135. The LBA is then used for calculating the EDC and ECC check symbols. These check symbols are then provided by the C/S generator 130 (referring to FIG. 2) to the channel controller 128 which then appends the EDC and ECC check symbols to the user data. Preferably the user data is provided to the channel and written to the storage disks in parallel with the EDC and ECC check symbol calculation by C/S generator 130 and the check symbols are ready to be appended to the data when the last bytes of data are written. The LBA 156 is preferably not written to the data storage disks, however, as illustrated in FIG. 3B. This saves disk space while, by virtue of including the LBA in the generation of the EDC and ECC check symbols, allowing an LBA error to be detected during a data read operation.

Referring to FIG. 3C, an exemplary portion of a data track is illustrated having a data region including two data sectors sandwiched between two servo regions. As illustrated, the user data 151 recorded in the data sectors is preferably protected by both the EDC field 152 and ECC field 154. Also, as shown in FIG. 3C, the data sectors are preferably only preceded by a preamble field 158, for example, including a VFO frequency lock field and an automatic gain control field. The data sectors thus do not include a sector header field indicating the address of the data sector. Such a "headerless" approach thus may advantageously exploit the transparent LBA protection provided by the EDC and ECC check symbols as illustrated in FIG. 3B. The two data sectors are in turn preferably separated by a relatively small gap field 157.

Still referring to FIGS. 3A and 3B, during a data read operation the user data 151 and appended EDC check symbols 152 and ECC check symbols 154 are provided from the channel 26 (referring to FIG. 1) via the channel controller 128 along path 135 (shown in FIG. 2) at the same time the user data is provided to the buffer memory 44 as described above in relation to FIG. 2. At the front end of the user data, the channel controller 128 appends the expected LBA for the data sector from which the user data is being read to recreate a complete codeword. The complete codeword with recreated LBA field 156, data field 151 and EDC and ECC fields 152 and 154, respectively, is provided to C/S generator 130. The EDC syndrome generator 150 generates syndromes based on the EDC span of the codeword including fields 156, 151 and 152, as described in more detail below, excluding the ECC check symbols, and provides these syndromes to the error corrector 134 (shown in FIG. 2) in the event of an error. The codeword with the appended EDC and ECC check symbols is also shifted through the ECC syndrome generator 160. The ECC syndrome generator 160 thus performs the ECC syndrome generation calculations on the codeword including fields 151, 152, 154 and 156 (shown in FIG. 3B) and provides the syndromes to error corrector 134 (shown in FIG. 2). As discussed in more detail below, the error corrector 134 then employs the ECC syndromes to correct the detected errors in the user data as well as to correct any errors in the logical block address.

In operation, it will be appreciated that the present invention provides a method for storing user data on a data storage disk along with error detection information, comprising the steps of: receiving user data to be stored on the data storage disk; providing address information corresponding to the user data location; generating an error correction code check symbol based upon the user data and address information; appending the error correction code check symbol to the user data to form a partial codeword that does not include the address information; and writing the partial codeword to the data storage disk.

This method may further comprise the steps of: reading a partial codeword from the data storage disk based on address information; appending the address information to the read partial codeword to form a complete codeword; and detecting an error in the address information based on the complete codeword. The address information may be appended to any portion of the codeword.

The address information is the logical block address of the user data and is derived from the track number and sector number of the user data. Further, the step of generating syndromes comprises generating one or more syndromes and wherein the step of detecting an error in the address information comprises determining an error location based on the syndromes and detecting that the error location corresponds to address information.

As will be described in more detail below, the error corrector 134 (shown in FIG. 2) calculates the offsets and magnitudes which are used to correct the user data. The error corrector 134 provides means for generating software EDC syndromes and software ECC syndromes based upon the offsets and magnitudes to validate the correction. The error corrector 134 further provides means for comparing the software ECC syndromes and software EDC syndromes generated by the error corrector 134 with the hardware ECC syndromes and hardware EDC syndromes, respectively, generated by the C/S generator 130 as described in relation to FIG. 3A. The means for comparing is described further below. The syndromes are compared to validate whether the offsets and magnitudes were calculated correctly by the error corrector 134, and detect if miscorrection has occurred. The terms software and hardware are applied for additional convenience to distinguish the syndromes generated by the error corrector 134 from the syndromes generated by the check symbol/syndrome generator 130. The terms software and hardware do not limit apparatus or method by which the syndromes may be generated.

Generating hardware ECC and EDC syndromes in the C/S generator 130; generating software ECC and EDC syndromes in the error connector 134; and comparing the software generated syndromes with the hardware generated syndromes in the error corrector 134, frees the C/S generator 130 to calculate the hardware ECC and EDC syndromes for the next sector of data once the current syndrome calculation is completed.

To enable the error corrector 134 to calculate the offsets and magnitudes, as well as to generate software ECC and EDC syndromes based on the calculated offsets and magnitudes, in a compact and efficient implementation, the ECC and EDC syndromes are preferably arithmetically related to allow a common finite field processor to be employed. This relationship may best be appreciated by a specific discussion corresponding to a presently preferred embodiment.

The concatenated EDC and ECC system may be implemented with an ECC cyclic block code defined over $GF(q'''')$ and an EDC cyclic block code defined over $GF(q'''')$, where m, r and q are integers and q is prime (preferably, r=q=2). In particular, this approach requires that for any choice of $GF(q''')$, $GF(q'''')$ is defined as an extension field of $GF(q''')$ such that the elements of $GF(q'''')$ can be viewed as vectors of length r defined over $GF(q''')$. Thus, $GF(q'''')$ is preferably defined such that every element, $\vec{a}$ in $GF(q'''')$ can be expressed in the form $\vec{a} = [a_0 a_1 \ldots a_{r-1}]$, where $a_k \in GF(q''')$.

For example, in a presently preferred embodiment, both the ECC and EDC codes are Reed-Solomon codes with the Reed-Solomon code for the ECC being defined over $GF(2^8)$ and the EDC being defined over $GF(2^{16})$, by setting m=8 and r=q=2. Given this structure, $GF(2^{16})$ is defined as an extension field of $GF(2^8)$ using the primitive polynomial, defined over $GF(2^8)$, $\rho(x) = x^2 + x + \alpha^{101}$. For the purpose of EDC syndrome generation, the EDC symbols may be viewed as polynomials of the form $b(x) = a_0 + a_1 x$, where $a_k \in GF(2^8)$. As a result, all EDC operations can be performed using $GF(2^8)$ arithmetic rather than the more complicated $GF(2^{16})$ arithmetic by viewing the arithmetic operations in $GF(2^{16})$ as polynomial arithmetic over $GF(2^8)$.

This embodiment thus assumes a three-way interleave for the ECC, where each interleave can be viewed as a systematically encoded, Reed-Solomon codeword defined over $GF(2^8)$. Each interleave corresponds to a single ECC codeword which includes transparent LBA, user data, and EDC and ECC check symbols. This specific embodiment also preferably provides a single error correcting Reed-Solomon code defined over extension field $GF(2^{16})$ as the EDC code. Defining the EDC codeword over $GF(2^{16})$ permits a maximum codelength of 65,535. The maximum codeword size is $q^m-1$, for Reed-Solomon codes over $GF(q^m)$, where m is the length of the "q-ary" check symbol and q is understood to be prime. Therefore, in the noted example employing a binary check symbol of 16 bits (q=2, m=16), the maximum codelength equals $2^{16}-1$. Therefore, an EDC codeword over $GF(2^{16})$ permits the codelength to be longer than a sector, which guarantees the EDC may detect a maximum of two 16-bit words anywhere in a sector. In a preferred embodiment, the EDC protects the user data across all three interleaves.

Also, as noted above, although the LBAs are included in the computation of the EDC and ECC check symbols, they are not written to the disk. This arrangement can be used to protect a sector of data containing at most, 743 bytes (including user bytes and "transparent" LBA bytes).

This approach is illustrated schematically in Table 1, where:

(1) user n is the nth byte of user data, n=1, . . . , 512
(2) LBA n is the nth byte of the transparent LBA, n=1,2,3,4
(3) EDC n MSB and EDC n LSB are the most and least significant bytes, respectively, of the EDC check symbol n, n=1,2, and
(4) ECC n check m is the mth ECC check symbol for the nth ECC codeword, n=1,2,3 and m=1,2, . . . ,6.

TABLE 1

EDC and ECC Codewords

| ECC codeword 1 | ECC codeword 2 | ECC codeword 3 | |
|---|---|---|---|
| LBA 1 | LBA 2 | LBA 3 | transparent LBA |
| LBA 4 | user 1 | user 2 | |
| user 3 | user 4 | user 5 | |
| | | | user data |
| user 510 | user 511 | user 512 | |
| EDC 1 MSB | EDC 1 LSB | EDC 2 MSB | |
| EDC 2 LSB | ECC 2 check 1 | ECC 3 check 1 | EDC check symbol (4 bytes) |
| ECC 1 check 1 | ECC 2 check 2 | ECC 3 check 2 | ECC check symbol (18 bytes) |
| . | . | . | |
| . | . | . | |
| . | . | . | |
| ECC 1 check 5 | ECC 2 check 6 | ECC 3 check 6 | |
| ECC 1 check 6 | | | |

As shown in Table 1, each column is an ECC codeword (transparent LBA, user data, EDC check symbols and ECC check symbols) and is protected by the ECC check symbols in that column. The highlighted region in Table 1 represents the EDC codeword, which consists of the transparent LBA, user data, and EDC check symbols. Table 1 only shows the conceptual relationship of the interleaved structure, it does not restrict the physical ordering of the data, the LBA and EDC/ECC check symbols written on the disk. For example, alternately, the LBA may be inserted into any known location in the interleaved data structure.

Referring to FIG. 3A, the C/S generator 130 relies on Reed-Solomon polynomial calculations to generate ECC and EDC check symbols. The Reed-Solomon generator polynomial G(x) used in ECC check symbol generation is set out in equation (1):

$$G_{ecc}(x) = (x+\alpha^1)(x+\alpha^2)(x+\alpha^3)(x+\alpha^4)(x+\alpha^5)(x+\alpha^6) = \quad (1)$$
$$x^6 + \alpha^{167}x^5 + \alpha^2x^4 + \alpha^{137}x^3 + \alpha^9x^2 + \alpha^{181}x + \alpha^{21}$$

where $\alpha$ is the primitive element 00000010 of $GF(2^8)$ defined by the field generator polynomial:

$$g_{ecc}(X) = x^8 + x^4 + x^3 + x^2 + 1$$

The Reed-Solomon generator polynomial $G_{edc}(z)$ for the EDC check symbol generator, in turn, is defined over $GF(2^{16})$ as an extension field of $GF(2^8)$ using the extension field generator polynomial $g_{ecd}(x)$ (defined over $GF(2^8)$) as set out in equations (2) and (3):

$$G_{edc}(z) = (z+1)(z+\beta) = z^2 + (1+\beta)z + \beta \quad (2)$$

$$g_{edc}(x) = x^2 + x + \alpha^{101} \quad (3)$$

where $\alpha$ are elements of $GF(2^8)$, and $\beta$ is 0100 (hex). More generally, to implement arithmetic in $GF(2^{16})$ over $GF(2^8)$, $\beta$ is represented as $a_1x+a_0$, where $a_1$ and $a_0$ are elements of $GF(2^8)$.

It will be appreciated by those skilled in the art, however, that other fields and extension fields may also be employed. For example, as discussed above, a field $GF(q^m)$ and extension field $GF(q^{rm})$ may be in general employed where m, r and q are integers and q is prime. Additionally, other encoding techniques other than the Reed-Solomon technique may also be employed. For example, Fire Codes, BCH codes and b-adjacent codes may also be employed.

In operation, it will be appreciated that the present invention provides a method for storing user data on a data storage disk along with error detection and correction information, comprising the steps of: receiving user data to be stored on the data storage disk; generating a multi-bit error detection code check symbol based upon the user data employing a first generator polynomial; generating a multi-bit error correction code check symbol based upon the user data employing a second generator polynomial which is different from the first generator polynomial; appending the error detection code check symbol and the error correction code check symbol to the data to form a codeword; and writing the codeword to the data storage disk. In this method the error detection code check symbol is 16 bits and the error correction code check symbol is 8 bits and the second generator polynomial is defined over a finite field and the first generator polynomial is defined over an extension field of the finite field.

Alternately, it will be appreciated that the present invention provides a method for storing and retrieving user data to and from a data storage disk, comprising the steps of: receiving user data to be stored; generating multi-bit error correction code check symbols defined over a finite field and appending the check symbols to the user data to be written to the data storage disk; generating multi-bit error detection code check symbols defined over an extension field of the finite field and appending the check symbols to the user data to be written to the data storage disk; writing the user data and appended check symbols to the data storage disk; receiving a request for stored user data; retrieving the requested user data including appended check symbols from the data storage disk; generating hardware error detection code syndromes and hardware error correction code syndromes corresponding to errors in the user data and check symbols read from the data storage disk; storing the hardware error correction code syndromes and hardware error detection code syndromes; correcting the errors using the hardware error correction code syndromes, the correcting step including calculations over the finite field; generating software error detection code syndromes, the step including calculations over the extension field; and comparing the software error detection code syndromes with the stored hardware error detection code syndromes.

The correcting step may further comprise calculating error location information based on the hardware error correction code syndromes and the step of generating software error detection code syndromes may further comprise calculating the error detection code syndromes based on the error location information.

The method may further comprise the steps of: generating software error correction code syndromes when the detected errors are less in number than the correction capability of the error correction code; and comparing the software error correction code syndromes to the stored error correction code syndromes. In addition, the method may comprise providing an indication of an uncorrectable error if the comparing step does not find matching hardware and software error detection syndromes or if the comparing step does not find matching hardware and software error correction code syndromes.

Figure 4:
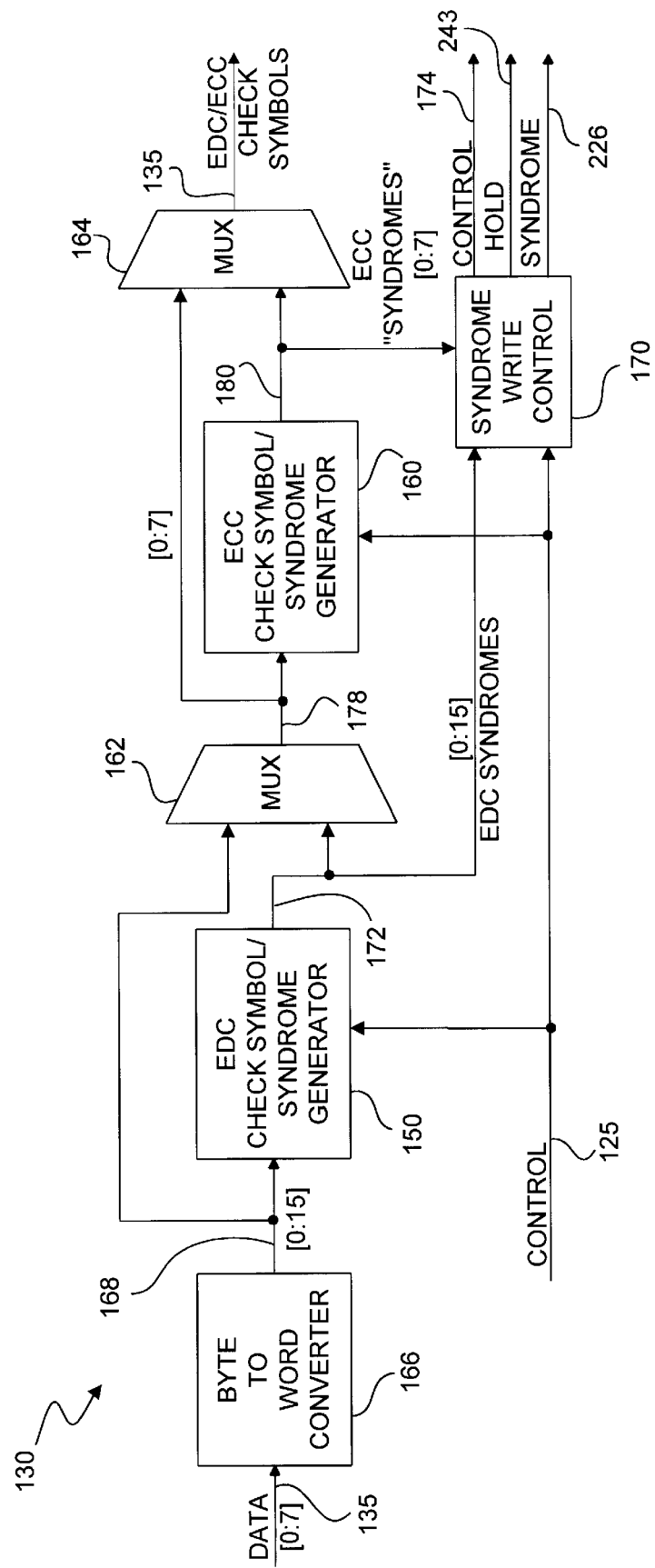
FIG. 4 is a block schematic diagram of the check symbol/syndrome generator of the host interface and disk controller of FIG. 2 in accordance with a preferred embodiment of the present invention.

Referring to FIG. 4, a preferred embodiment of the C/S generator 130 of FIG. 2 is illustrated in a presently preferred embodiment. As discussed above in relation to FIG. 3A, the C/S generator includes an EDC check symbol/syndrome generator 150 and an ECC check symbol/syndrome generator 160. During write operations multiplexors 162 and 164 allow parallel generation of ECC and EDC check symbols followed by appending the EDC and ECC check symbols to the data. Also, since the EDC check symbol/syndrome generator 150 preferably operates over GF($2^{16}$) and operates on word wide Reed-Solomon groups having 16-bits/symbol of data provided on path 168, while the input data provided on path 135 is provided in an 8-bit (byte) wide parallel fashion, a byte to word convertor 166 is also provided. Also, as illustrated in FIG. 4, a syndrome write control circuit 170 is preferably provided to control the output of the syndromes to the error corrector 134 (described below) as well as to provide control signals to initiate the error corrector operations when syndromes are available. Control signals along line 125 from the channel controller 128 (shown in FIG. 2) are also provided to the syndrome write control circuit 170, the EDC check symbol/syndrome generator 150, ECC check symbol/syndrome generator 160 and multiplexors 162, 164 (connections not shown for convenience of illustration) to control the check symbol/syndrome generation operations in conjunction with the timing of the read and write operations of the disk drive.

Still referring to FIG. 4, during a write operation, the user data with the LBA appended to the front thereof is received along line 135 and is provided, via the byte to word converter 166, along line 168 to the EDC check symbol generator 150. The EDC check symbol generator 150 performs the calculations over GF($2^{16}$) on the data and the LBA and provides the EDC check symbols along line 172 which is provided to multiplexor 162. As noted above, two EDC check symbols, each preferably a 2-byte (word) are provided.

At the same time that the EDC check symbol generator 150 is performing the EDC calculation on the user data and the LBA, this data is provided to the ECC check symbol generator via multiplexor 162 and line 178. The LBA, user data and the EDC check symbols are fed through the ECC check symbol generator 160, in three interleaves using the generator constants for the ECC generator polynomial over GF($2^8$) to generate six bytes of check symbols for each of the three interleaves, for a total of 18 bytes of ECC check symbols. The check symbols from the ECC check symbol generator are provided along line 180 and multiplexed together with the EDC check symbols via multiplexor 164 and are output to the channel controller 128 via bi-directional parallel line 135. The channel controller then appends the EDC and ECC check symbols to the user data and a partial codeword, excluding the LBA but including the user data, and EDC and ECC check symbols (with the transparent LBA encoded therein) may then be written to the disk.

During a disk read operation, the complete codeword is created by the channel controller 128 by appending the expected LBA to the front of the partial codeword read from the disk. The EDC span of the codeword, which does not include the ECC check symbols, is shifted through the EDC syndrome generator 150, which generates the syndromes over GF($2^{16}$). The EDC syndrome generator generates two 16-bit syndromes.

In parallel with EDC syndrome generation, the complete codeword is shifted through the ECC syndrome generator 160 using the multiplexor 162. The ECC syndrome generator 160 generates the syndromes over GF($2^8$). The ECC syndrome generator generates 18 8-bit syndromes, six for each codeword.

Once the syndromes have been generated by C/S generator 130 and stored in the syndrome generator shift registers, the syndromes are written to a register file in error corrector 134 (discussed in further detail below). The error corrector 134 receives the syndrome directly along line 226 from the C/S generator 130. Once the syndrome write is complete, C/S generator 130 provides a syndrome ready control signal along line 174 to wake up the error corrector 134 from its idle state.

Figure 5:
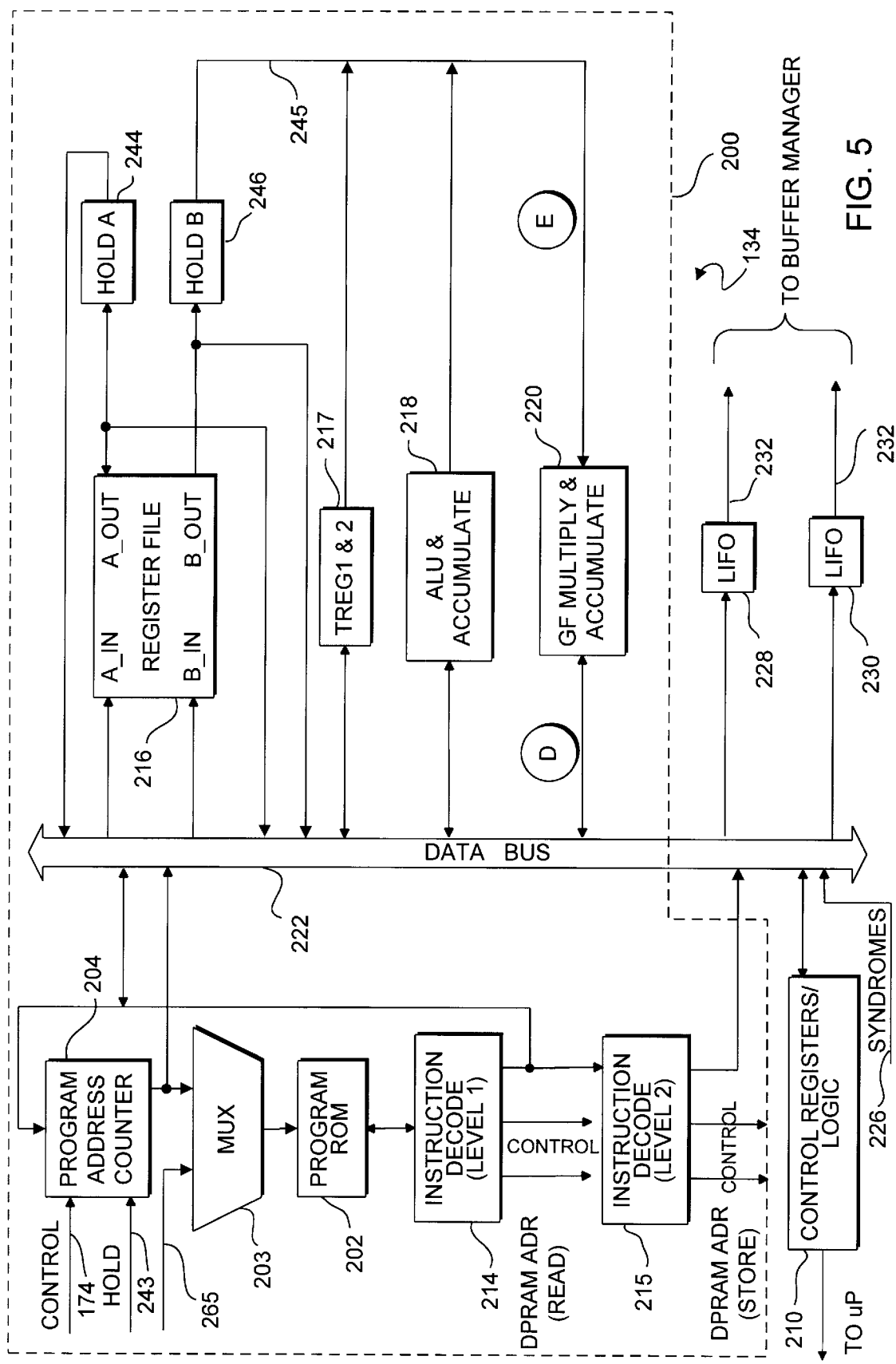
FIG. 5 is a block schematic diagram of the error corrector of the host interface and disk controller of FIG. 2 in accordance with a preferred embodiment of the present invention.

Referring to FIG. 5 a preferred embodiment of error corrector 134 is illustrated. The calculations for implementing error correction based upon the ECC syndromes provided from C/S generator 130 are implemented by microcontroller 200, which is dedicated to error computation and detection. Microcontroller 200 preferably employs a RISC (Reduced Instruction Set Computing) architecture having pipelined instruction decoding and execution. Employing a dedicated RISC engine within the HIDC 32 (shown in FIG. 1) permits the majority of errors to be detected and corrected within the HIDC 32, thus saving the time used in accessing and exchanging data with the off-line microprocessor 34 (shown in FIG. 1).

RISC microcontroller 200 provides means for storing an error correction control program, including program ROM 202. Program ROM 202 stores the error correction control program as error corrector microcode to control error correction processing. The error corrector microcode sequence is incremented via program address counter 204. In addition, the address of the program ROM 202 may be set by the look-up table address generator along line 265 through multiplexor 203. A copy of the error corrector microcode instruction definitions and an error corrector microcode listing are provided as Appendices A and B respectively. The control flow chart is described in more detail below. The pipelined architecture and related parallel instruction decode and execution operation in turn will be explained below in relation to specific examples of error corrector microcode instruction execution.

Still referring to FIG. 5, the instruction decode circuitry 214 is coupled back to the program address counter 204 to allow the program address counter to sequence through the error corrector microcode during execution of the error correction algorithm. More specifically, the program address counter 204 uses a program counter to increment the program ROM 202 to the next consecutive address after each instruction (except for jump (JMP) instructions, subroutine calls and return (RET)).

For operations which do not involve branching to or from a jump location or ECC look-up table access, the address comes from the program counter in the program address counter 204. For JMP instructions, the program address counter 204 loads the JMP address towards which the code should branch and starts incrementing the address from the branch address. For RET instructions, the program address counter 204 loads the return address from the stack in the register file 216. For ECC look-up table addresses stored in the program ROM 202, the multiplexor 203 selects the table look-up address computed by the Galois Field Multiply and Accumulate (GFMAC) unit 220 and provided along line 265, described further below, and provides the address to the program ROM 202. The program address counter 204 is disabled until the RISC engine is enabled by the syndrome ready control signal along line 174 from the C/S generator 130. (as shown in FIG. 4).

The program ROM 202 preferably stores ECC look-up tables as well as the error corrector microcode used by the RISC microcontroller 200. For example, the top address space of the ROM may contain the look-up tables which are followed by the error corrector microcode. The ECC look-up tables in a preferred embodiment are set out in Appendix C.

The RISC microcontroller 200 also includes a register file 216 which is preferably implemented as a dual-port RAM having port A and port B and first and second holding means coupled to port A and port B including operand holding registers HOLD A 244 and HOLD B 246. The dual ported configuration of the register file allows high speed operation of the GFMAC unit 220 which has direct access to the register file via parallel line 245 coupled to HOLD B 246. The register file 216 has a number of separate registers in its address space which may be organized as follows:

TABLE 2

| ADDRESS | DESCRIPTION |
|---|---|
| 00 | High byte of EDC Syndrome 1 |
| 01 | Low byte of EDC Syndrome 1 |
| 02 | High byte EDC Syndrome 2 |
| 03 | Low byte of EDC Syndrome 2 |
| 04 | ECC Syndrome 1, interleave 0 |
| 05 | ECC Syndrome 2, interleave 0 |
| 06 | ECC Syndrome 3, interleave 0 |
| 07 | ECC Syndrome 4, interleave 0 |
| 08 | ECC Syndrome 5, interleave 0 |
| 09 | ECC Syndrome 6, interleave 0 |
| 0A | ECC Syndrome 1, interleave 1 |
| 0B | ECC Syndrome 2, interleave 1 |
| 0C | ECC Syndrome 3, interleave 1 |
| 0D | ECC Syndrome 4, interleave 1 |

TABLE 2-continued

| ADDRESS | DESCRIPTION |
|---|---|
| 0E | ECC Syndrome 5, interleave 1 |
| 0F | ECC Syndrome 6, interleave 1 |
| 10 | ECC Syndrome 1, interleave 2 |
| 11 | ECC Syndrome 2, interleave 2 |
| 12 | ECC Syndrome 3, interleave 2 |
| 13 | ECC Syndrome 4, interleave 2 |
| 14 | ECC Syndrome 5, interleave 2 |
| 15 | ECC Syndrome 6, interleave 2 |
| 16 | GENERAL PURPOSE REGISTER |
| . | . |
| . | . |
| . | . |
| 63 | GENERAL PURPOSE REGISTER |
| 64 | TOP OF STACK |
| . | . |
| . | . |
| . | . |
| 67 | BOTTOM OF STACK |
| 69 | ACCUMULATOR |
| 6B | GALOIS UNIT STATUS |
| 6C | GALOIS PRODUCT REGISTER |
| 6D | GALOIS ACCUMULATOR |
| 6E | TEMP REGISTER 1 |
| 6F | TEMP REGISTER 2 |
| 76 | MASKL PIPELINE PORT |
| 77 | MASKH PIPELINE PORT |
| 78 | OFFSET PIPELINE PORT |
| 79 | LBA ERROR MASK REGISTER 0 |
| 7A | LBA ERROR MASK REGISTER 1 |
| 7B | LBA ERROR MASK REGISTER 2 |
| 7C | LBA ERROR MASK REGISTER 3 |
| 7D | ERROR COUNT OF INTERLEAVE 0 |
| 7E | ERROR COUNT OF INTERLEAVE 1 |
| 7F | ERROR COUNT OF INTERLEAVE 2 |

Operations are typically performed on one of the registers and arithmetic logic means including the Arithmetic Logic Unit (ALU) and accumulator 218, with the results stored in the ALU and accumulator 218. The exception to this occurs in Galois Field Multiply and Accumulate (GFMAC) operations, in which two register file bytes are processed and their result placed into either the Galois product register or the Galois accumulator. The GFMAC operations are discussed further below.

The RISC microcontroller 200 further preferably provides first decoding means including first instruction decode and control circuit 214 and second decoding means 215 including second instruction decode and control circuit 215. The first and second decode and control circuits 214, 215 cascade in two levels to enable the RISC microcontroller 200 to provide pipelined instruction decode and execution. More specifically, first instruction decode and control circuit 214 includes the first level of instruction decode which decodes error correction control program instructions and determines the operand to be fetched. The first instruction decode and control circuit 214 further provides means for fetching a first operand from a first port of the register file 215 and means for fetching a second operand from a second port of the register file 216 in parallel with fetching the first operand. Second instruction decode and control circuit 215 includes the second level of instruction decode which further decodes the error correction control program instructions to control the execution of the operation to be performed. Each instruction cascades through the first and second decode and control circuits 214, 215. However, the first and second decode and control circuits 214, 215 perform in parallel in that the first decode and control circuit 214 receives and decodes a second error correction control program instruction while the second decode and control circuit 215 further decodes the first instruction. Therefore the two levels are used to partially decode instructions to retrieve an operand set in parallel with performing an operation with a prior operand set. The combination of instruction decode and control circuits 214, 215 thus fully decode instructions provided from program ROM 202 and generate control signals for the GFMAC unit 220, the program address counter 204, the register file 216, and the ALU and accumulator 218.

The arithmetic and logic unit (ALU) 218 of the RISC microcontroller 200 performs standard arithmetic and logic operations required by the error corrector microcode, such as: AND, OR, XOR, ADD, SUBTRACT, BIT SHIFT, and COMPARE. The results of the ALU are temporarily stored in the accumulator of the ALU 218.

As further shown in FIG. 5, the RISC microcontroller 200 functional units 202, 204, 214, 215, 216, 218 and 220 communicate via RISC microcontroller data bus 222. Also, as shown in FIG. 5, the register file 216 communicates with the RISC microcontroller data bus 222 via port A and HOLD A 244 as well as directly with the GFMAC unit 220 via port B and HOLD B 246 along path 245. This permits parallel fetching of operands for execution by GFMAC unit 220.

As further shown in FIG. 5, the error corrector 134 includes two last in first out (LIFO) buffers 228 and 230 respectively in communication with the buffer manager 146 (as shown in FIG. 2). Each LIFO buffer in a presently preferred embodiment is 9 words deep and 17 bits wide. Each word in the LIFO buffer contains a byte wide magnitude, a word offset and a flag which indicates a high byte correction or a low byte correction.

Data is transferred between the LIFOs 228 and 230, and the buffer 44 (as shown in FIG. 1) in the following preferable cycle. The LIFOs 228 and 230 operate in a ping-pong manner such that the buffer 44 receives data from one LIFO 228 while the second LIFO 230 is being loaded from the error corrector 134 and the buffer 44 receives data from the second LIFO 230 while the first LIFO 228 is being loaded by the error corrector 134. Once data is loaded into a LIFO, a request is sent to the buffer manager 146 along line 232. The buffer manager 146 arbitrates these requests along with the other requests for access to the buffer memory 44. When the buffer manager 146 (shown in FIG. 2) issues a request for corrected data, the data is sent from the LIFO to the buffer 44. This cycle repeats until the LIFO buffer is empty.

The data in the buffer 44 is corrected using the offset and magnitude data provided by the error corrector 134 with the assistance of the buffer manager 146. The buffer manager 146 adds the relative offset data provided from LIFO 228 or 230 to the data sector's starting address, to offset the sector starting address, then performs an Exclusive OR (XOR) logical operation of the magnitude data from the LIFO with the data at the appropriate location in the buffer based on the offset and the sector starting address. The corrected data is then rewritten to the buffer by the buffer manager. This loading of the offset data and magnitude data to the buffer manager is preferably done individually for each byte to be corrected.

After the buffer manager has completed such a buffer update using the data from LIFO 228 or 230, the buffer manager will reset the request for access lines from the respective LIFO, and generate a control signal to the error corrector 134 to enable the offset and magnitude for the next buffer update to be sent to the next LIFO 228 or 230.

Prior to error corrector 134 processing, the RISC microprocessor (shown in FIG. 5) is temporarily put into a hold state (as indicated by hold line 243 in FIG. 5) which temporarily stops program address counter 204. At such time, the syndrome bytes are directly transferred from the C/S generator 130 (shown in FIG. 2) along line 226 into the RISC controller register file 216 (shown in FIG. 5). After the syndrome bytes are transferred, the hold is then removed to allow the RISC microprocessor to proceed with error correction processing. The RISC microcontroller (shown in FIG. 5) calculates the offset and magnitude data required to correct the disk drive user data, and validates the corrections.

The error corrector of FIG. 5 also includes a control registers/logic block 210 which includes a register set which is readable and writable by the microprocessor 34 (shown in FIG. 2). This register set may preferably include an error corrector control register which is writable by the microprocessor to control turn on and reset of the error corrector 134, and is writable by the RISC microcontroller 200 to post uncorrectable error flags and error counts for evaluation by the microprocessor 34. Additional test registers may also be provided in the control registers in block 210, as well as logic to allow the microprocessor 34 to access and/or test registers and functional blocks within RISC microcontroller 200.

Figure 6A:
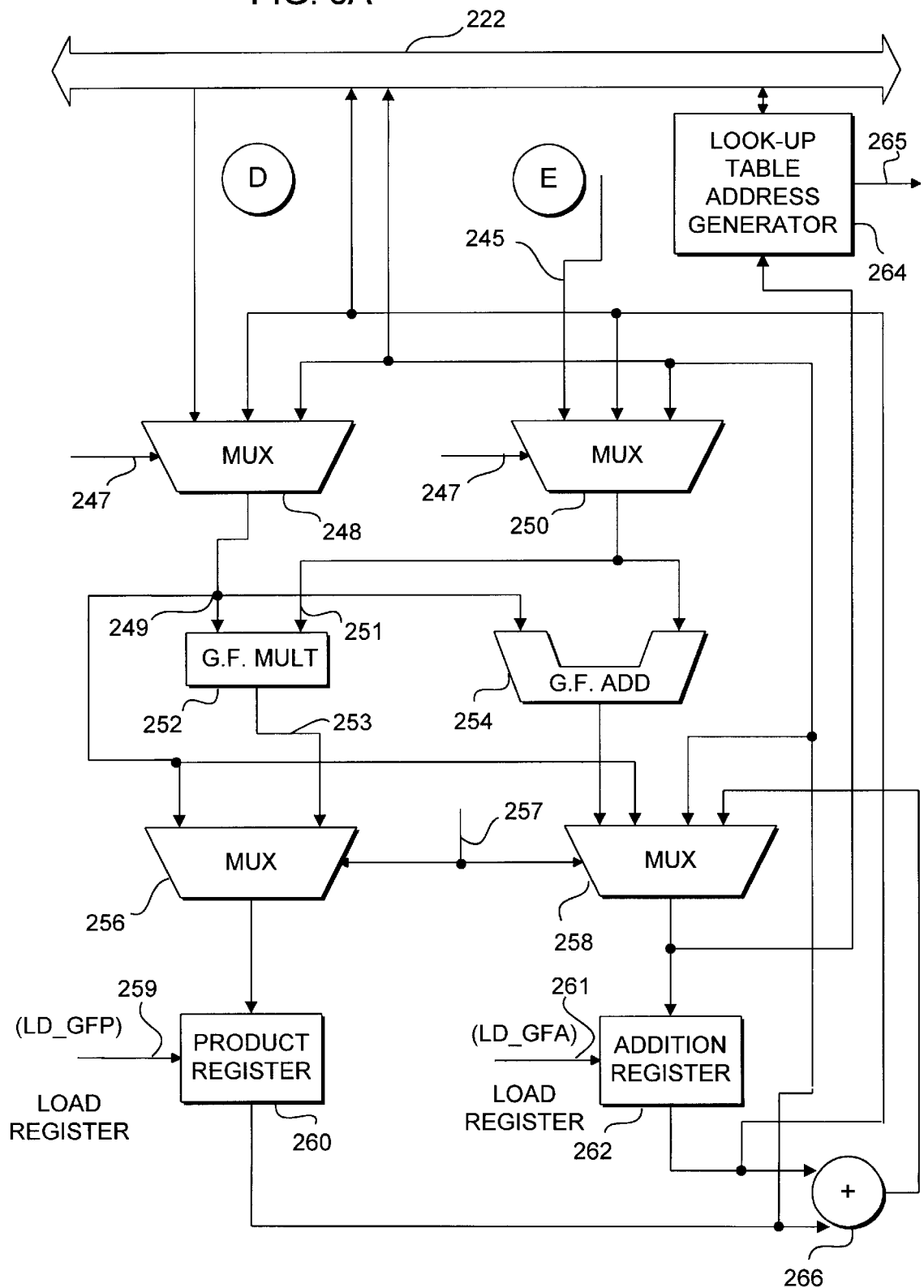
FIG. 6A is a block schematic diagram of the Galois Field Multiply and Accumulate (GFMAC) unit of the error corrector of FIG. 5.

A preferred embodiment of the RISC microcontroller 200 (shown in FIG. 5) provides a finite field processor means including GFMAC unit 220. As discussed above, the instructions executable by the GFMAC unit 220 are stored in ROM 202 (shown in FIG. 5). GFMAC unit 220 is illustrated in FIG. 6A. The GFMAC unit 220 performs the primary error correction calculations by providing finite field multiplication means for performing a finite field multiplication operation in a single execution cycle including Galois Field multiply circuit 252 and finite field addition means for performing a finite field addition operation in a single execution cycle including Galois Field addition circuit 254, both of which support Galois Field multiplication and addition over $GF(2^8)$. This allows finite field calculations to be performed in a single execution cycle which calculations would typically require multiple cycles in a conventional ALU. Also, by virtue of the extension field relationship between the $GF(2^8)$ and $GF(2^{16})$ finite fields and generator polynomials described above, the GFMAC unit 220 can perform calculations over $GF(2^{16})$ as well as over $GF(2^8)$. The GFMAC unit 220 provides means for storing the results of the finite field multiplication operation including product register 260. The GFMAC unit 220 provides means for storing the results of the finite field addition operation including addition register 262. A copy of the Verilog code which presents a specific implementation of the GFMAC is provided as Appendix D. Verilog code is a logic analysis code created by Cadence Design Systems used in the design and fabrication of processors.

The GFMAC unit 220 illustrated in FIG. 6A is coupled to both ports of the dual port register file 216 (shown in FIG. 5) for high speed operation. More specifically, port D of the GFMAC unit is coupled to port A of the register file 216 (shown in FIG. 5) via RISC microcontroller data bus 222 and via HOLD A 244 (HOLD A) (shown in FIG. 5). Port E of the GFMAC unit in turn is coupled to port B of the register file 216 (shown in FIG. 5) via 8-bit wide parallel line 245 and HOLD B 246 (shown in FIG. 5). GFMAC operands provided by the register file 216 are thus stored in HOLD A 244 and HOLD B 246.

The GFMAC unit 220 further provides means for selectively providing, including multiplexors 248, 250, first and second operands from HOLD A 244 and HOLD B 246, the contents of product register 260 and the contents of addition register 262 to Galois Field multiply circuit 252 and Galois Field addition circuit 254. Multiplexors 248, 250 also receive as inputs intermediate calculation values provided from registers 260, 262, which store Galois Field product and addition values, respectively. Multiplexors 248, 250 selectively provide one of these inputs to the Galois Field multiply and addition circuits 252, 254 in response to a control signal provided along line 247, and via bus 222, from instruction decode circuits 214, 215 (shown in FIG. 5).

The Galois Field multiplier 252 supports Galois Field multiplication over $GF(2^8)$ by multiplying the input operands provided along lines 249 and 251, and providing the result along line 253 to multiplexor 256. This output may be stored in the dedicated Galois Field product register 260. The Galois Field multiplier 252 may preferably be provided as a combinatorial logic array as will be described in more detail below. The respective inputs along lines 249 and 251 to the Galois Field multiplier 252 are propagated directly through the combinatorial logic provided to generate an output along line 253 which is provided through multiplexor 256 to product register 260. The combinatorial logic array included within the Galois Field multiplier 252 permits Galois Field multiplication of operands in a single execution cycle.

Galois Field addition is supported by the Galois Field adder 254 and the XOR circuit 266. Together, the Galois Field adder 254 and the XOR circuit 266 make up the Galois Field accumulator. The Galois Field adder 254 supports Galois Field addition of two operands over $GF(2^8)$ and the results of the Galois Field addition are loaded into a Galois Field addition register 262 through multiplexor 258. The XOR circuit 266 serves as a second Galois Field adder to promote parallel execution of Galois Field multiplication and Galois Field addition within a single execution cycle. The XOR circuit 266, or its equivalent such as can be achieved by providing an additional multiplexor to multiplex the outputs of product register 260 and addition register 262 to the Galois Field adder 254, performs Galois Field addition by adding together contents of the product register 260 and addition register 262 and providing the result to multiplexor 258.

The transfer of the output of the Galois Field multiplier 252 and the Galois Field adder 254 to the respective product and addition registers 260, 262 are controlled by multiplexors 256, 258 respectively. Multiplexors 256 and 258 also receive as an input the output of multiplexor 248. Multiplexor 258 in turn receives as inputs intermediate calculation values from product register 260 and XOR circuit 266. The output of the multiplexors 256, 258 is selected by a control signal along line 257 provided from instruction decode circuits 214, 215 (shown in FIG. 5). The product register 260 and addition register 262, in turn, are loaded in response to respective load control signals (LD_GFP, LD_GFA) provided along lines 259, 261 from the instruction decode circuits 214, 215. The product register 260 and addition register 262 are also employed to provide the output of the GFMAC unit to the data bus 222, as illustrated.

In a single operation, such as "GFMAC D,E," the GFMAC unit 220 may perform two, parallel operations. The contents of product register 260 from a prior operation are added to the current contents of the addition register 262 by XOR circuit 266 and the result is prepared to be loaded into the addition register 262 through multiplexor 258. At the same time, the operands provided along lines 222 and 245 are Galois Field multiplied and the result is prepared to be loaded into the product register 260 through multiplexor 256. The concurrent operation of Galois Field addition and multiplication permits the RISC microcontroller 200 to rapidly process syndromes to correct errors.

The GFMAC unit 220 also provides means for generating look-up table addresses including look-up address generator 264. The GFMAC unit 220 supports look-up table calculations by providing an operand from multiplexor 258 which is used by the look-up table address generator 264 to generate an address and passing such look-up table address to the program address counter 204 via line 265 and multiplexor 203 (as shown in FIG. 5). The high byte of the look-up table results are stored in temporary register 2 and the low byte are stored in temporary register 1 (TREG1 & 2 217 as shown in FIG. 5). The look-up tables are listed in Appendix C.

In operation, this invention provides a method for correcting data errors in data read from a disk drive, the data errors corresponding to syndromes detected in the read data, comprising the steps of: reading instructions in a stored error correction control program, the instructions including instructions corresponding to error correction calculations including finite field addition and multiplication operations; decoding the instructions; and performing finite field multiplication and addition operations in parallel.

The method may further comprise the step of fetching stored operands selected by the decoded instructions wherein a multiplication operation in performed on the operands. The operands corresponding to the decoded instructions are syndromes and the parallel finite field multiplication and addition operations are performed in a single execution cycle.

In an alternate embodiment, the GFMAC unit 220 may include a time sequential implementation which may sequentially perform Galois Field multiplication or addition. In this alternate embodiment, the dual port register file 216 (as shown in FIG. 5) may be replaced with a single port register file (not shown). It will be appreciated by those skilled in the art that a single port RAM may be provided with a single input from the data bus 222 and a single output. The single output would be connected to each of operand hold registers HOLD A 244 and HOLD B 246. Each operand hold register would be loaded by a command signal in a time sequential manner.

Figure 6B:
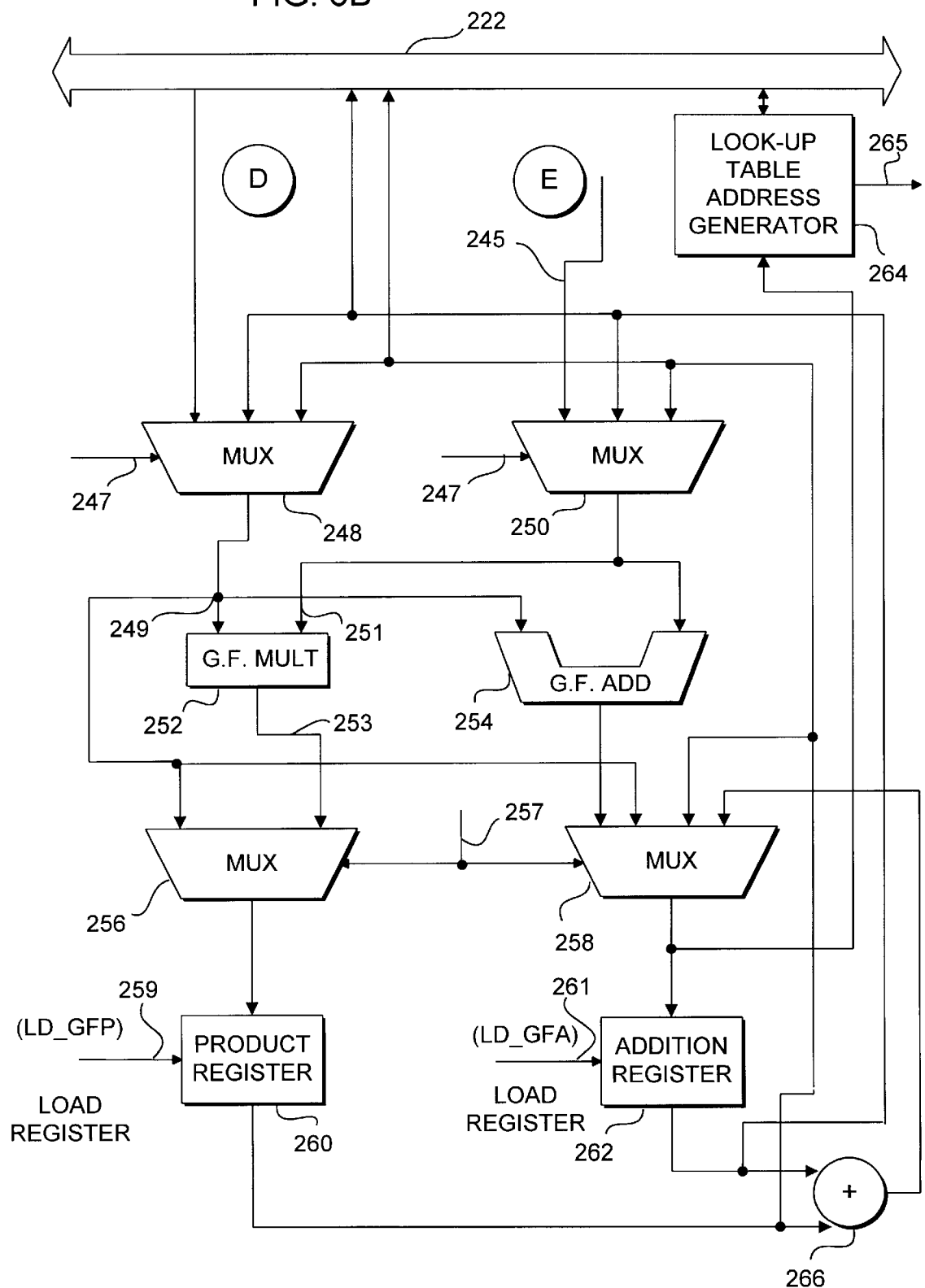
FIG. 6B is a block schematic diagram of an alternate embodiment of the Galois Field Multiply and Accumulate (GFMAC) unit of the error corrector of FIG. 5.

The time sequential alternate embodiment of the GFMAC unit 220 is shown in FIG. 6B. In the embodiment provided in FIG. 6B the Galois Field multiplier 252 and the Galois Field adder 254 operate time sequentially. As a result, the XOR circuit 266, and the related connections to and from the XOR circuit are not required. For example, the Galois Field adder 254 may first add the contents of the product register 260 from a prior operation to the current contents of the addition register 262 through multiplexors 248 and 250. The result is then loaded in the addition register 262. Then, the Galois Field multiplier 252 may multiply the contents of the operands provided along lines 222 and 245, as received through multiplexors 248 and 250, and load the result in the product register 260. These time sequential operations may be provided in response to a single Galois Field Multiply and Accumulate (GFMAC) instruction.

These and other finite field operations may also be performed in response to separate instructions to GF multiply and GF add. Loading of the product register 260 and addition register 262 is commanded as described in conjunction with FIG. 6A. The output of either the product register 260 or addition register 262 may be fed back to the Galois Field multiplier 252 or the Galois Field adder 254 via either multiplexor 248 or 250 in order to provide a previous result for use in a current finite field math operation.

Serial operation could be performed in a time division multiplexed manner to permit the RISC microcontroller 200 to rapidly process syndromes to correct errors using a single port RAM and the GFMAC unit 220 shown in FIG. 6B. In order to optimize such serial operation a complementary clock may be provided to enable math operations in the Galois Field multiplier 252 and the Galois Field adder 254. A complementary clock provides a second rising edge clock signal, in addition to the primary clock signal, to trigger finite field math operations in the Galois Field multiplier 252 and the Galois Field adder 254. The duty cycle of the complementary clock may be symmetrical or asymmetrical, as is discussed below in relation to FIG. 8B.

In operation, this aspect of the invention thus provides a method for correcting data errors in data read from a disk drive, said data errors corresponding to syndromes detected in said read data, comprising the steps of: reading instructions in a stored error correction control program, the instructions including instructions corresponding to error correction calculations including multiply and accumulate instructions corresponding to combined finite field addition and multiplication operations; decoding the instructions including the multiply and accumulate instructions; and performing finite field addition and multiplication operations on selected operands time sequentially in response to a decoded multiply and accumulate instruction.

The time sequential finite field addition and multiplication operations are performed based on different clock signals.

Figure 7A:
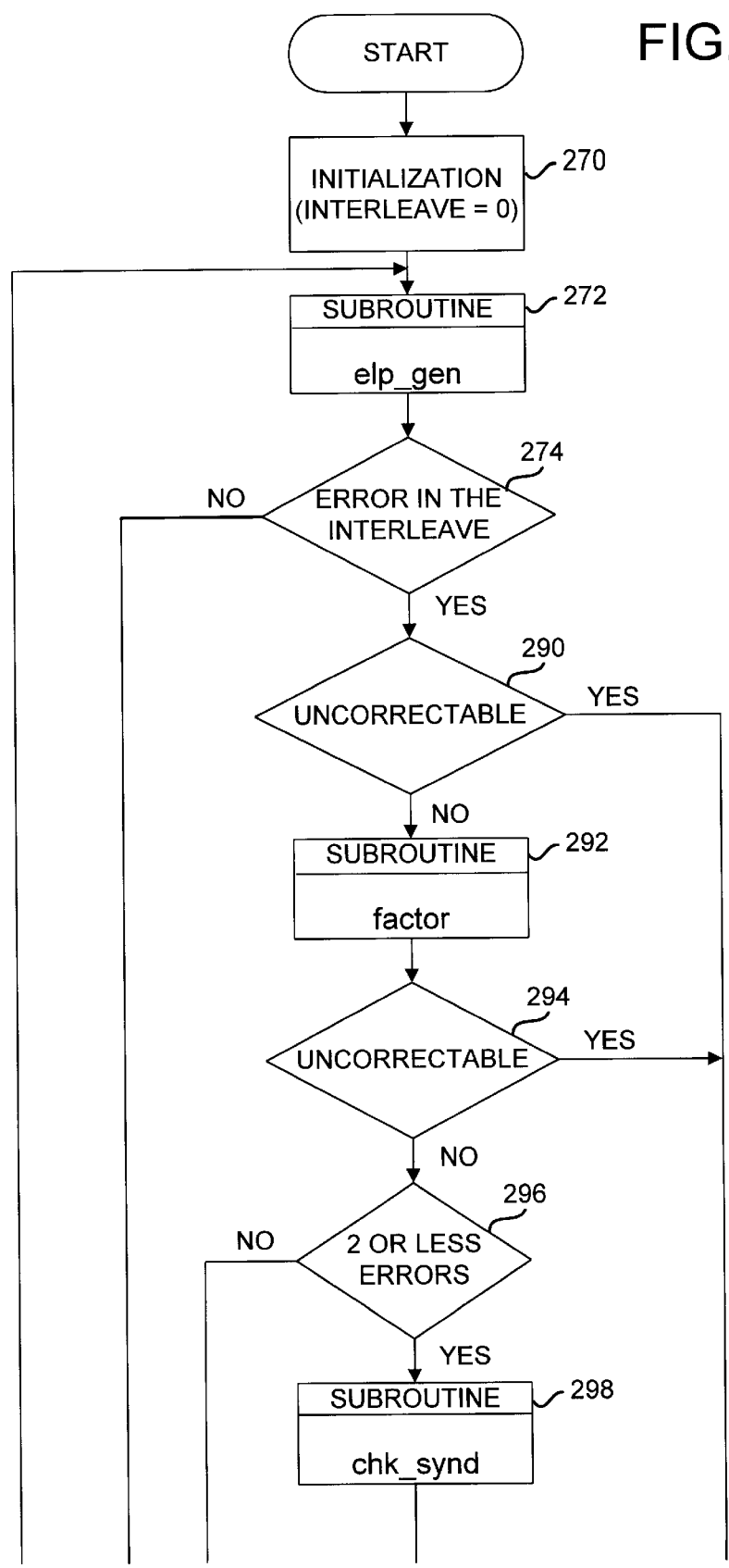
FIGS. 7A and 7B are flow diagrams illustrating the operation of the error corrector of FIG. 5 in accordance with a preferred embodiment of the present invention.
Figure 7B:
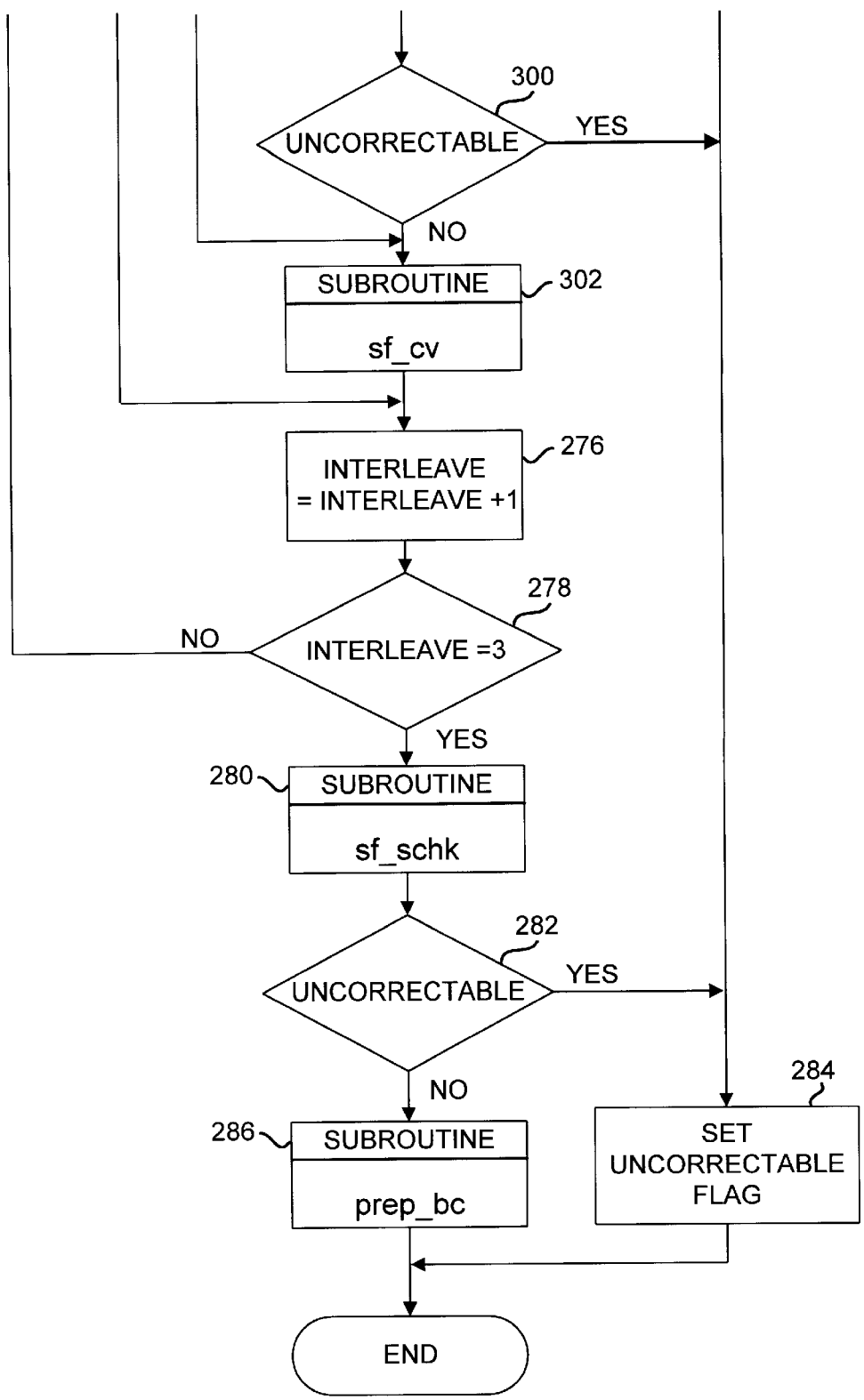

Referring to FIGS. 7A and 7B, the flow of the error correction control program is illustrated for the error corrector 134 (shown in FIG. 5). The error corrector microcode controls the RISC microcontroller 200 of FIG. 5 to compute the offsets and magnitudes and transfer the offsets and magnitudes to the buffer manager 146 through the LIFOs 228 and 230 for buffer data correction. It also supports the transparent LBA detection and provides LBA magnitudes if an LBA error occurs. The error corrector microcode also controls the error corrector 134 of FIG. 5 to validate the corrected data by generating software EDC and ECC syndromes and comparing them with the hardware syndromes generated by the C/S generator 130 (shown in FIG. 4) which are stored in register file 216 (as shown in FIG. 5). It also provides error counts for each interleave. The error corrector microcode instructions are listed in Appendix A along with a brief description of each instruction and the data format associated with the instruction. The detailed error corrector microcode listing is provided in Appendix B. (It will be appreciated by those skilled in the art that a field/extension field relationship is equivalent to a subfield/field relationship and the terms "subfield" and "field" employed in the microcode are equivalent to the terms "field" and "extension field," respectively, as used in the specification.)

The basic error correction algorithm is broken up into several stages as follows:

finding the roots of the error locator polynomial based on the hardware syndromes generated by C/S generator 130.

calculating offsets (error location) and magnitudes (error magnitude) based on the C/S generator syndromes.

validating the offsets and magnitudes for each interleave by generating software ECC syndromes and comparing them to the hardware ECC syndromes generated by C/S generator 130.

validating the offsets and magnitudes for the EDC span of the codeword by generating software EDC syndromes and comparing them to the hardware EDC syndromes generated by C/S generator 130.

preparing the offsets and magnitudes for correction of buffer data.

To facilitate processing of the error correction the following subroutines having functions as described are employed:

elp_gen

This subroutine evaluates the hardware ECC syndromes generated by the C/S generator 130 to determine if there are any errors in the interleave under test. If an error exists in an interleave, the subroutine determines if the error is correctable. If correctable, the error locator polynomial (ELP) is calculated. If the error is uncorrectable, the uncorrectable error flag is set.

factor

This subroutine calculates the offsets and magnitudes for the interleave under test. The roots of the error locator polynomial are first determined using the error locator polynomial generated by the elp_gen subroutine. A root is generated for each error. The roots of the error locator polynomial are used to calculate the offsets. The roots of the error locator polynomial and the hardware ECC syndromes generated by the C/S generator 130 are used to calculate the magnitudes. If one of the roots generated from the error locator polynomial is zero the uncorrectable error flag is set.

The equations employed are discussed in more detail below.

chk_synd

This subroutine generates software ECC syndromes for each interleave under test and validates the offsets and magnitudes generated by the factor subroutine, for each interleave in which there are two or less errors (t=2 or t=1).

The error corrector 134 generates software ECC syndromes over $GF(2^8)$ based on the offsets and magnitudes calculated by the factor subroutine. The software generated ECC syndromes generated by the error corrector 134 are then compared with the hardware ECC syndromes generated by the C/S generator 130 to determine if the offsets and magnitudes have been properly calculated by the error corrector 134.

If the syndromes do not match, the uncorrectable error flag is set. If the syndromes match, the offsets and magnitudes generated by the error corrector 134 are valid.

sf_cv

This subroutine, in conjunction with the sf_schk subroutine, detects miscorrection of the EDC span of the codeword, as opposed to one interleave. This subroutine converts the offsets within the interleave generated by the factor subroutine to offsets within the user data. The offsets, and corresponding magnitudes, calculated over $GF(2^8)$, are converted to extension field elements over $GF(2^{16})$. These are used by the subroutine sf_schk to generate software EDC syndromes.

sf_schk

This subroutine generates the software EDC syndromes whenever an error is detected in any interleave (unlike the chk_synd subroutine, which is performed only if there are two or less errors in an interleave). The software generated EDC syndromes over $GF(2^{16})$ are calculated using $GF(2^8)$ arithmetic rather than the more complicated $GF(2^{16})$ arithmetic by viewing the arithmetic operations in $GF(2^{16})$ as polynomial arithmetic over $GF(2^8)$. Therefore, a single Galois Field math unit may be used to generate the software ECC syndromes in the chk_synd subroutine and the software EDC syndromes in the sf_schk subroutine.

The software generated EDC syndromes generated by the error corrector 134 are then compared to the hardware generated EDC syndromes created by the C/S generator 130.

If the syndromes do not match the uncorrectable error flag is set. If the syndromes match, the offsets and magnitudes generated by the error corrector 134 are considered valid for the EDC span of the codeword.

prep_bc

This subroutine prepares the offset and magnitudes data for each interleave for use in correction of buffer data.

This subroutine converts the offsets within the interleave generated by the factor subroutine to offsets within the user data. Each user data offset is checked to determine if the error is located within the area assigned to the logical block address (LBA) or within the buffer data.

If the error is located in the LBA, the error magnitudes are stored in the corresponding location in the LBA error magnitude registers for the microprocessor 34 to read. The microprocessor is then interrupted so that corrective action may be taken. If the error is not in the LBA, the subroutine confirms the offset is in the data range (offset <172 bytes) and loads the offset and corresponding magnitude data to the LIFO for use by the buffer manager in correcting the buffer data.

The subroutine also maintains an error count of the number of errors for each interleave. The error count for each interleave is loaded into defined registers in the control register/logic block 210 for the microprocessor 34 to use as desired.

Referring to FIGS. 7A and 7B the top level flow of the microcode is next described.

After the RISC microcontroller idle routine is interrupted in response to a syndrome ready control signal from C/S generator 130, at step 270, the register file registers are initialized and the interleave number is set to zero. At step 272 the error locator polynomial subroutine elp_gen is called.

At step 274 the number of errors in the first interleave is examined. If the first interleave contains no errors, the program proceeds to step 276 where the interleave number is incremented by one. If an error is found in the interleave, the error is evaluated in step 290 and a determination is made as to whether the error is correctable. If the error is not correctable, the program proceeds to step 284 where the uncorrectable error flag is set.

If the error is correctable, the program proceeds to step 292 and calls the factor subroutine. This subroutine generates the roots of the error locator polynomial (ELP) determined at step 272 and stores such roots in register file 216. A root is generated for each error. The roots of the error locator polynomial are used to calculate the offsets. The roots of the error locator polynomial and the hardware ECC syndromes generated by the c/s generator 130 are used to calculate the corresponding magnitudes. Therefore the offsets and magnitudes (error magnitudes) are determined.

During step 294 the roots of the error locator polynomial from step 292 are examined. If any root is zero, the error is deemed uncorrectable and the program proceeds to step 284 where the uncorrectable error flag is set. If the error is found to be correctable the program proceeds to step 296 to determine if there are two or less errors in the interleave.

If there are two or less errors detected in the interleave, the program proceeds to step 298 to call subroutine chk_synd. This computes software ECC syndromes over $GF(2^8)$ using the offsets and magnitudes generated in step 292 by the factor subroutine.

In step 300, the software ECC syndromes are compared with the hardware ECC syndromes generated by C/S generator 130 (shown in FIG. 4) to determine if the offsets and magnitudes have been properly calculated. If syndromes mismatch, the program proceeds to step 284 where the uncorrectable error flag is set.

If the software ECC syndromes generated in step 298 match the hardware syndromes generated by the C/S generator 130, the offsets and corresponding magnitudes for the interleave under test are valid and the program proceeds to step 302 to call subroutine sf_cv. This subroutine deinterleaves the offsets, and converts the deinterleaved offsets and corresponding magnitudes, calculated over $GF(2^8)$, to extension field elements over $GF(2^{16})$. The program then proceeds to step 276 to add one to the interleave count and step 278 to determine if all three interleaves have been corrected.

If the interleave number does not equal three at step 278 the program returns to step 272 to calculate and validate the offsets and magnitudes for the next interleave.

If the interleave number equals three, the offsets and magnitudes for each of the interleaves has been generated and validated by the software ECC syndromes. The EDC span of the codeword is now validated at step 280 by calling the sf_schk subroutine. This step provides a second opportunity to detect miscorrection of the offsets and magnitudes. Software EDC syndromes over $GF(2^{16})$ are calculated using $GF(2^8)$ arithmetic by viewing the arithmetic operations in $GF(2^{16})$ as polynomial arithmetic over $GF(2^8)$. In step 282 the software EDC syndromes are compared with the hardware generated EDC syndromes generated by the C/S generator 130. If the syndromes do not match, then the error is deemed uncorrectable and the uncorrectable error flag is set at step 284.

If the software EDC syndromes match the hardware EDC syndromes in step 282 the offsets and magnitudes are determined to be valid and the program proceeds to step 286 where the prep_bc subroutine is called to correct the buffer data.

In order to correct the buffer data, the offsets are deinterleaved. The offsets and magnitudes are then provided to the buffer manager in accordance with the buffer arbitration procedure (described above in relation to FIG. 2). The LBA errors are identified and the LBA magnitudes are loaded to registers in register file 216 and an LBA error is posted in control register/logic block 210 for the microprocessor 34 to read. An error count is also maintained for errors in the three interleaves, respectively. Such error count is loaded into registers in the control registers/logic block 210 for the microprocessor 34 to read.

If in any of the above-noted error correction calculations the error is deemed uncorrectable, operations may be halted and the error optionally posted to microprocessor 34. If the error is posted to microprocessor 34 it may determine whether a read retry of the data should be attempted, whether other correction procedures are to be performed, whether to send uncorrected data to the host, or whether the read should be aborted and an error corrector error should be immediately posted to the host. The microprocessor may also perform erasure correction using other erasure information for the read data.

The advantages of the present invention in performing error detection, error correction and error correction validation may be best appreciated by considering the typical finite field calculations which must be performed in order to perform error detection and correction. As an example, the C/S generator 130 and the error corrector 134 perform the following general steps in a typical Reed-Solomon error correction sequence:

First, the six partial syndromes, $S_i=C(r_i)$, where $C(x)$ is the codeword polynomial and $r_i$ is the $i^{th}$ root of the generator polynomial, are calculated by C/S generator 130. If $S_1=S_2=S_3=S_4=S_5=S_6=0$, then error correction ceases because there are no detected errors, otherwise error correction processing continues. Assuming that the codeword contains 3 errors, the C/S generator must determine the unknown error locations and the unknown error magnitudes. Using the standard (Peterson—Gorenstein—Zierlev) algorithm, the first step is to determine $\sigma_1$, $\sigma_2$, and $\sigma_3$, the coefficients of the error locator polynomial, given the partial syndromes, $S_i$, where i=1, . . . , 6, according to $\sigma_i$, are:

$$\begin{bmatrix} \sigma_1 \\ \sigma_2 \\ \sigma_3 \end{bmatrix} = \begin{bmatrix} S_3 & S_2 & S_1 \\ S_4 & S_3 & S_2 \\ S_5 & S_4 & S_3 \end{bmatrix}^{-1} \begin{bmatrix} S_4 \\ S_5 \\ S_6 \end{bmatrix}$$

Explicitly, $$\sigma_3 = \frac{(S_3^2 + S_2 S_4)S_6 + (S_3 S_4 + S_2 S_5)S_5 + (S_4^2 + S_3 S_5)S_4}{|M_3|}$$

$$\sigma_2 = \frac{(S_2 S_3 + S_1 S_4)S_6 + (S_3^2 + S_1 S_5)S_5 + (S_3 S_4 + S_2 S_5)S_4}{|M_3|}$$

$$\sigma_1 = \frac{(S_2^2 + S_1 S_3)S_6 + (S_2 S_3 + S_1 S_4)S_5 + (S_3^2 + S_2 S_4)S_4}{|M_3|}$$

where, $$|M_3| = (S_3^2 + S_2 S_4)S_3 + (S_1 S_4 + S_2 S_3)S_4 + (S_2^2 + S_1 S_3)S_5$$

(Alternatively, a more efficient way to compute $\sigma_i$ is:

$$\sigma_3 = \frac{S_3^2 S_6 + S_2 S_4 S_6 + S_2 S_2^5 + S_4^3}{|M_3|}$$

$$\sigma_2 = \frac{S_2 S_3 S_6 + S_1 S_4 S_6 + S_3^2 S_5 + S_1 S_5^2 + S_3 S_4^2 + S_2 S_4 S_5}{|M_3|}$$

$$\sigma_1 = \frac{S_2^2 S_6 + S_1 S_3 S_6 + S_2 S_3 S_5 + S_1 S_4 S_5 + S_3^2 S_4 + S_2 S_4^2}{|M_3|}$$

where, $$|M_3| = S_3^3 + S_1 S_4^2 + S_2^2 S_5 + S_1 S_3 S_5)$$

It will be appreciated from these steps that a large number of finite field operations must be performed during a typical error correction process. The multi-level parallel operation of the programmable error corrector 134 greatly facilitates such operations. As has been shown, and as summarized in Table 3, performing the simple error correction calculation of computing the coefficients of the error locator polynomial, $\sigma_i$, for three errors where i=1, 2 and 3, requires 20 additions, 36 multiplications and 3 divisions, each of which would require a single execution cycle for a dedicated finite field processor or plural execution cycles for a conventional ALU. As implemented, the present invention can reduce the total number of instruction cycles by approximately 12 percent. Alternately, by implementing a speed optimized approach such as the alternate embodiment described above, which may be achieved simply by changing portions of the microcode, the present invention can reduce the total number of instruction cycles by approximately 25 percent.

TABLE 3

| Calculating $\sigma_3, \sigma_2, \sigma_1$ | Operations | | | Instructions/ Execution Cycles | % Perform. Increase |
|---|---|---|---|---|---|
| | Add | Mult | Div | | |
| Implemented | 20 | 36 | 3 | 52 | 12% |
| Optimized | 16 | 40 | 3 | 44 | 25% |

Figure 8B:
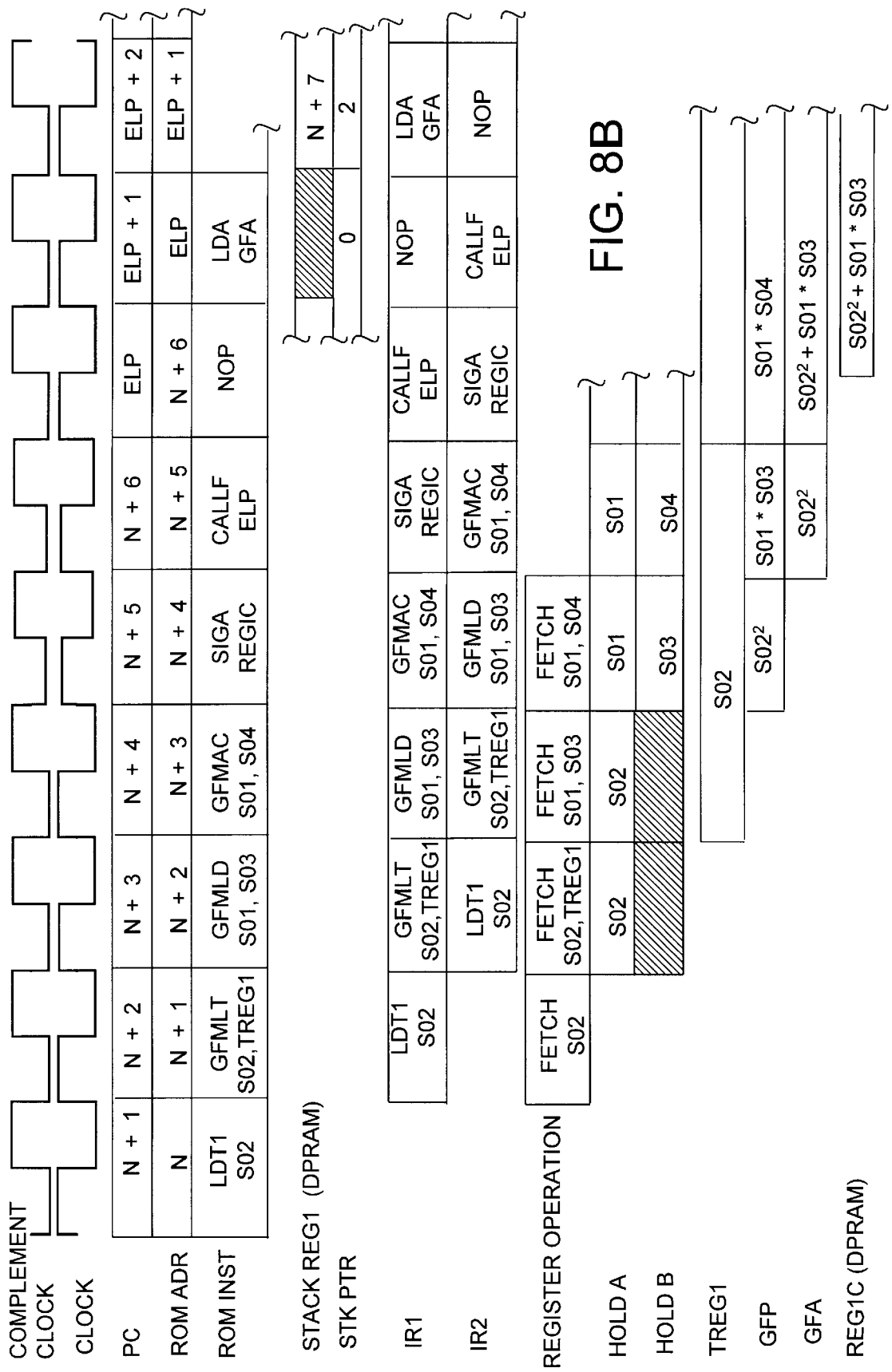
FIG. 8B shows the contents of key elements of the error corrector of FIG. 5 using the alternate embodiment of the Galois Field Multiply and Accumulate (GFMAC) unit of FIG. 6B on a cycle-by-cycle basis as a portion of the microcode performing an error location subroutine is processed by the error corrector.
Figure 9:
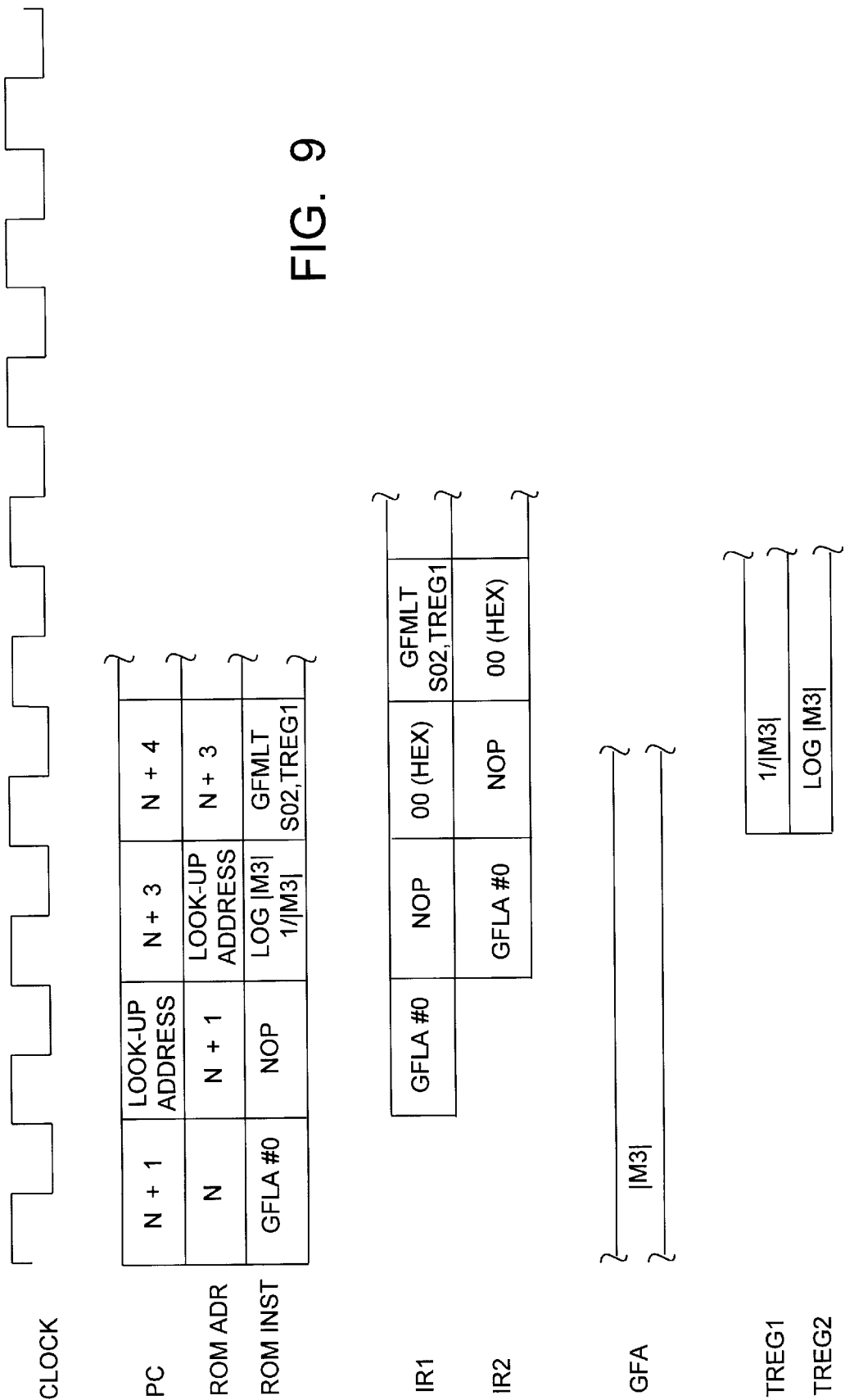
FIG. 9 shows the contents of key elements of the error corrector of FIG. 5 on a cycle-by-cycle basis as a portion of the microcode extracting data from a look-up table is processed by the error corrector.
Figure 10:
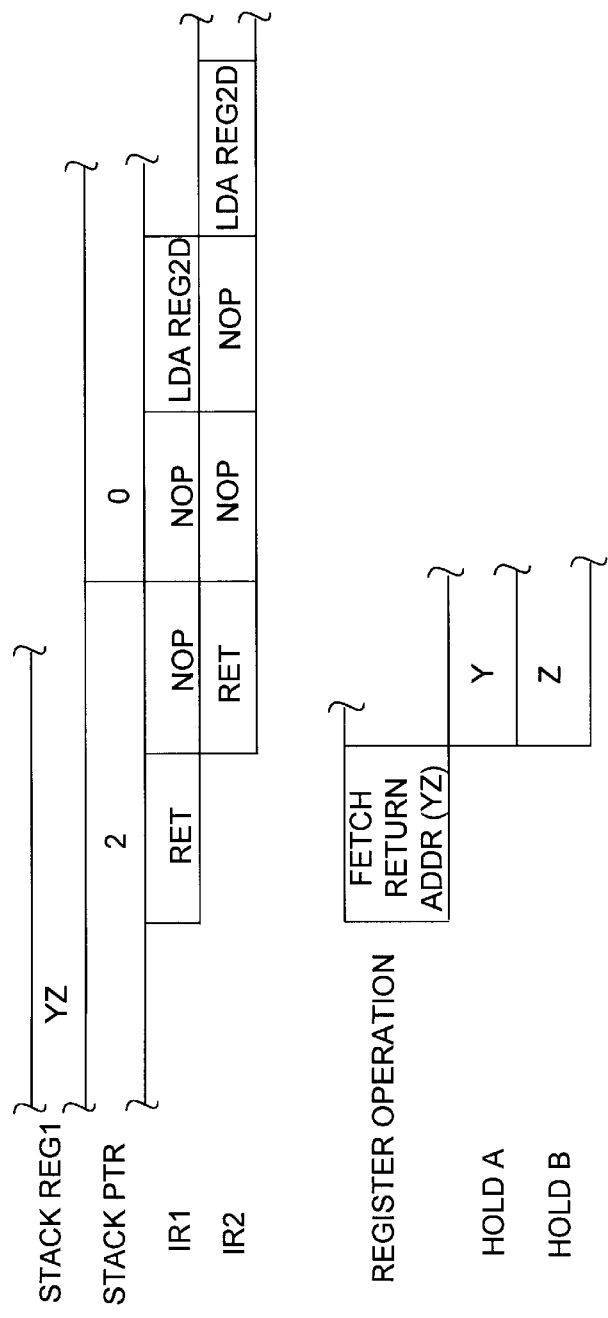
FIG. 10 shows the contents of key elements of the error corrector of FIG. 5 on a cycle-by-cycle basis as a portion of the microcode performing a return to a previous routine is processed by the error corrector.

More specifically, the pipelined operation of the RISC microcontroller 200 (shown in FIGS. 5 and 6) in processing the microcode, including parallel operand fetching and instruction execution, as well as the single clock cycle parallel execution of finite field multiplication and addition, may be best appreciated by showing the status of the elements of the RISC microcontroller, as shown in FIGS. 8–10 while processing corresponding portions of a specific set of microcode.

For example, the microcode in Table 4 is a portion of the microcode directed towards calculating the error locator polynomial $\sigma_1$ above. This portion of microcode performs the calculation $(S_2^2 + S_1 * S_3)$ associated with establishing the error location and stores the results of the calculation in REG1C. In this portion of code, the syndromes for the first interleave, S01–S06 have previously been determined by C/S generator 130 and stored in the register file 216 (as shown in Table 2).

TABLE 4

| ROM ADDRESS | ROM INSTRUCTION | |
|---|---|---|
| N | LDT1 S02 | |
| N+1 | GFMLT S02, TREG1 | ; GFP = S02$^2$ |
| N+2 | GFMLD S01, S03 | ; GFP = S01 * S03, GFA = S02$^2$ |
| N+3 | GFMAC S01, S04 | ; GFP = S01 * S04 |
| | | ; GFA = S02$^2$ + S01 * S03 |
| N+4 | STGA REG1C | ; STORE S02$^2$ + S01 * S03 |
| | | ; TO LOCATION 1C |
| | | OF DPRAM |
| N+5 | CALLF ELP | ; JMP TO ELP |
| N+6 | NOP | |
| . | | |
| . | | |
| . | | |
| ELP | LDA GFA | ; LOAD ACC WITH GFA |

FIG. 8A shows the contents of key elements of the RISC microcontroller 200 as the program address counter 204 proceeds through each clock cycle (CLOCK) of the microcode. The program proceeds according to the program address counter (PC), which indicates the ROM address (ROM ADR), which contains the next instruction or required data, in the program ROM (ROM INST).

In cycle 1 the ROM address is N and the associated ROM instruction is "LDT1 S02." The program address counter is pointing to "N+1," which is the next ROM address.

In cycle 2 the program address counter has loaded "N+1" into the ROM address and points to "N+2" as the next ROM address. The "N+1" ROM address contains the ROM instruction "GFMLT S02, TREG1." The ROM instruction from cycle 1 has been decoded through the level 1 instruction decode 214 (shown in FIG. 5) such that IR1 contains the instruction "LDT1 S02" and a fetch of the contents of address "S02" is requested.

In cycle 3 the program address counter has loaded "N+2" into the ROM address and points to "N+3" as the next ROM address. The fetch operation from the ROM instruction from cycle 1 "LDT1 S02" has loaded the contents of "S02" into HOLD A (as shown in FIG. 5). The ROM instruction from cycle 1 "LDT1 S02" has been further decoded through the level 2 instruction decode 215 (shown in FIG. 5) such that the IR2 contains the instruction "LDT1 S02" and the instruction "LDT1 S02" is executed. The ROM instruction from cycle 1 "LDT1 S02" is executed by preparing to load the contents of S02 into TREG1. In cycle 3, the ROM instruction from cycle 2 is decoded through the level 1 instruction decode 214 such that IR1 contains the instruction "GFMLT S02, TREG1" and, based on this instruction, a fetch of the contents of "S02" and "TREG1" is requested.

In cycle 4 the program address counter has loaded "N+3" into the ROM address and points to "N+4" as the next ROM address. The result of ROM instruction from cycle 1, "LDT1 S02" is loaded in TREG1. In cycle 4, the fetch operation from the ROM instruction from cycle 2 "GFMLT S02, TREG1" has loaded the contents of "S02" into HOLD A and the contents of "S02" into TREG1. The ROM instruction from cycle 2 "GFMLT S02, TREG1" has been further decoded through the level 2 instruction decode 215 such that IR2 contains the instruction "GFMLT S02, TREG1" and the instruction "GFMLT S02, TREG1" is executed by GF multiplying the contents of HOLD A and TREG1. The result is prepared to be loaded into GFP.

The error corrector 134 may perform a double fetch, or a fetch of two separate operands within a single cycle because of the register file 216 (shown in FIG. 5). The register file is comprised of a dual port RAM, therefore, a dual fetch may be performed to access the contents of two separate addresses within a single cycle. This parallel architecture thus permits double fetching of operands in a single cycle which may be simultaneously loaded into separate areas, HOLD A and HOLD B. The architecture provides another cycle-saving characteristic in that the decode in IR1 concurrently decodes an instruction and requests a fetch in a single cycle.

Continuing in cycle 4, the ROM instruction from cycle 3, "GFMLD S01, S03" is decoded through the level 1 instruction decode 214 such that IR1 contains the instruction "GFMLD S01, S03" and, based on this instruction, a fetch of the contents of "S01" and "S03" is requested.

In cycle 5 the program address counter has loaded "N+4" into the ROM address and points to "N+5" as the next ROM address. The result from ROM instruction from cycle 2 "GFMLT S02 TREG1" is loaded into GFP (product register 260 as shown in FIG. 6A).

In cycle 5, the fetch operation from ROM instruction from cycle 3 "GFMLD S01, S03" has loaded the contents of "S01" into HOLD A (shown in FIG. 5) and the contents of "S03" into HOLD B (shown in FIG. 5). In addition, the ROM instruction from cycle 3 has been further decoded through the level 2 instruction decode 215 such that IR2 contains the instruction "GFMLD S01, S03" and the instruction "GFMLD S01, S03" is executed by performing two, parallel operations. First, the contents of GFP (product register 260 as shown in FIG. 6A) are prepared to be loaded into GFA (the addition register 262 shown in FIG. 6A). Second, HOLD A and HOLD B are GF multiplied and the result is prepared to be loaded into GFP.

This instruction demonstrates the power of the RISC microcontroller to perform multiple calculations during a single clock cycle. This ability is paramount in error correcting operations in that error correction requires many series of concurrent multiplication and addition operations.

Also in cycle 5, the ROM instruction from cycle 4 "GFMAC S01, S04" is decoded through the level 1 instruction decode 214 such that IR1 contains the instruction "GFMAC S01, S04" and, based on this instruction, a fetch of the contents of "S01" and "S04" is requested.

In cycle 6 the program address counter has loaded "N+5" into the ROM address and points to "N+6" as the next ROM address. The results from ROM instruction cycle 3 "GFMLD S01, S03" are loaded into GFA and GFP.

Continuing in cycle 6, the fetch operation from cycle 4 has loaded the contents of "S01" into HOLD A and "S04" into HOLD B. Also in cycle 6, the ROM instruction from cycle 4 has been further decoded through the level 2 instruction decode 215 such that IR2 contains the instruction "GFMAC S01, S04" and the instruction "GFMAC S01, S04" is executed. The ROM instruction from cycle 4 "GFMAC S01, S04" is executed by performing two, parallel operations. First, the contents of GFP (product register 260 as shown in FIG. 6A) from the prior operation are added to the current contents of GFA (the addition register 262 shown in FIG. 6A) and the result is prepared to be loaded into GFA. Second, HOLD A and HOLD B are GF multiplied and the result is prepared to be loaded into GFP.

Further, in cycle 6, the ROM instruction from cycle 5 is decoded through the level 1 instruction decode 214 such that IR1 contains the instruction "STGA REG1C."

In cycle 7 the program address counter has loaded "N+6" into the ROM address and points to "ELP," a subroutine for calculating the error locating polynomial, as the next ROM address. In cycle 7, the results from ROM instruction cycle 4 "GFMAC S01, S04" are loaded into GFA and GFP.

Continuing in cycle 7, the ROM instruction from cycle 5 has been further decoded through the level 2 instruction decode 215 such that IR2 contains the instruction "STGA REG1C" and the instruction "STGA REG1C" is executed. The ROM instruction from cycle 5 "STGA REG1C" is executed by preparing to load the contents of GFA from the prior operation into REG1C.

Also in cycle 7, the ROM instruction from cycle 6 is decoded through the level 1 instruction decode 214 such that IR1 contains the instruction "CALLF ELP."

In cycle 8 the program address counter has loaded "ELP" into the ROM address and points to "ELP+1" as the next ROM address. In cycle 8, the result from the ROM instruction from cycle 5 "STGA REG1C" is loaded into REG1C.

Continuing in cycle 8, the ROM instruction from cycle 6 has been further decoded through the level 2 instruction decode 215 such that IR2 contains the instruction "CALLF ELP" and the instruction "CALLF ELP" is executed. The ROM instruction from cycle 6 "CALLF ELP" is executed by preparing to load "2" into the stack pointer and by preparing to load the location of the return address, "N+7," into STACK REG1 (shown as the register file 216 in FIG. 5).

Further, in cycle 8 the ROM instruction from cycle 7 is decoded through the level 1 instruction decode 214 such that IR1 contains the instruction "NOP."

In cycle 9 the program address counter has loaded "ELP+1" into the ROM address and points to "ELP+2" as the next ROM address. In cycle 9, the result from ROM instruction from cycle 6 "CALLF ELP" loads "2" into the stack pointer and loads the location of the return address, "N+7," into the STACK REG1 (shown as the register file 216 in FIG. 5).

Continuing in cycle 9, the ROM instruction from cycle 7 has been further decoded through the level 2 instruction decode 215 such that IR2 contains the instruction "NOP" and no operation is executed.

Further, in cycle 9 the ROM instruction from cycle 8 is decoded through the level 1 instruction decode 214 such that IR1 contains the instruction "LDA GFA."

This embodiment demonstrates that the present invention may, within a single execution cycle, fetch one or more operands based on a third instruction, decode a second instruction and execute a first instruction. Furthermore, the instructions are not necessarily sequential. The present invention may fetch operands based upon a fifth instruction; decode a second, third, or fourth instruction; and execute a first instruction, depending upon the embodiment implemented and the number of levels of decode provided.

FIG. 8B shows the contents of key elements of the RISC microcontroller 200 using the alternate embodiment GFMAC unit of FIG. 6B. As shown in FIG. 8B, the majority of the key elements of the RISC microcontroller 200 have the same contents, according to the same timing, as described in association with the description of FIG. 8A and Table 4. In addition, FIG. 8B shows the complement clock signal used in triggering finite field math operations performed by the Galois Field multiplier 252 and the Galois Field adder 254.

The complement clock signal, as shown, provides an additional rising edge clock within the same clock cycle as provided by the primary clock. The complement clock signal may be symmetrical, with the duty cycle equal to half the period, as shown in FIG. 8B, or may be asymmetrical, with the duty cycle not equal to half the period. An asymmetrical complement clock may be provided to optimize the Galois Field multiplier 252 and the Galois Field adder 254. For example, because finite field multiplication typically takes longer to perform than finite field addition, the Galois Field adder 254 could be commanded to first perform an addition operation and load the result into the addition register 262 and, second, the Galois Field multiplier 252 could be commanded to perform a multiplication operation and load the result in the product register 260 within a typical clock cycle. Assuming the rising edge of the primary clock triggers the addition, the rising edge of the complement clock signal could be foreshortened so that less time was provided for addition and more time was provided for multiplication.

In contrast with FIG. 8A, FIG. 8B shows that loading the contents of GFP and GFA is staggered according to the clock and the complementary clock signals provided to the Galois Field multiplier 252 and the Galois Field adder 254 (as shown in FIG. 6B). GFP is loaded with "S02$^2$" at the beginning of cycle 5 in response to the "GFMLT S02, TREG1" instruction from cycle 2 and GFA is loaded with "S02$^2$" in the middle of cycle 5 in response to the first portion of the "GFMLD S01, S03" instruction from cycle 3. Similarly, the GFP is loaded with "S01 * S03" at the beginning of cycle 6 in response to second portion of the "GFMLD S01, S03" instruction from cycle 3 and the GFA is loaded with "S02$^2$+S01 * S03" in the middle of cycle 6 in response to the first portion of the "GFMAC S01, S04" instruction from cycle 4.

The microcode in Table 5 is a portion of the microcode directed towards computing the coefficients of the error locator polynomials as discussed above. More particularly, if there are three errors in the interleave, the inverse of $|M_3|$ is determined with the assistance of table 0 of the look-up table (shown in Appendix C) to perform additional calculations.

TABLE 5

| ROM ADDRESS | ROM INSTRUCTION | |
| --- | --- | --- |
| N | GFLA #0 | ; FIND INVERSE OF GFA = $|M_3|$ |
| N+1 | NOP | ; NO OPERATION |
| LOOK-UP ADDRESS | GFLD | ; NO OPERATION |
| N+3 | GFMLT S02, TREG1 | ; GFP = S02 * $1/|M_3|$ |

FIG. 9 shows the contents of key elements of the RISC microcontroller 200 as the program address counter 204 proceeds through each clock cycle (CLOCK) of the microcode from Table 5. At the outset, $|M_3|$ is stored in the GFA as shown in FIG. 9.

In cycle 1 the ROM address is N and the associated ROM instruction is "GFLA #0." The program address counter is pointing to "N+1," which is the next ROM address.

In cycle 2 the program address counter has loaded "N+1" into the ROM address and points to "LOOK-UP ADDRESS" as the next ROM address. The ROM instruction from cycle 1 has been decoded through the level 1 instruction decode 214 such that IR1 contains the instruction "GFLA #0." This instruction requests the program address generator be disabled and provides a substitute "next address." Therefore, the next address is "LOOK-UP ADDRESS" as set by the "GFLA" instruction. In this case the address is the address of "look-up table 0."

In cycle 3 the program address counter has loaded the look-up address into the ROM address as a result of the cycle 2, level 1 instruction decode and points to "N+3" as the next ROM address. The look-up address provided by the "GFLA #0" instruction is the address of the desired look-up table. In cycle 3, the ROM instruction from cycle 1 "GFLA #0" has been further decoded through the level 2 instruction decode 215 such that IR2 contains the instruction "GFLA #0" and the instruction "GFLA #0" is executed by preparing to load the contents of the look-up table identified by the look-up instruction into TREG1 and TREG2..

Continuing in cycle 3, the ROM instruction from cycle 2 is decoded through the level 1 instruction decode 214 in such that IR1 contains the instruction "NOP." A "NOP" is required because the look-up table instruction creates a gap in the program address counter progression.

In cycle 4 the program address counter has loaded "N+3" into the ROM address and points to "N+4" as the next ROM address. The result of the ROM instruction from cycle 1 "GFLA #0" is loaded into TREG1 and TREG2.

Continuing in cycle 4, the ROM instruction from cycle 2 has been further decoded through the level 2 instruction decode 215 such that IR2 contains the instruction "NOP" and no operation is executed.

Further, in cycle 4 the ROM instruction from cycle 3 is decoded through the level 1 instruction decode 214 to load 00(HEX) into IR1 in order to clear IR1.

The microcode in Table 6 is a portion of the microcode directed towards performing a RET instruction. The terms "Y" and "Z" in Table 6 each represent a one-byte wide segment of a two-byte wide address. Therefore, "YZ" represents a single address location. This portion of microcode begins with the ROM address of "YZ−2" requesting a type of jump instruction to the subroutine "elp_gen." This causes the program address generator to jump to the address location at the start of "elp_gen" which is represented in Table 6 in the "ROM INSTRUCTION" column as "elp_gen:." At the conclusion of the subroutine a return instruction "RET" is given to return the microcode from where it had jumped.

TABLE 6

| ROM ADDRESS | ROM INSTRUCTION |
| --- | --- |
| YZ−2 | CALLF elp_gen |
| YZ−1 | NOP |
| YZ | LDA REG2D |
| YZ+1 | . |

TABLE 6-continued

| ROM ADDRESS | ROM INSTRUCTION |
|---|---|
| | elp_gen: |
| | . |
| | . |
| N | RET |
| N+1 | NOP |
| N+2 | NOP |

FIG. 10 shows the contents of key elements of the RISC microcontroller 200 as the program address counter 204 proceeds through each clock cycle (CLOCK) of the microcode from Table 6 to carry out a RET instruction. At the outset, the return address "YZ" has already stored in the stack register "STACK REG1" as a result of the CALLF command and the stack pointer "STACK PTR" is set to "2" indicating that two bytes of address data are stored in the stack register.

In cycle 1 the ROM address is N and the associated ROM instruction is "RET." The program address counter is pointing to "N+1," which is the next ROM address.

In cycle 2 the program address counter has loaded "N+1" into the ROM address and points to "N+2" as the next ROM address. The "N+1" ROM address contains the ROM instruction "NOP." The ROM instruction from cycle 1 has been decoded through the level 1 instruction decode 214 such that IR1 contains the instruction "RET" and a fetch of the return address "YZ" from the stack pointer is requested.

In cycle 3 the program address counter has loaded "N+2" into the ROM address. The fetch operation from the ROM instruction from cycle 1 is completed, thus "Y" has been moved into HOLD A and "Z" has been moved into HOLD B. In cycle 3, the ROM instruction from cycle 1 "RET" has been further decoded through the level 2 instruction decode 215 such that IR2 contains the instruction "RET," and the instruction "RET" is executed. The "RET" instruction is executed by disabling the program address counter. Further the contents of HOLD A and HOLD B, "Y" and "Z," are loaded into the program address counter to point to "YZ" as the next ROM address.

Continuing in cycle 3, the ROM instruction from cycle 2 is decoded through the level 1 instruction decode 214 such that IR1 contains the instruction "NOP."

In cycle 4 the program address counter has loaded "YZ" into the ROM address and points to "YZ+1" as the next ROM address. The ROM instruction from cycle 2 has been further decoded through the level 2 instruction decode 215 such that IR2 contains the instruction "NOP" and no operation is executed.

Continuing in cycle 4, the ROM instruction from cycle 3 is decoded through the level 1 instruction decode 214 such that IR1 contains the instruction "NOP." Two successive "NOP" instructions are loaded into IR1 to clear the instruction register after a jump or return.

In cycle 5 the program address counter has loaded "YZ+1" into the ROM address and points to "YZ+2" as the next ROM address. The ROM instruction from cycle 3 has been further decoded through the level 2 instruction decode 215 such that IR2 contains the instruction "NOP." The ROM instruction from cycle 4 is decoded through the level 1 instruction decode 214 such that IR1 contains the instruction "LDA REG2D."

In view of the foregoing, it will be appreciated that the pipelined, parallel decoding and execution operation of the RISC microcontroller provides highly efficient execution of the error corrector microcode.

In operation, it will be appreciated that the present invention provides a method for detecting errors in data read from a disk drive and correcting the errors, comprising the steps of: detecting errors during disk drive read operations; providing error correction code syndromes corresponding to detected errors; and correcting errors in the user data read from the data storage disks employing the error correction code syndromes under error correction program control. In this method, the error corrector performs the following steps: receiving a first stored error correction control program instruction corresponding to a finite field operation on a first set of operands and decoding the instruction; fetching the first set of operands; receiving a second error correction control program instruction in parallel with the fetching step; and performing a finite field calculation on the first set of operands in response to the first decoded instruction. In this method, the first set of operands may comprise a single operand. Alternately, the first set of operands comprises two operands and the operands are fetched in parallel and in a single execution.

In this method for providing error correction, the second error correction control program instruction corresponds to a finite field operation on a second set of operands and the second set of operands are fetched in parallel with the step of performing a finite field calculation on the first set of operands.

Figure 11:
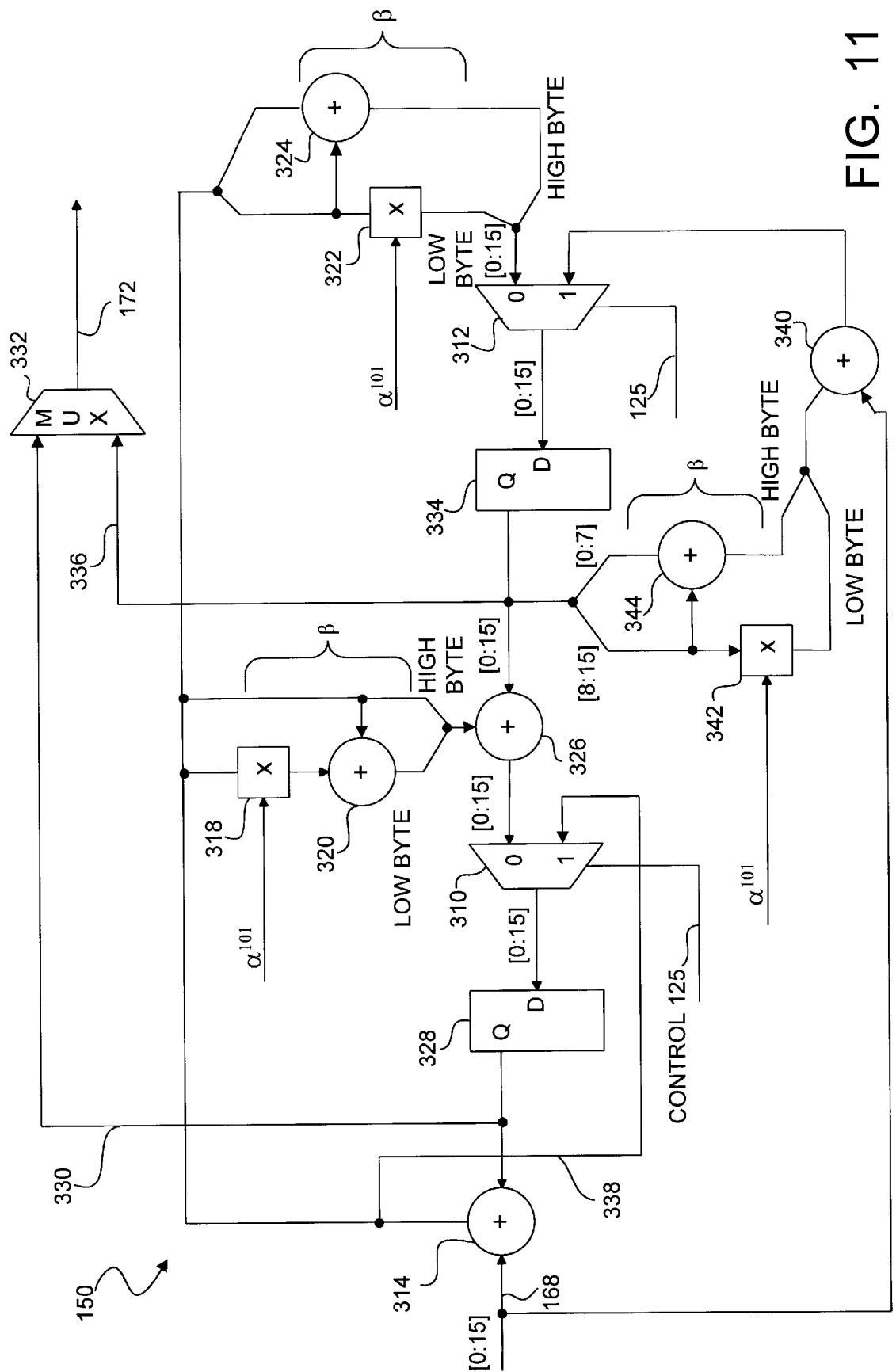
FIG. 11 is a schematic drawing of the EDC check symbol/syndrome generator of FIG. 4 in accordance with a preferred embodiment of the present invention.

Referring to FIG. 11, a preferred embodiment of the EDC check symbol/syndrome generator 150 discussed above in relation to FIG. 4, is illustrated in a block schematic drawing. As described above in relation to FIG. 4, the EDC check symbol/syndrome generator 150 receives the data and transparent LBA along line 168 in a word wide parallel fashion and, during a write operation, encodes the data and LBA using the generator polynomial of equation (2) above over $GF(2^{16})$.

The check symbol generation function of the EDC check symbol/syndrome generator 150 is selected by multiplexors 310, 312 which receive the control signal provided along line 125 (from disk controller 128 as discussed above) to select either the 0 or 1 input to the respective multiplexor. The control line 125, may, for example, provide a read gate (RG) signal which is high during a read operation and low during a write operation. Thus, for EDC check symbol generation the control signal selects input 0 to the multiplexors 310, 312 thereby causing the input data provided along line 168 to be provided along the upper path in the circuitry illustrated in FIG. 11.

More specifically, during EDC check symbol generation, the data provided along line 168 is provided via exclusive OR (XOR) circuit 314 along line 316 to a first branch of the path which includes Galois Field multiply circuit 318 and XOR circuit 320. This portion of the upper branch implements the $(\beta+1)$ GF $(2^{16})$ multiplication illustrated above for the generator polynomial of equation (2). The input along line 316 is also provided through a second path including Galois Field multiply circuit 322 and XOR circuit 324 which implements the $\beta$ portion of the generator polynomial calculation.

Still referring to FIG. 11, the first branch is XORed with the output of the second branch at XOR circuit 326 and provided, via multiplexor 310, to first 16-bit register 328. The output of register 328 in turn is provided along line 330 as a first word wide EDC check symbol. This EDC check symbol is provided via multiplexor 332 to line 172 (which is described above in relation to FIG. 4). The output of register 328 is also provided to XOR circuit 314 where the XOR function is performed with the incoming data along line 168.

The second path in the circuit of FIG. 11 in turn provides a second word wide check symbol via register 334 and output line 336. This second check symbol is provided to output line 172 via multiplexor 332.

The lower portion of the circuit of FIG. 11 operates during EDC syndrome generation. This portion is enabled by the control line 125 selecting the input 1 to the multiplexors 310, 312 during a read operation (for example corresponding to RG=1). More specifically, during a read operation the syndrome generation path of the circuit of FIG. 11 receives the complete codeword along line 168. This is provided to XOR circuit 314 which feeds the output back via multiplexor 310 and register 328 and provides the first word of the calculated syndrome along output line 330 and via multiplexor 332 to output line 172. A second syndrome generation path in turn receives the input along line 168 and provides it to XOR circuit 340 which feeds the output back via multiplexor 312 and register 334 to circuitry including Galois Field multiply circuit 342 and XOR circuit 344 which provides a second input to the XOR circuit 340. This second syndrome generation loop of the circuit in FIG. 11 then provides the second word of the calculated syndrome along output line 336 and via multiplexor 332 to output line 172.

Accordingly, it will be appreciated that the EDC check symbol/syndrome generator 150 of FIG. 11 provides an efficient implementation of the desired Galois Field check symbol and syndrome polynomial calculations. Furthermore, such syndrome generation may be provided in an extremely fast manner to allow the syndrome generation to be completed for a first data sector prior to reading an immediately adjacent second data sector in back-to-back sector read operations. This thus allows on-the-fly EDC syndrome generation of the EDC codewords.

Figure 12A:
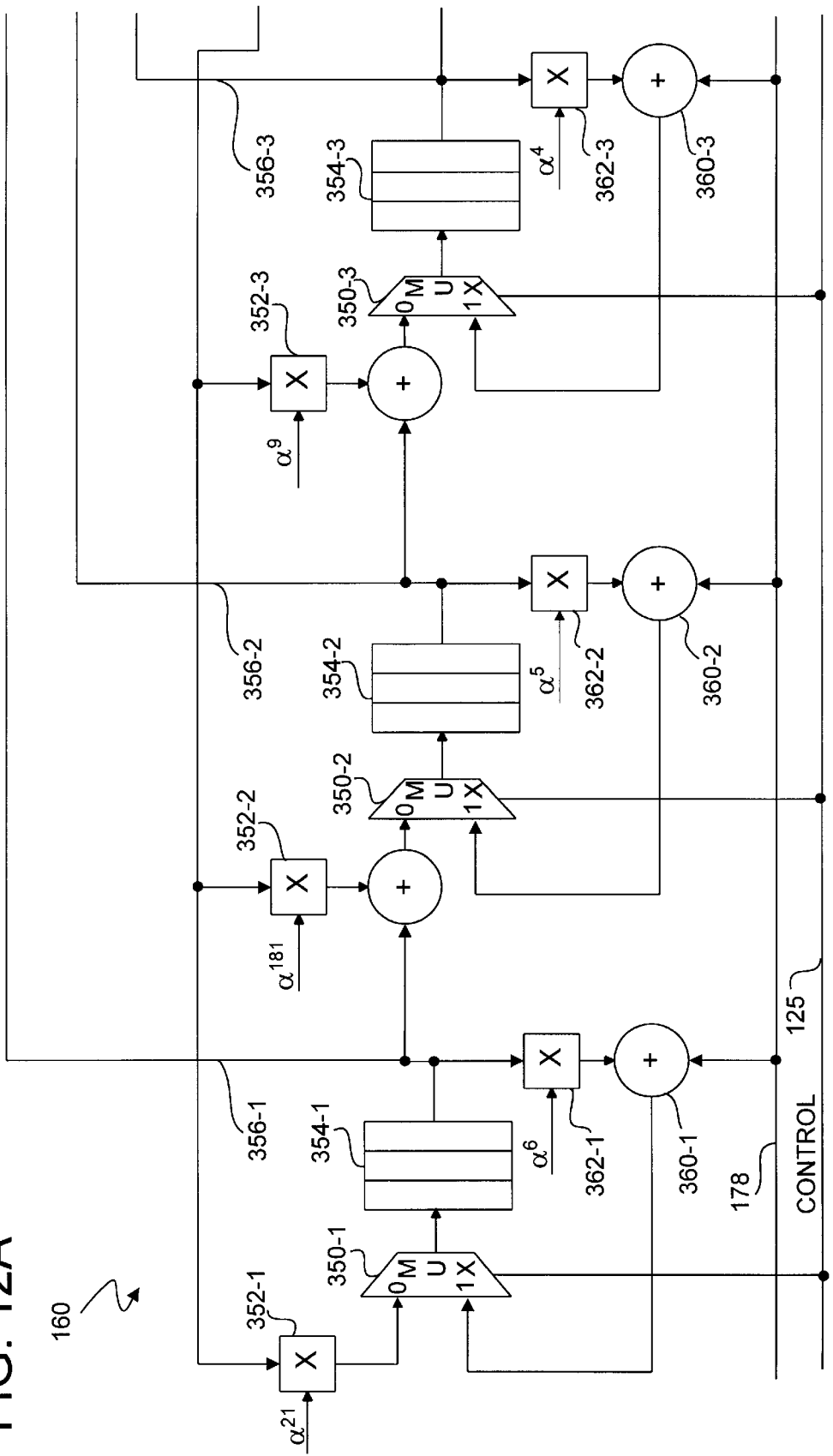
FIGS. 12A and 12B are schematic drawings of the ECC check symbol/syndrome generator of FIG. 4 in accordance with a preferred embodiment of the present invention.
Figure 12B:
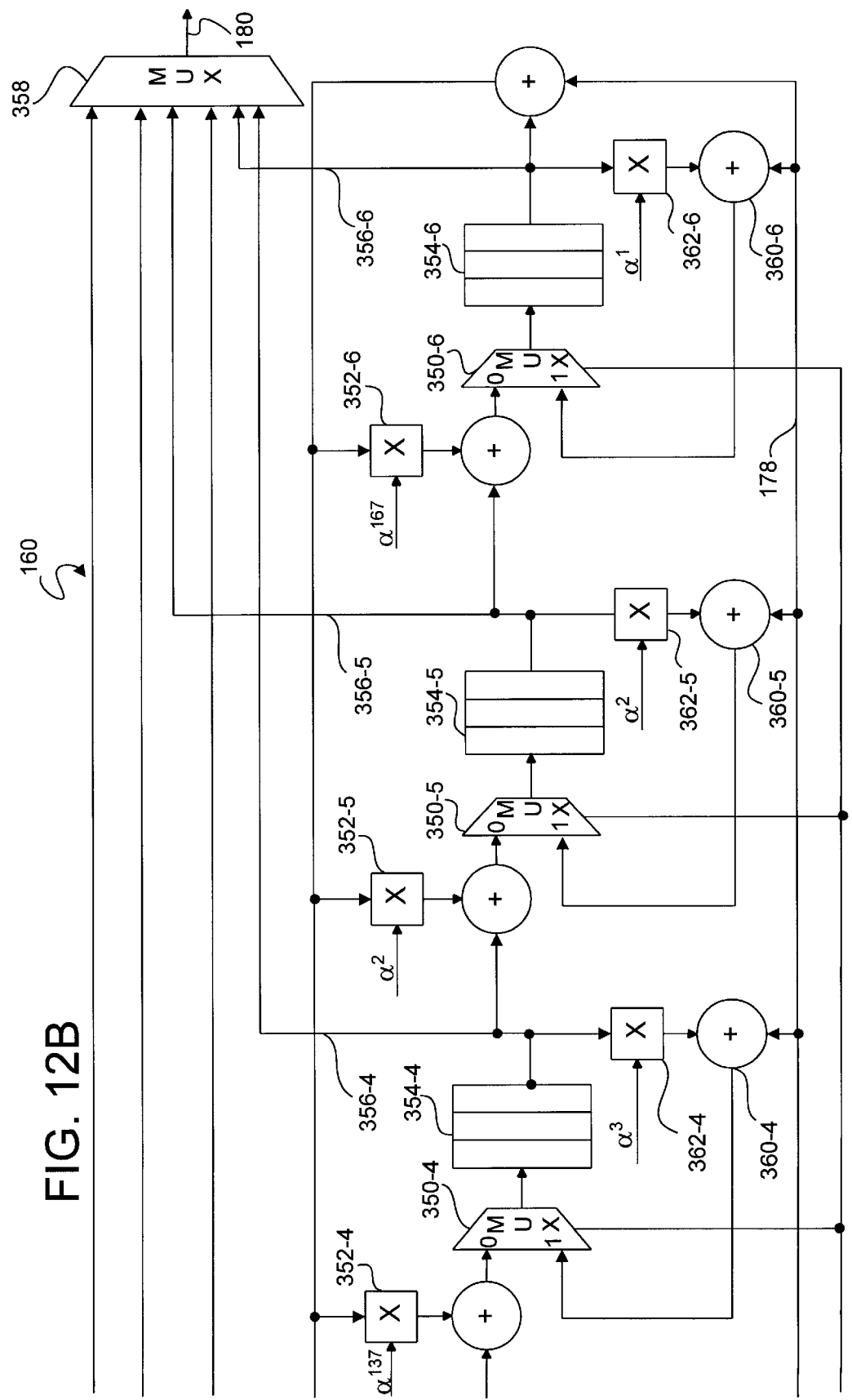

Referring to FIGS. 12A and 12B, a preferred embodiment of the ECC check symbol/syndrome generator circuit 160 is illustrated in a block schematic drawing. Similarly to the EDC check symbol/syndrome generator circuit 150 described in relation to FIG. 11, the circuit of FIGS. 12A and 12B employs an upper portion of the circuit for generating ECC check symbols during write operations and a lower portion of the circuit for generating ECC syndromes during read operations. This selection between the upper and lower portions of the circuit for ECC check symbol generation and ECC syndrome generation, respectively, is accomplished by multiplexors 350-1 to 350-6. The multiplexors' outputs in turn are selected by the application of a control signal along control line 125 to the multiplexors 350-1 to 350-6. As in the case of the EDC check symbol/syndrome generator circuit of FIG. 11, the control signal along line 125 may correspond to a read gate (RG) signal which is high during a read operation and low during a write operation. Thus, when the control line input 125 to multiplexors 350-1 to 350-6 is low (RG=0) the 0 input to the multiplexors is selected, and when it is high (RG=1) the 1 input to the multiplexors is selected.

The upper portion of the ECC check symbol/syndrome generator circuit 160 of FIGS. 12A and 12B generates check symbols from data provided along line 178 (as shown in FIG. 4 discussed above) by implementing the generator polynomial defined over GF($2^8$) (equation (1) above) of:

$$G_{ecc}(x) = (x + \alpha^1)(x + \alpha^2)(x + \alpha^3)(x + \alpha^4)(x + \alpha^5)(x + \alpha^6) =$$

$$x^6 + \alpha^{167}x^5 + \alpha^2 x^4 + \alpha^{137}x^3 + \alpha^9 x^2 + \alpha^{181}x + \alpha^{21}$$

More specifically, Galois Field multiplier circuits 352-1 to 352-6 provide the polynomial constants in the above noted equation. Each closed path in the check symbol generator is provided through a 3-stage shift register, 354-1 to 354-6. Each stage of these shift registers has an 8-bit wide shift register to individually store each of the three interleaves of the three-way interleaved Reed-Solomon check symbol. Each of shift registers 354-1 to 354-6 in turn provides an output along separate output lines 356-1 to 356-6 respectively to multiplexor 358 which serially provides the 18 check symbols along line 180 (as better shown in FIG. 4). Alternately, instead of using 3-stage shift registers 354-1 to 354-6 in the ECC check symbol/syndrome generator 160 to create the necessary interleaves during read and write operations, a data splitter may be employed which divides the data into three data streams which are provided to three sets of ECC check symbol/syndrome generator circuits for processing.

During ECC syndrome generation, corresponding to a read operation from the data storage disks, the bottom portion of the circuit of FIGS. 12A and 12B evaluates the codeword polynomial at $\alpha, \alpha^2, \ldots \alpha^6$, the roots of $G_{ecc}(x)$, defined by equation (1). The bottom portion of the circuit of FIGS. 12A and 12B implements a series of calculations each corresponding to one term in the polynomial by virtue of XOR circuits 360-1 to 360-6 and Galois Field multiply circuits 362-1 to 362-6. The latter implement multiplication with powers of the primitive a of the generator polynomial. The ECC syndrome generation portion of the circuit of FIGS. 12A and 12B also employs the same shift registers 354-1 to 354-6 used in ECC check symbol generation to receive the output of the bottom portion of the circuit in multiplexors 350-1 to 350-6 and provides these outputs along the lines 356-1 to 356-6. The multiplexor 358 in turn serially provides the calculated ECC syndromes along line 180. These syndromes are provided to the corrector circuit 134 as shown in FIGS. 2 and 4 and described above.

Figure 13A:
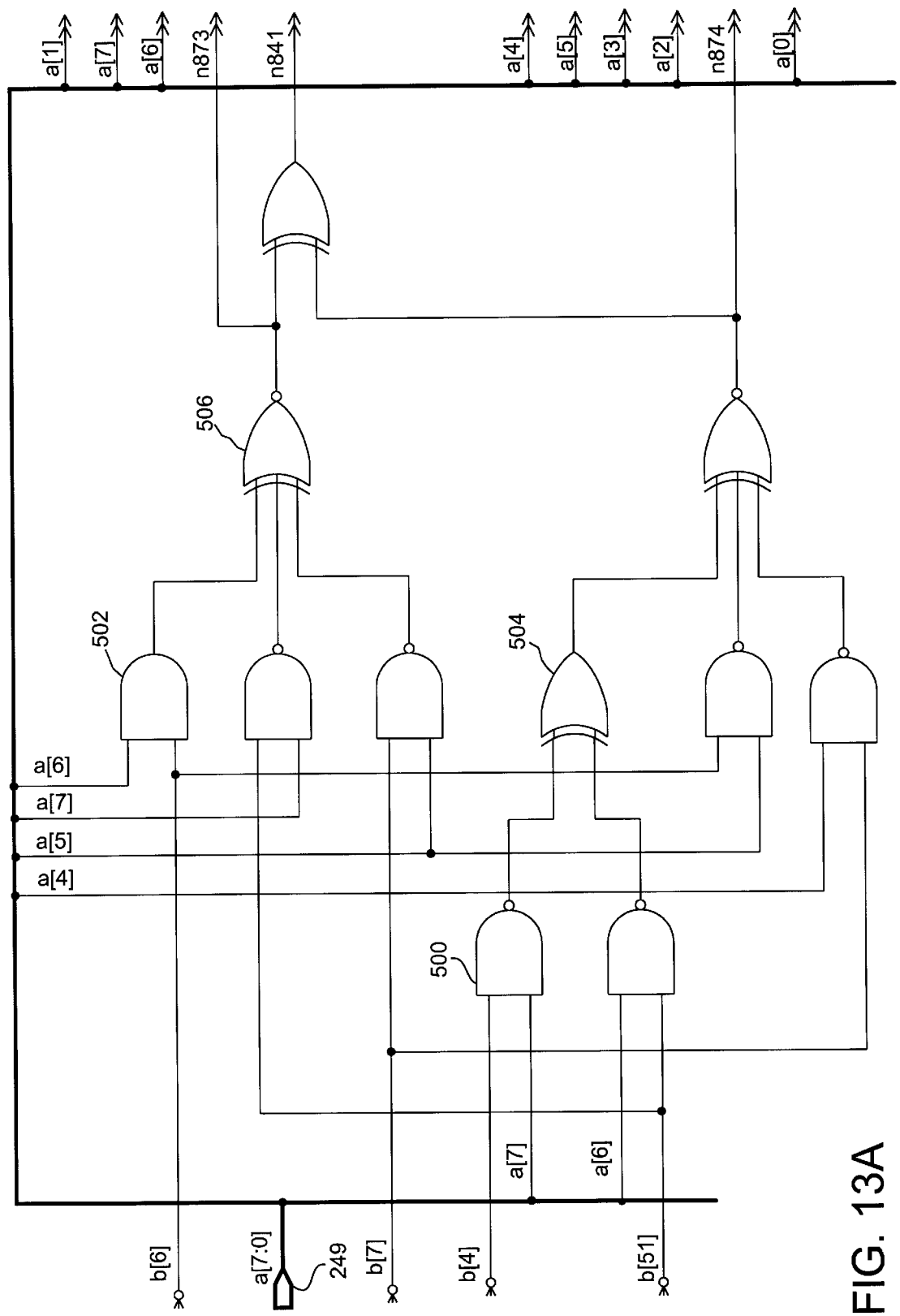
Figure 13B:
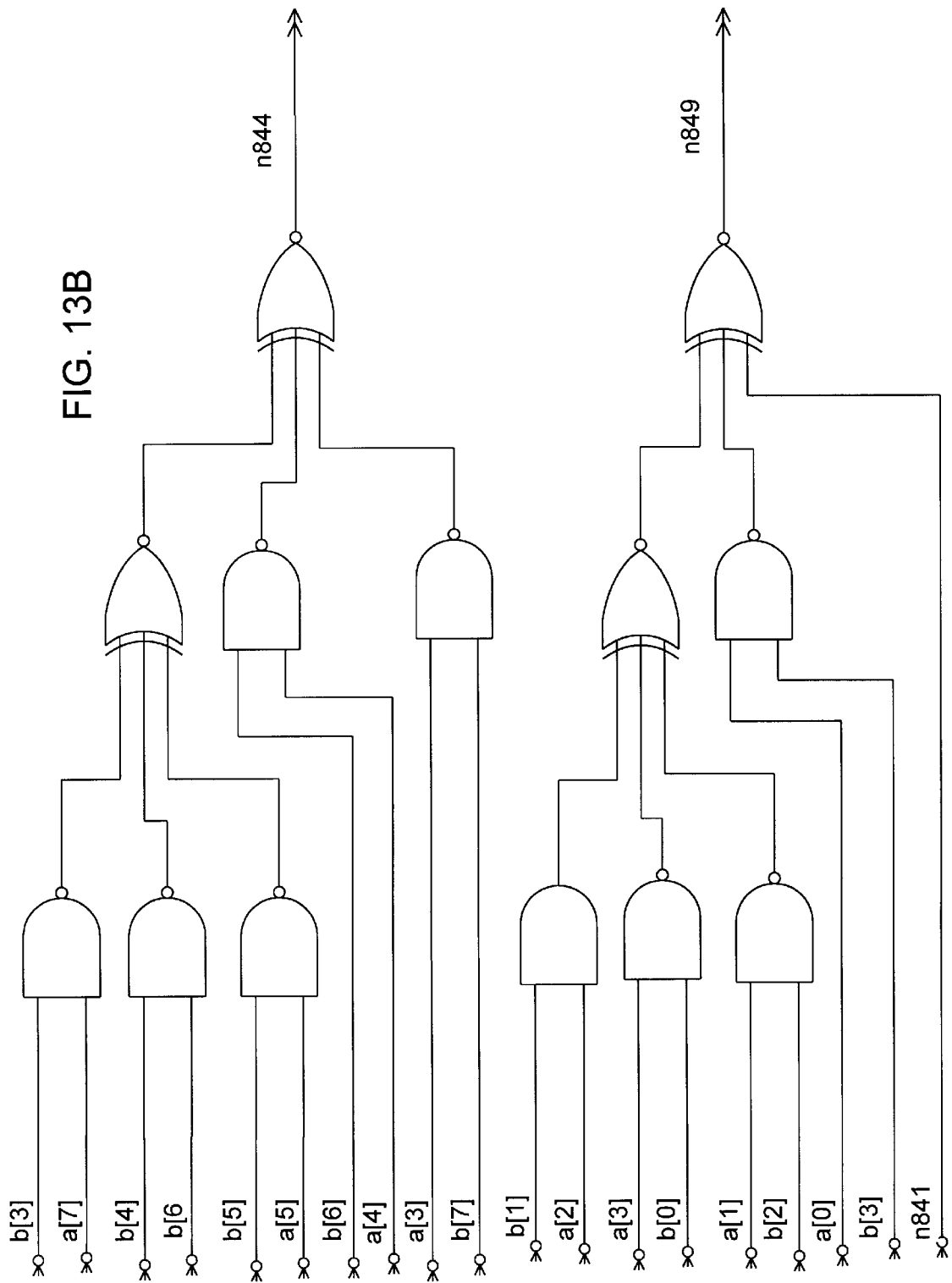
Figure 13C:
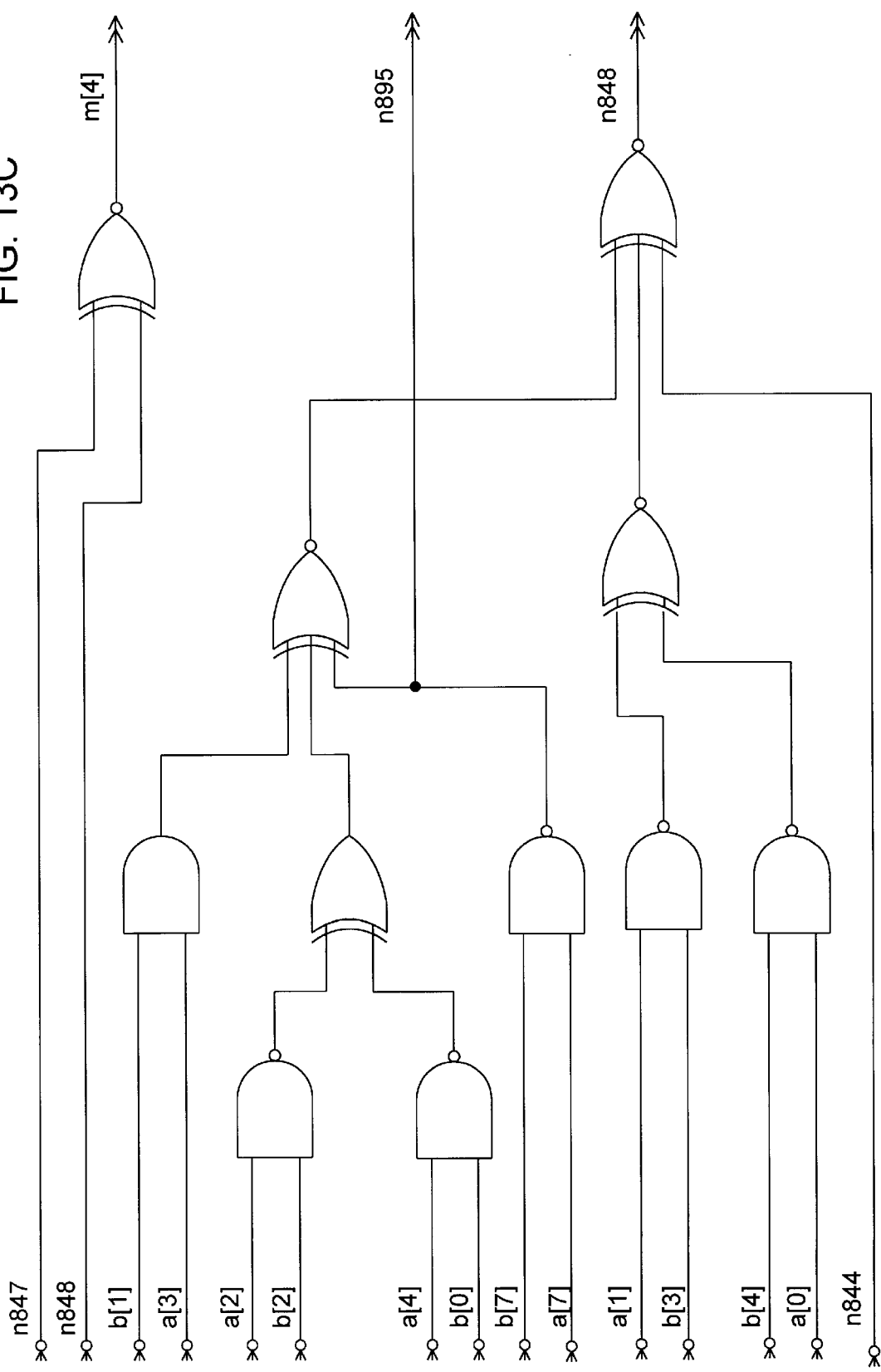
Figure 13D:
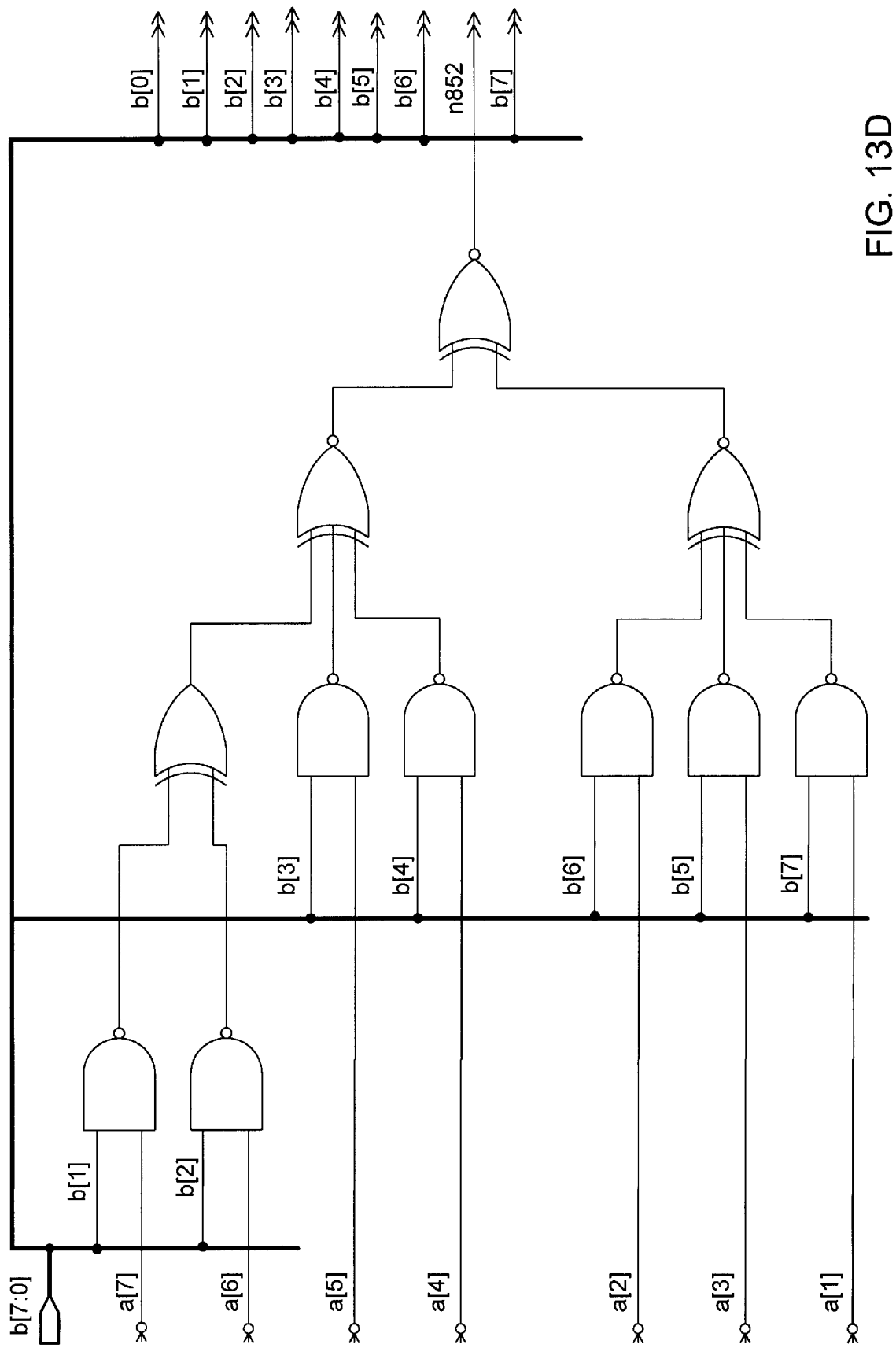
Figure 13E:
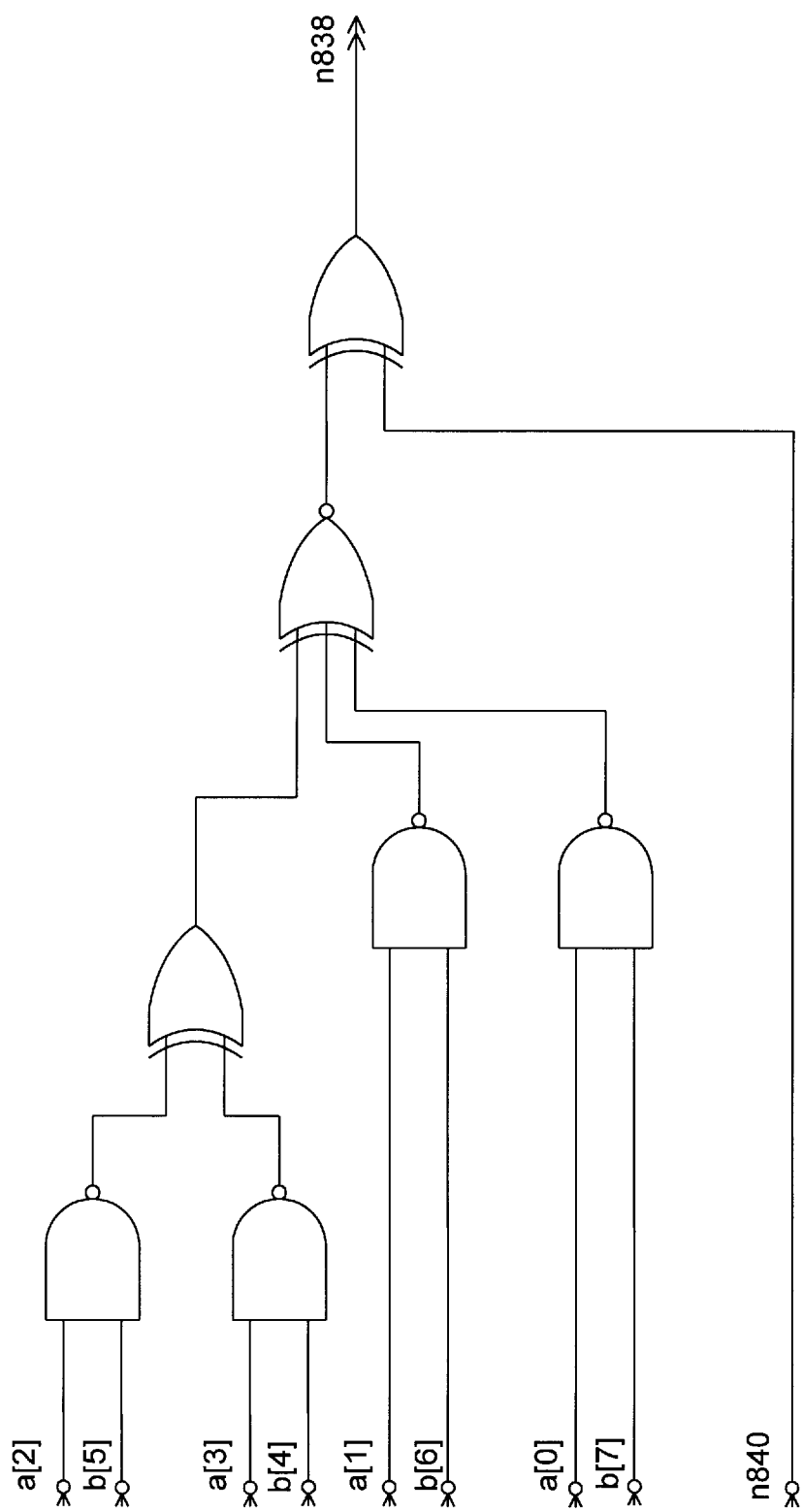
Figure 13F:
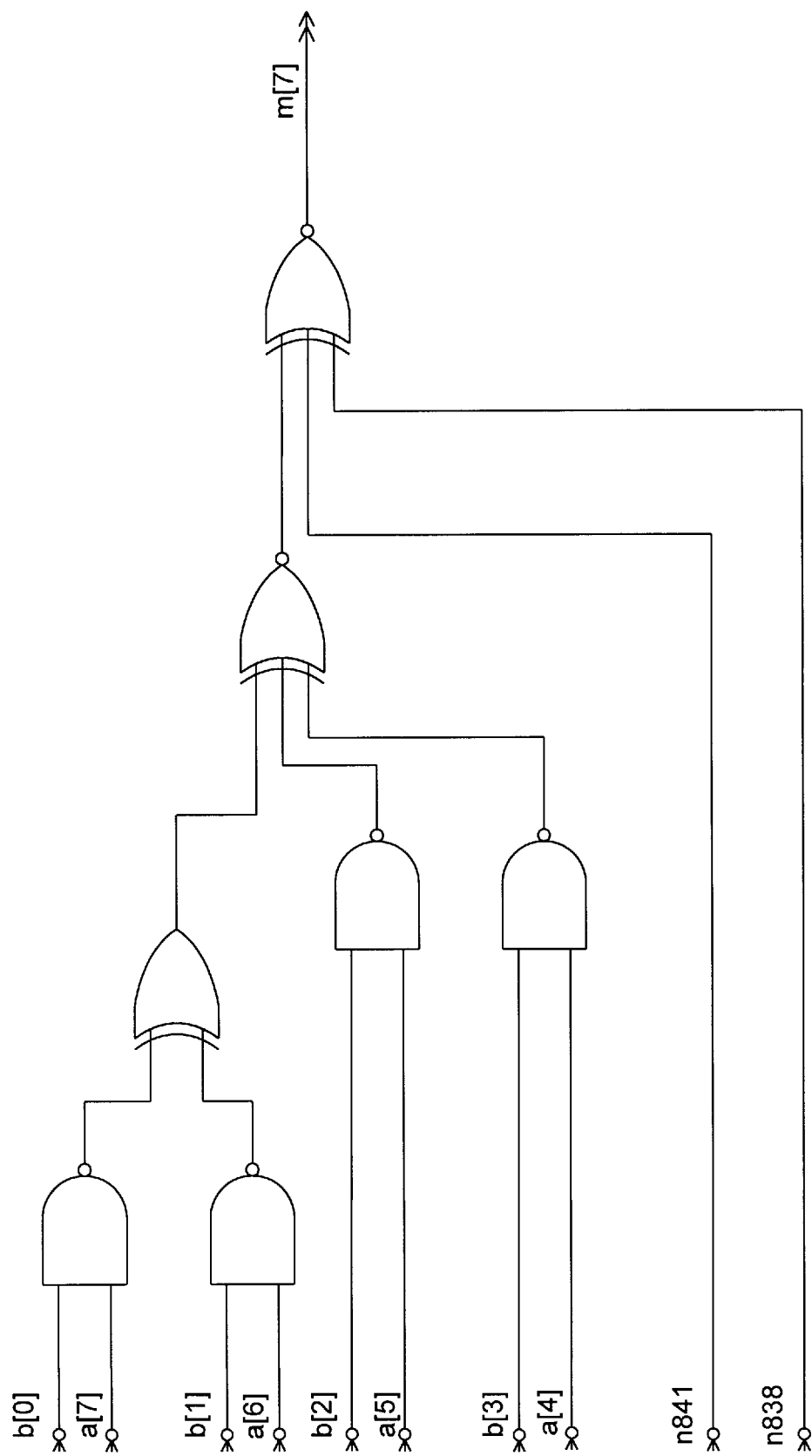
Figure 13G:
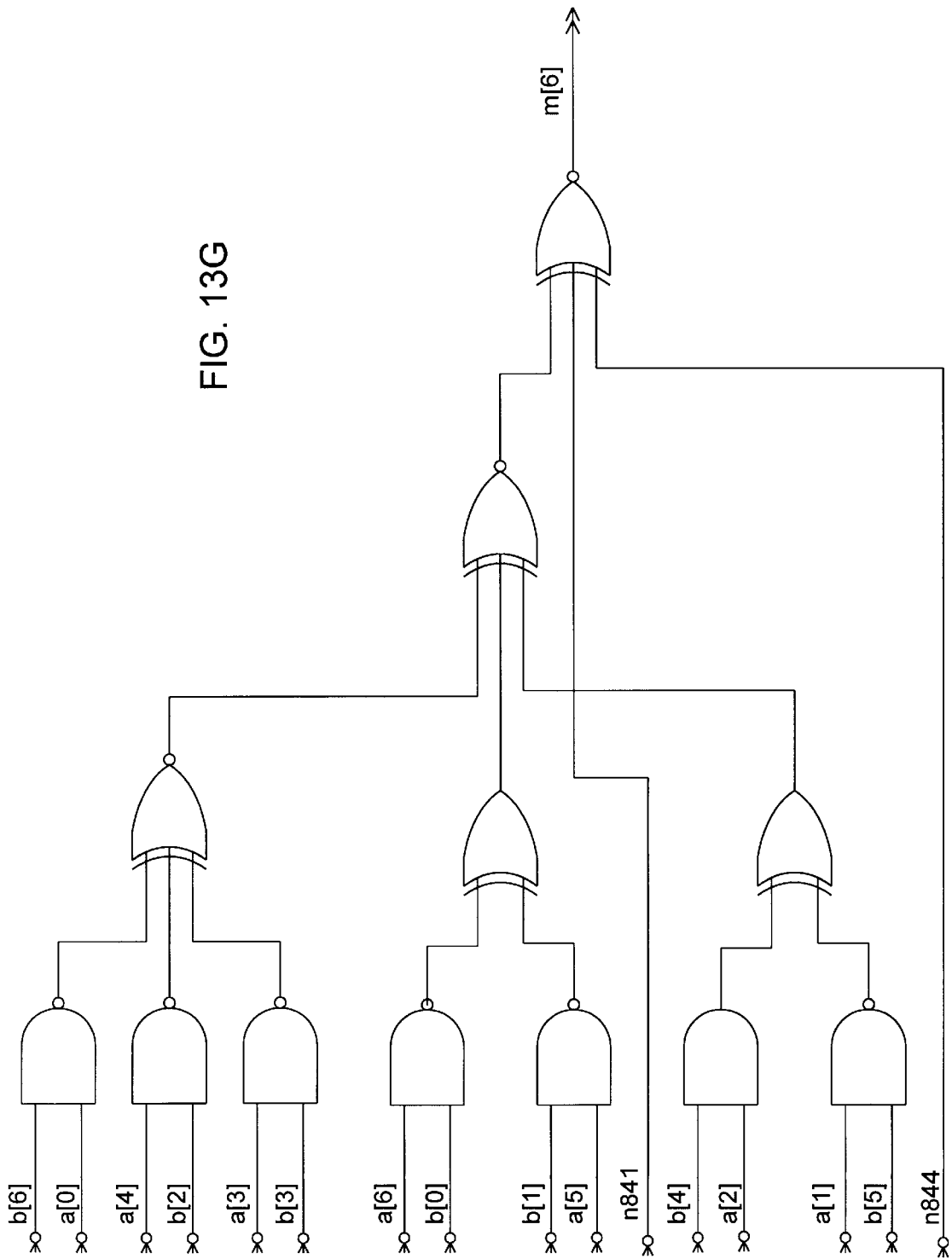
Figure 13H:
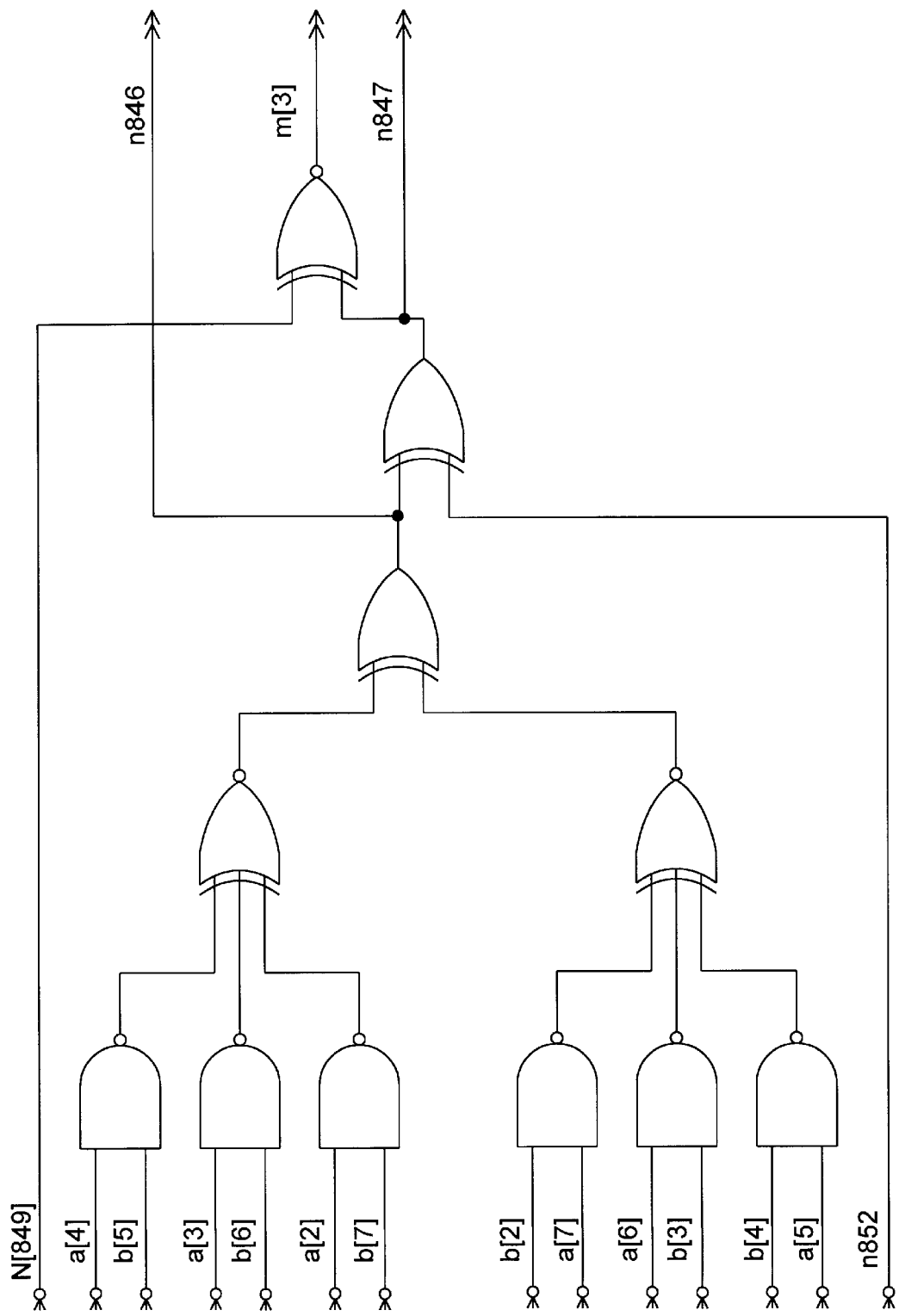
Figure 13J:
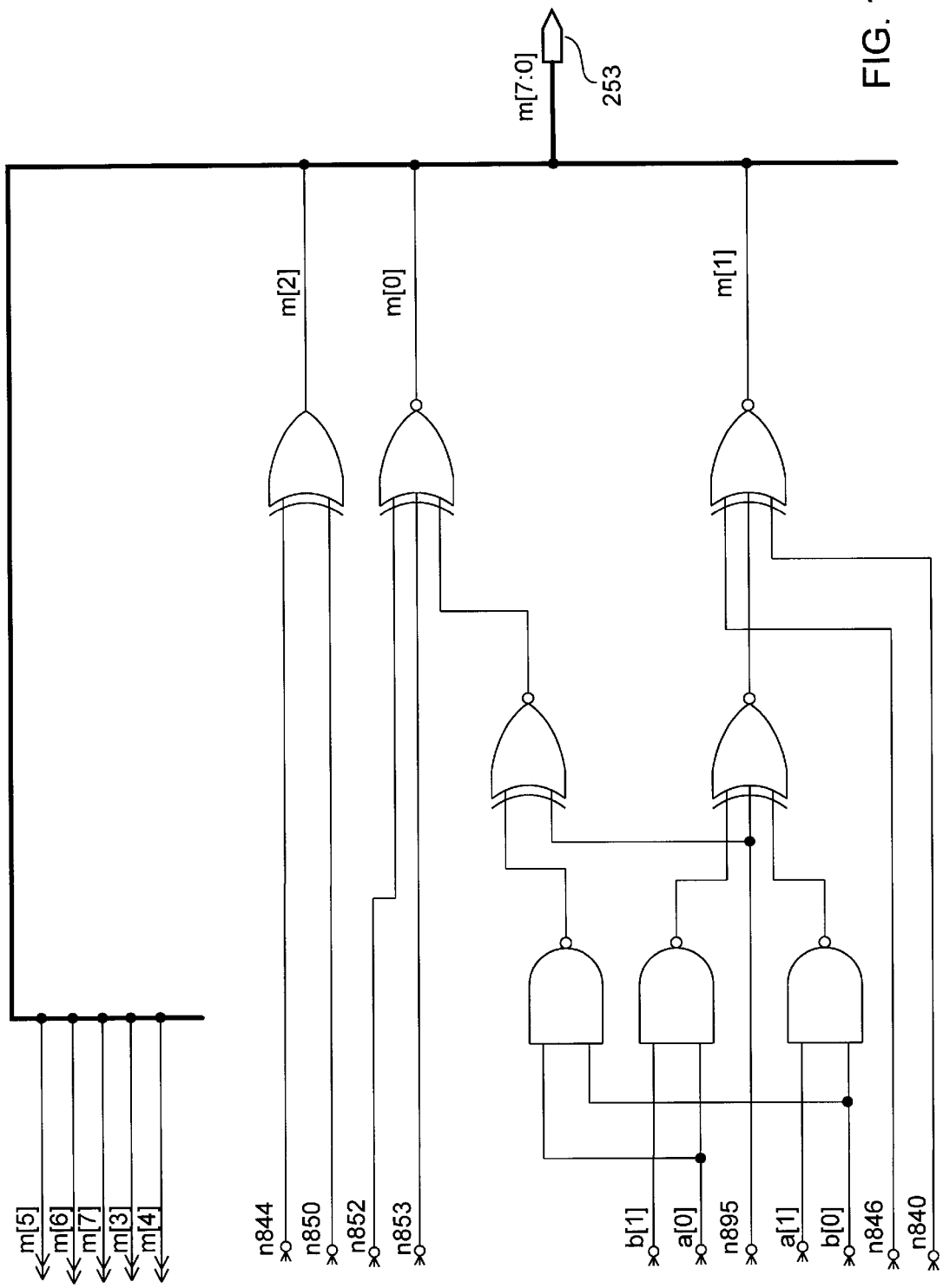
Figure 13K:
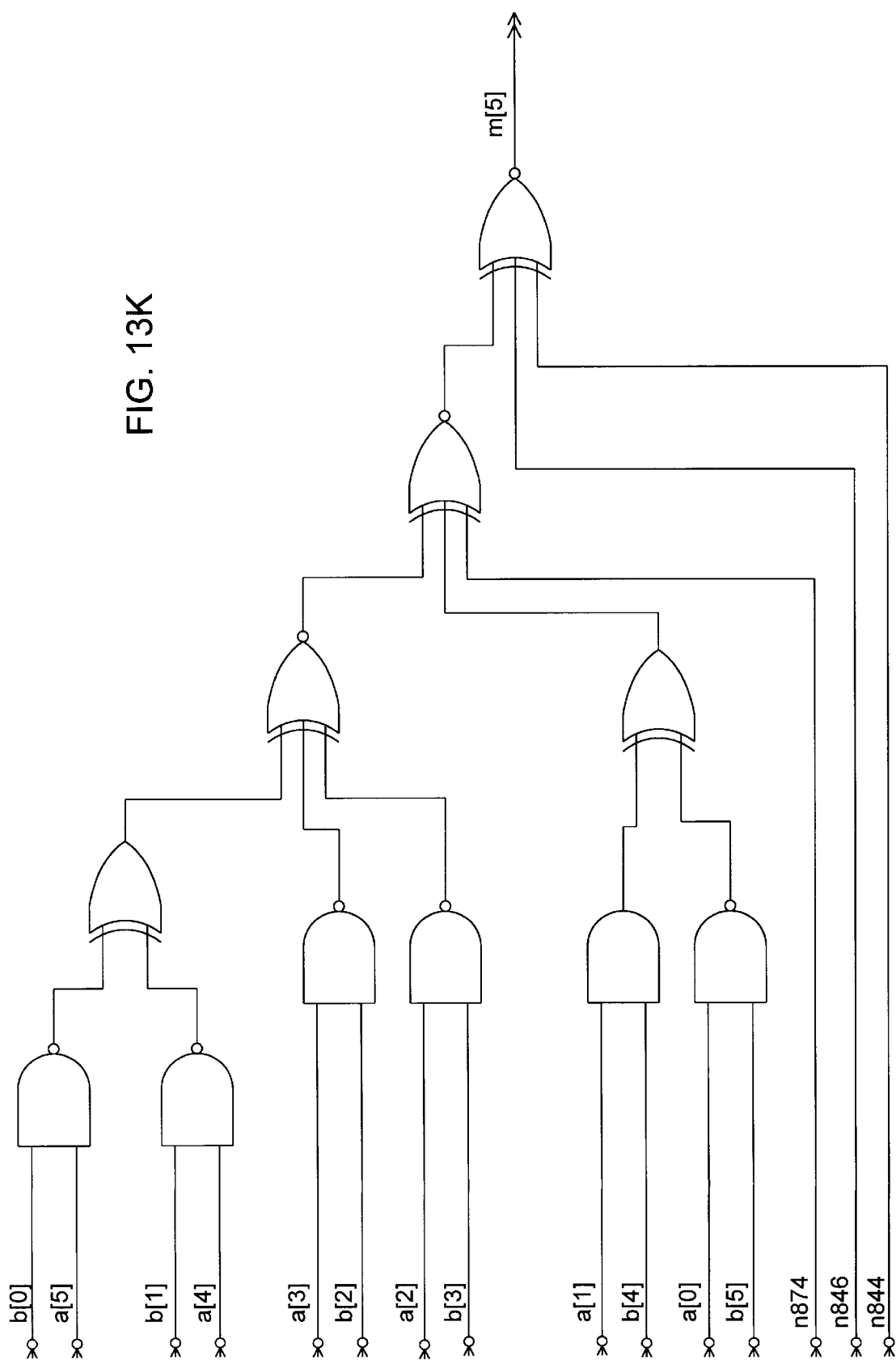

Referring to FIGS. 13A–13K, a preferred embodiment of the Galois Field multiplier 252 discussed above in relation to FIGS. 6A and 6B is illustrated in a combinatorial logic array. As described above in relation to FIGS. 6A and 6B, the input to the Galois Field multiplier 252 are provided along lines 249 (as shown in FIG. 13A) and 251 (as shown in FIG. 13D). The Galois Field multiplier 252, more particularly, is provided as an array of interconnected NAND gates 500, AND gates 502, XOR (exclusive-OR) gates 504 and XNOR (exclusive-NOR) gates 506 as shown in FIG. 13A. The inputs provided along lines 249 and 251 are propagated through the combinatorial logic array, as shown in FIGS. 13A–13K, to provide an output along line 253, as shown in FIG. 13J.

The combinatorial logic array provides single step finite field multiplication operations within the Galois Field multiplier 252 during execution of the instructions during a single clock cycle. The combinatorial logic array comprises a plurality of unclocked binary logic gates coupled in a combinatorial relationship defined by said finite field wherein the combinatorial logic array performs said multiplication operation in a time period equal to the propagation delay of said logic gates.

The combinatorial logic array as shown in FIGS. 13A–13K was generated from the Verilog code listed in Appendix D using a Synopsys (TM) compiler. Synopsys (TM) is an HDL compiler for use with Verilog code which may be used to generate a logic array from Verilog code.

Figure 14A:
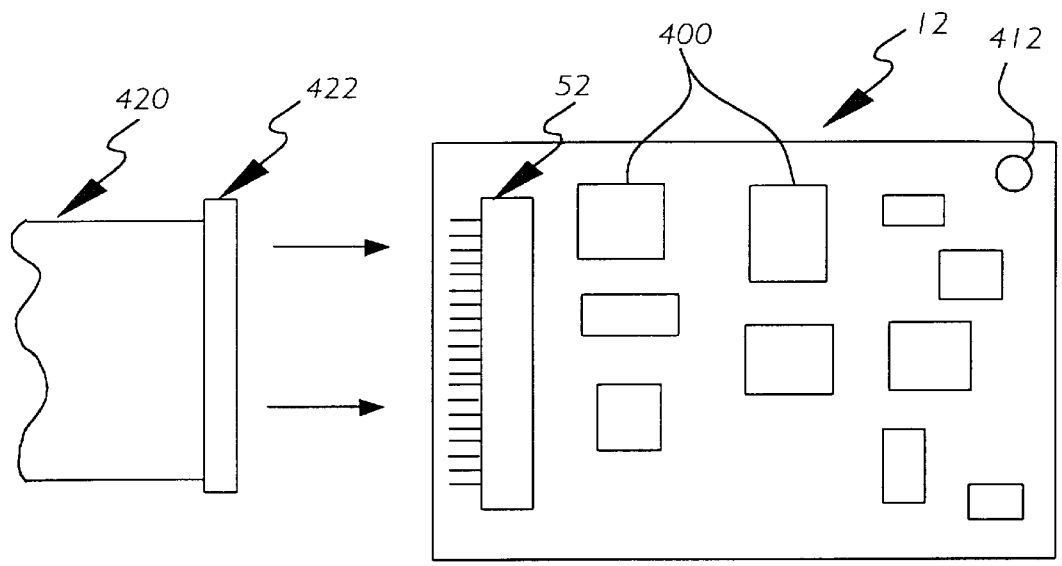
FIG. 14A is a bottom view and FIG. 14B is an end view of a printed circuit board, incorporating the disk drive controller circuitry of FIG. 2 and mounted to the head disk assembly of the disk drive, in accordance with a preferred embodiment of the present invention.
Figure 14B:
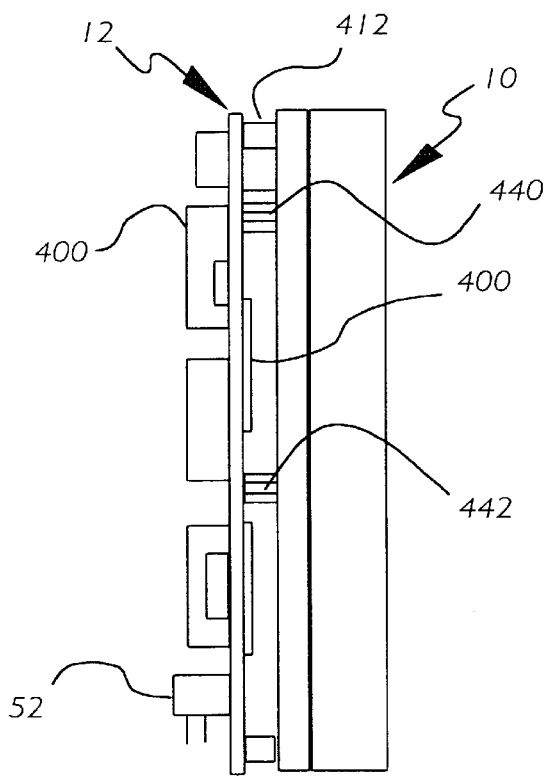

The disk drive controller circuitry is preferably contained in a number of integrated circuits 400 which are schematically illustrated in FIGS. 14A and 14B. As best shown in the end view of FIG. 14B, the circuit board 12 may preferably be a double sided circuit board allowing for a more compact configuration of the integrated assembly. As also shown in FIG. 14B, the printed circuit board 12 is preferably affixed to head disk assembly (HDA) 10. For example, the printed circuit board 12 may be affixed to HDA 10 through screws 412 which are received in matching threaded openings in HDA 10. Alternatively, the circuit board 12 may be affixed to HDA 10 through adhesive bonding, press snap fitting, or other well known techniques.

As further shown in FIGS. 14A and 14B, the printed circuit board 12 includes two sets of electrical connections. More specifically, printed circuit board 12 includes a host interface connector 52 which may include a standardized multi-pin connector such as the currently preferred 40-pin ATA compatible connector. As generally shown in FIG. 14A, the connector 52 interfaces with a matching host connector cable 422 which couples to the host computer I/O bus or I/O bus adapter. Alternatively, host interface connector 52 may directly attach to a matching connector within the host without a cable.

As further illustrated in FIG. 14B, the printed circuit board 12 also includes a second connector, for example in the form of a flex cable 440 coupling the circuit board to the interior of the HDA 10, in the manner discussed in more detail below. Additionally, a separate spindle motor flex connection may also be provided as illustrated as 442 in FIG. 14B. Detachable connectors may also be employed in place of flex cables 440, 442. Suitable connectors are disclosed in copending application Ser. No. 08/119,023, filed Sep. 9, 1993, the disclosure of which is incorporated herein by reference. Preferably the flex cables 440 and 442 or connectors are connected and assembled when the circuit board 12 is affixed to the HDA 10 during manufacture of the disk drive. Optionally the circuit board 12 may be separately provided or assembled by OEMs or users in which case flex cable 440 and spindle connection 442 may be terminated with a suitable connector for attaching to a commercially available HDA.

In an alternate embodiment, the printed circuit board 12 illustrated in FIG. 14A may be dispensed with and the various integrated circuits 400 mounted on a host computer system motherboard. In either case, HDA 10 may be provided with a suitable connector and, optionally, guide rails to allow a removable HDA capability.

While the foregoing description of the present invention has been in relation to presently preferred embodiments of the disk drive and associated methods of operation, it will be appreciated by those skilled in the art that the illustrated embodiments are possible of a wide variety of modifications without departing from the scope of the present invention. Accordingly, the illustrated embodiments should not be viewed as limiting but purely illustrative in nature.

GLOSSARY

The following definitions of terminology employed in the present application are generally believed to be consistent with the usage in the art. However, to the extent such definitions are inconsistent with such usage, the following should govern herein. Also, to the extent the foregoing description of the preferred embodiment of the present invention may be susceptible to a different or narrower interpretation for the following terms, the below definitions should govern for the following claims.

actuator—The electromechanical component or assembly which moves the read/write head(s) to different radial locations on the data storage disks.

appending the LBA to the user data—The LBA is not limited to being appended to the user data at the beginning or end of the user data. The LBA may be inserted into any known location in the interleaved data structure and as used herein the term "appending" includes any such insertion.

bit frequency (or channel frequency 1/T)—the inverse of the channel bit period T;

channel bit period (T)—also called code bit period—the basic channel time period which corresponds to the time which the read/write transducer head is over a storage cell.

cyclic redundancy check (CRC)—error detection check symbols which are appended to user data or servo data written on the data storage disks to detect errors in the data read back therefrom.

combinatorial logic—a form of logic in which the output states depend on the input states, but on no other factor.

data region—portion of a disk surface between two consecutive servo regions; may include one or more data sectors or a nonintegral number of data sectors.

data read channel—electrical signal path from the read transducer head to an output decoded binary data signal and clock signal.

data sector—portion of a track having fixed number of bytes of user data written therein; currently typically 512 bytes or 1024 bytes.

disk drive—a rotating magnetic disk data storage device or a rotating optical disk data storage device.

error correction code (ECC)—check symbols which are appended to user data or servo data written on the data storage disks to allow detection and correction of errors in the data read back therefrom.

error detection code (EDC)—check symbols which are appended to user data or servo data written on the data storage disks to allow detection of errors in the data read back therefrom.

execution cycle—the basic time period for execution of a single instruction. An execution cycle may be performed in one or more clock cycles.

Galois field (GF)—another term for finite field as conventionally defined in mathematics.

hardware syndrome (EDC and ECC)—The terms software and hardware are applied for additional convenience to distinguish the syndromes generated by the error corrector 134 from the syndromes generated by the check symbol/syndrome generator 130. The terms software and hardware do not limit apparatus or method by which the syndromes may be generated. The C/S generator 130 generates hardware ECC and EDC syndromes.

head disk assembly (HDA)—the components of the disk drive located within the disk drive housing, including the housing itself.

instruction execution time—the entire time for execution of an instruction, including decoding, operand fetch and execution of the operand(s). May include multiple execution cycles.

NRZ (Non-Return to Zero)—the coding system where a binary 1 is represented by a 1st level or state and a binary 0 by a second level or state.

parallel execution—performing two or more operations in a single execution cycle. Thus parallel execution includes performing two operations at the same time in separate hardware.

Read/Write transducer—the transducer(s) which read and write data to and from the data storage disks—the read and write heads need not be of the same type; for example, a read head which is magnetoresistive in operation may be combined with a write head which is inductive in operation.

RLL (Run Length Limited) coding—a form of coding which restricts the minimum and maximum number of binary zeros between binary ones.

serial execution—performing two operations serially within a single execution cycle, for example, using time division multiplexing of a single execution unit.

software syndrome (EDC and ECC)—The terms software and hardware are applied for additional convenience to distinguish the syndromes generated by the error corrector 134 from the syndromes generated by the check symbol/syndrome generator 130. The terms software and hardware do not limit apparatus or method by which the syndromes may be generated. The error corrector 134 generates software ECC and EDC syndromes.

servo bursts—analog track centering information recorded in the servo region.

servo data—data recorded in a servo region including track ID information.

servo region—a portion of a data storage disk surface including servo information; such servo information may include servo data and servo bursts; multiple servo regions may be provided on a track.

servo sector—a portion of a data track corresponding to a single servo region.

spindle motor—the motor which rotates the magnetic disks, typically at a fixed angular velocity.

storage cell—the portion of a track having the smallest magnetization pattern.

track—a linear recording region on the disk surface which extends in a arc through an angular range of 360 degrees; each track may be a separate annular region or may be a 360 degree portion of a single spiral extending from the inner portion of the disk surface to the outer diameter.

APPENDIX A

Microcode Instruction Definitions

| INSTRUCTION | DESCRIPTION | FORMAT |
|---|---|---|
| NOP | No Operation. | 0,0000,0XXX,XXXX,XXXX |
| AND D | Logical "AND": Perform "AND" operation between the Accumulator and the contents of the register addressed by the value D and store the result in the Accumulator. (ACC = ACC AND D) | 0,1000,000M,DDDD,DDDD |
| OR D | Logical "OR": Perform "OR" operation between the Accumulator and the contents of the register addressed by the value D and store the result in the Accumulator. (ACC = ACC OR D) | 0,1000,001M,DDDD,DDDD |
| XOR D | Logical "Exclusive-OR": Perform "Exclusive-OR" operation between the Accumulator and the contents of the register addressed by the value D and store the result in the Accumulator. (ACC = ACC XOR D) | 0,1000,010M,DDDD,DDDD |
| SLT D | Set Less Than: If the contents of the Accumulator is less than the contents of the register located at the address of the value D, then the accumulator is loaded with "01" hex. Otherwise, load the Accumulator with "00" hex. (if (ACC<D) then ACC=1; else ACC=0) | 0,1011,XXXM,DDDD,DDDD |
| ADD D | Arithmetic Addition: Add the contents of the Accumulator and the contents of the register addressed by the value D and store the result in the Accumulator. (ACC = ACC + D) | 0,1010,XXXM,DDDD,DDDD |

| INSTRUCTION | DESCRIPTION | FORMAT |
|---|---|---|
| SUB D | Arithmetic Subtraction: Subtract from the contents of the Accumulator the value of the register addressed by the value D and store the result in the Accumulator. (ACC = ACC - D) | 0,1001,XXXM,DDDD,DDDD |
| LDA D | Load Accumulator: Load the Accumulator with the contents of the register addressed by the value D. (ACC = D) | 0,1000,011M,DDDD,DDDD |
| LDGA D | Load Galois Field Accumulator: Load the Accumulator of the GFMAC with the contents of the register addressed by the value D. (GFA = D) | 0,1000,100X,DDDD,DDDD |
| LDGP D | Load Galois Field Product Register: Load the Product register of the GFMAC with the contents of the register addressed by the value D. (GFP = D) | 0,1000,101X,DDDD,DDDD |
| LTD1 D | Load Temporary Register 1: Load the temporary register 1 with the contents of the register addressed by the value D. (TEMP REG1 = D) | 0,1000,110X,DDDD,DDDD |
| LDT2 D | Load Temporary Register 2: Load the temporary register 2 with the contents of the register addressed by the value D. (TEMP REG2 = D) | 0,1000,111X,DDDD,DDDD |
| GFDI D,#E | De-interleaved: Multiply (in binary) the contents of the register addressed by the value D by "three" and add (in binary) the product to the immediate value E, then store the result in the GFMAC Accumulator. (GFA= 9 MSB OF (3*D + E) (D = OFFSET, E = INTERLEAVE #)) | 0,11XX,XXEE,DDDD,DDDD |

| INSTRUCTION | DESCRIPTION | FORMAT |
|---|---|---|
| STA D | Store Accumulator: Store the contents of the Accumulator to the register addressed by the value D. (D = ACC) | 0,0010,00XX,XDDD,DDDD |
| STGA D | Store Galois Field Accumulator: Store the contents of the GFMAC Accumulator to the register addressed by the value D. (D = GFA) | 0,0010,01XX,XDDD,DDDD |
| STGP D | Store Galois Field Product Register: Store the contents of the GFMAC Product register to the register addressed by the value D. (D = GFP) | 0,0010,10XX,XDDD,DDDD |
| STT1 D | Store Temporary Register 1: Store the contents of temporary register 1 to the register addressed by the value D. (D = TEMP REG1) | 0,0010,11XX,XDDD,DDDD |
| STT2 D | Store Temporary Register 2: Store the contents of temporary register 2 to the register addressed by the value D. (D = TEMP REG2) | 0,0011,00XX,XDDD,DDDD |
| LSHL | Logical Shift Left: Shift the contents of the Accumulator left by 1 bit position and store the result back to the Accumulator. (C<-ACC.7 <-ACC.6-- ACC.0<-0 (shift by 1 bit)) | 0,0001,00XX,XXXX,XXXX |
| GFLA #E | ROM Table Look-up: Add the immediate value E to the contents of the GFMAC Accumulator to generate the ROM table look-up address. The result is stored in the two temporary registers with the low byte of the ROM word stored in temporary register 1, and the high byte stored in the temporary register 2. (E = ECC Table #) | 0,0000,1EEE,XXXX,XXXX |

110

| INSTRUCTION | DESCRIPTION | FORMAT |
|---|---|---|
| GFLD | No operation. | 0,0000,0XXX,XXXX,XXXX |
| HALT | Load the program counter with the "initialized" address. (PC = Originally initialized address, all phases disabled) | 0,0001,1XXX,XXXX,XXXX |
| RET | Return: The program counter is loaded with the return address from the contents of the stack register, and the stack pointer is decremented by two. (PC=(SPTR, SPTR-1), SPTR = SPTR-2) | 0,0001,01XX,XXXX,XXXX |
| JMP #A | Jump: The program counter is loaded with the immediate value A. (PC = #A) | 0,0111,AAAA,AAAA,AAAA |
| JMPT #A | Jump on True: If the contents of the accumulator is NOT "zero", then load the program counter with the immediate value A, otherwise increment the program counter to the next instruction. (If (ZeroFlag=0) then PC = #A; else PC = PC+1) | 0,0101,AAAA,AAAA,AAAA |
| JMPF #A | Jump on False: If the contents of the Accumulator is "zero", then load the program counter with the immediate value A, otherwise increment the program counter to the next instruction. (If (ZeroFlag=1) then PC = #A; else PC = PC+1) | 0,0110,AAAA,AAAA,AAAA |

| INSTRUCTION | DESCRIPTION | FORMAT |
|---|---|---|
| CALLF #A | Call on False: If the contents of the Accumulator is "zero", then the stack register is loaded with the current program counter plus two, the stack pointer is incremented by two, and the program counter is loaded with the immediate value A. (If (ZeroFlag=1) then {SPTR, SPTR-1} = PC+2, PC = #A, SPTR = SPTR+2; else PC = PC+1) | 0,0100,AAAA,AAAA,AAAA |
| GFMLT D,E | Galois Field Multiply: Multiply over GF(2^8) between the contents of two registers addressed by the value D and E respectively, is store the product in the product register (GFP) in the GFMAC. (GFP = D * E (Galois field multiply)) | 1,11EE,EEEE,EDDD,DDDD |
| GFMAC D,E | Galois Field Multiply and Accumulate: The product over GF(2^8) of the contents of the two registers addressed by the value D and E is stored in the product register (GFP) in the GFMAC, and the previous product is accumulated to the GFMAC Accumulator (GFA). (GFP = D * E; GFA = GFA + GFP(-1) Galois Field multiply and accumulate previous product) | 1,01EE,EEEE,EDDD,DDDD |
| GFMLD D,E | Galois Field Multiply and Load: The product over GF(2^8) of the contents of the two registers addressed by the value D and E is stored in the product register (GFP) in the GFMAC, and the previous product is loaded to the GFMAC Accumulator (GFA). (GFP = D * E; GFA = GFP(-1) Galois Field multiply and load previous product) | 1,10EE,EEEE,EDDD,DDDD |

| INSTRUCTION | DESCRIPTION | FORMAT |
|---|---|---|
| GFADD D,E | Galois Field Add: The sum over GF(2^8) of the contents of the two registers addressed by the value D and E are stored in the GFMAC Accumulator. (GFA = D + E (Galois field ADD)) | 1,00EE,EEEE,EDDD,DDDD |

APPENDIX B
Microcode Listings

;*******************************************************************************
; TOP_ECC - Top level ecc microcode
;
; On entry -
;         S01, S02, S03, S04, S05, S06 = syndromes for the 1st interleave
;         S11, S12, S13, S14, S15, S16 = syndromes for the 2nd interleave
;         S31, S32, S33, S34, S35, S36 = syndromes for the 3rd interleave
;         ES0, ES1, ES2, ES3 = extended field syndromes
;
; On exit -
;         GFSTAT[3] = uncorr flag
;         GFSTAT[5] = LBA error flag
;         offsets and masks loaded in buffer interface port
;         LBA and error conts in uP interface registers
;
;
;*******************************************************************************
;
include "regdef2.h"
;
        org     504h
;
        NOP
        LDA     #0
        STA     GFSTAT          ; clear GFSTAT
        STA     REG2D           ; clear REG2D
        STA     INTLV           ; clear INTLV'
        LDA     #179
        STA     REG2B
;
ILOOP:
        LDA #0
        CALLF ELP_GEN
        NOP
        LDA REG2D
        AND #80h
        JMPT CLR_REG            ; jump if no error
        NOP
;
        CALLF FACTOR
        NOP
        LDA REG2D
        AND #8
        JMPT LDSTAT             ; jump if uncorr = 1
        NOP
;
        LDA #2
        SLT REG2A
        JMPF LABEL_SF
        NOP
        CALLF CHK_SYND
        NOP
        LDA REG2D
        AND #8
        JMPT LDSTAT             ; jump if uncorr = 1
        NOP
;
LABEL_SF:
        CALLF SF_CV
        NOP

```
;
INCINTLV:
        LDA #178
        STA REG2B
        LDA INTLV              ; increase interleave number
        ADD #1
        STA INTLV
        XOR #3                 ; interleave = 3?
        JMPT ILOOP             ; if not, do correction
        NOP CALLF SF_SCHK          ; else, do extended field syndrome check
        NOP
        LDA REG2D
        AND #8
        JMPT LDSTAT            ; jump if uncorr = 1
        NOP
;
        CALLF PREP_BC
        NOP
;
LDSTAT:
        LDA REG2D
        STA GFSTAT
;
SLEEP:
        HALT
        NOP
;
;
;
; clear locations used for subfield offset/mask computation
;
CLR_REG:
        LDA INTLV              ; interleave = 0?
        JMPF CLR_I0            ; if yes, jump to CLR_I0
        NOP
        SUB #1
        JMPF CLR_I1            ; if interleave = 1, jump to CLR_I1
        NOP
        LDA #0                 ; else, clear locations for interleave 2
        STA REG4C
        STA REG4D
        STA REG4E
        STA REG4F
        STA REG50
        STA REG51
        STA REG5E
        STA REG5F
        STA REG60
        STA REG61
        STA REG62
        STA REG63
        STA MASK20
        JMP INCINTLV
        NOP
CLR_I0:
        STA REG40
        STA REG41
        STA REG42
        STA REG43
        STA REG44
```

```
                STA REG45
                STA REG52
                STA REG53
                STA REG54
                STA REG55
                STA REG56
                STA REG57
                STA MASK00
                JMP INCINTLV
                NOP

CLR_I1:
                STA REG46
                STA REG47
                STA REG48
                STA REG49
                STA REG4A
                STA REG4B
                STA REG58
                STA REG59
                STA REG5A
                STA REG5B
                STA REG5C
                STA REG5D
                STA MASK10
                JMP INCINTLV
                NOP

;******************************************************************************
; ELP_GEN - Check if there is any error in the interleave and calculate
;           error location polynomial if error occurs
;
; On Entry:
;    S01, S02, S03, S04, S05, S06 = syndromes for the 1st interleave
;    S11, S12, S13, S14, S15, S16 = syndromes for the 2nd interleave
;    S21, S22, S23, S24, S25, S26 = syndromes for the 3rd interleave
;    INTLV = interleave # (0, 1, or 2)
;
; On Exit:
;           REG2D[7] = 1 if no error in the interleave being checked
;           REG2D[7] = 0 if error occurs in the interleave being checked
;           REG2D[3] = 1, if uncorrectable error
;           The coefficients of error location polynomial will be stored in
;           registers ELP3, ELP2, and ELP1 when exit.
;           The routine alters REG1C, REG1D, REG1E, REG1F, REG20, REG21, REG22,
;           REG23, REG2D.
;
;******************************************************************************
;
;
;
;
ELP_GEN:
;
; move syndromes
;
                LDA INTLV               ; interleave = 0?
                JMPF STARTELP           ; if yes, jump to STARTELP
                NOP
                SUB #1
                JMPF MVSD1              ; if interleave = 1, jump to MVSD1
                NOP
```

```
        LDA S21              ; else, move S2i to S0i, where i=1 to 6
        STA S01
        LDA S22
        STA S02
        LDA S23
        STA S03
        LDA S24
        STA S04
        LDA S25
        STA S05
        LDA S26
        STA S06
        JMP STARTELP
        NOP
MVSD1:
        LDA S11              ; move S1i to S0i, where i=1 to 6
        STA S01
        LDA S12
        STA S02
                LDA S13
                STA S03
                LDA S14
                STA S04
                LDA S15
                STA S05
                LDA S16
                STA S06
;
STARTELP:
;
; check if six syndromes are all zeroes
;
        LDA     S01
        OR      S02
        OR      S03
        OR      S04
        OR      S05
        OR      S06
        JMPF    #NOERR
        NOP
;
; clear ELP1, ELP2, and ELP3
;
        LDA     #0
        STA     ELP1
        STA     ELP2
        STA     ELP3
;
; Store the following terms to registers REG1C, REG1D, and REG1E, respectively
; REG1C = s2^2 + s1*s3
; REG1D = s1*s4 + s2*s3
; REG1E = s3^2 + s4*s2
;
; Note: TI's DPRAM does not allow simultaneous read from same location
;
        LDT1    S02
        GFMLT   S02, TREG1           ;GFP = S02^2
        GFMLD   S01, S03             ;GFP = S01*S03, GFA = S02^2
        GFMAC   S01, S04             ;GFP = S01*S04, GFA = S02^2 + S01*S03
        STGA    REG1C
;
        LDT2    S03
```

```
            GFMLD       S02, S03             ; GFP = S02*S03, GFA = S01*S04
            GFMAC       S03, TREG2           ; GFP = S03^2, GFA = S01*S04 + S02*S03
            STGA        REG1D
            NOP
;
            GFMLD       S04, S02             ; GFP = S04*S02, GFA = S03^2
            GFMAC       REG1C, S05           ; GFP = REG1C*S05, GFA = S03^2 + S04*S02
            STGA        REG1E
            NOP
;
;
; Compute |M3|
; |M3|    = (s2^2 + s1*s3)*S05 + (s1*s4 + s2*s3)*S04 + (s3^2 + s4*S02)*S03
;         = REG1C*S05 + REG1D*S04 + REG1E*S03
;
            GFMLD       REG1D, S04           ; GFP = REG1D*S04, GFA = REG1C*S05
            GFMAC       REG1E, S03           ; GFP = REG1E*S03, GFA = REG1C*S05 + REG1D*S04
            GFMAC       REG1E, S03           ; GFA = |M3| = REG1C*S05 + REG1D*S04 + REG1E*S03
            LDA         GFA
            JMPF        TEST_M2              ; If |M3|=0, test |M2|
            NOP
            GFLA        #0                   ; else, find inverse of |M3| by looking up table 0
            NOP
            GFLD
            STT1        REG1F                ; store look up result in REG1F
            NOP
;
; Compute s4*s3+s5*s2 and store it in register REG20
;
            GFMLT       S04, S03             ; GFP = S04*S03
            GFMLD       S05, S02             ; GFP = S05*S02, GFA = S04*S03
            GFMAC       REG1E, S06           ; GFP = REG1E*S06, GFA = S04*S03 + S05*S02
            STGA        REG20
;
; Compute Lamda3, Lamda2, and Lamda1
;
            LDT1        S04
            GFMLT       S04, TREG1           ; GFP = S04^2
            GFMLD       S05, S03             ; GFP = S05*S03, GFA = S04^2
            GFMAC       REG20, S05           ; GFP = REG20*S05, GFA = S04^2 + S05*S03
            GFMLD       S04, GFA             ; GFP = (S04^2 + S05*S03)*S04, GFA = REG20*S05
            GFMAC       REG1E, S06           ; GFP = REG1E*S06, GFA = REG20*S05 + (S04^2 +
                                               S05*S03)*S04
            GFMAC       REG1E, S06           ; GFA = REG20*S05 + (S04^2 + S05*S03)*S04 +
                                               REG1E*S06
            GFMLT       GFA, REG1F           ; GFP = Lamda3 = ( REG20*S05 + (S04^2 +
                            S05*S03)*S04 + REG1D*S06)/|M3|
            STGP        ELP3                 ; store Lamda3 in register ELP3
;
            LDT2        S03
            GFMLT       S03, TREG2           ; GFP = S03^2
            GFMLD       S05, S01             ; GFP = S05*S01, GFA = S03^2
            GFMAC       REG20, S04           ; GFP = REG20*S04, GFA = S03^2 + S05*S01
            GFMLD       GFA, S05             ; GFP = (S03^2 + S05*S01)*S05, GFA = REG20*S04
            GFMAC       REG1D, S06           ; GFP = REG1D*S06, GFA = REG20*S04 + (S03^2 +
                                               S05*S01)*S05
            GFMAC       REG1D, S06           ; GFA = REG20*S04 + (S03^2 + S05*S01)*S05 +
                                               REG1D*S06
            GFMLT       GFA, REG1F           ; GFP = Lamda2 = ( REG20*S04 + (S03^2 +
                            S05*S01)*S05 + REG1D*S06)/|M3|
            STGP        ELP2                 ; store Lamda2 in register ELP2
```

118

```
;
        GFMLT   S03, TREG2              ; GFP = S03^2
        GFMLD   S04, S02                ; GFP = S04*S02, GFA = S03^2
        GFMAC   REG1D, S05              ; GFP = REG1D*S05, GFA = S03^2 + S04*S02
        GFMLD   GFA, S04                ; GFP = (S03^2+S04*S02)*S04, GFA = REG1D*S05
        GFMAC   REG1C, S06              ; GFP = REG1C*S06, GFA = REG1D*S05 +
                                        (S03^2+S04*S02)*S04
        GFMAC   REG1C, S06              ; GFA = REG1D*S05 + (S03^2+S04*S02)*S04 +
                                        REG1C*S06
        GFMLT   GFA, REG1F              ; GFP = Lamda1 = (REG1D*S05 + (S03^2+S04*S02)*S04
                                        + REG1C*S06)/|M3|
        STGP    ELP1
;
CLRNOERR:
        LDA     REG2D
        AND     #7fh
        STA     REG2D
        NOP
        RET                             ; Exit
        NOP
        NOP
;
;
TEST_M2:
;
        STA     ELP3                    ; store 0 in ELP3
        LDA     REG1C
        JMPF    TEST_M1                 ; If |M2|=0, test |M1|
        NOP
;
; Compute Lamda2 and Lamda1
        LDGA    REG1C                   ; load |M2| from REG1C
        GFLA    #0                      ; find inverse of |M2|
        NOP
        GFLD
        GFMLT   REG1E, TREG1
        STGP    ELP2                    ; store Lamda2 in ELP2
        GFMLT   REG1D, TREG1
        STGP    ELP1                    ; store Lamda1 in ELP1
        JMP     CLRNOERR
        NOP
;
;
TEST_M1:
;
        STA     ELP2                    ; store 0 in ELP2
        LDA     S01
        JMPF    UNCORR                  ; If |M1|=0, uncorrectable
        NOP
;
; Compute Lamda1
        LDGA    S01                     ; load |M1| from S01
        GFLA    #0                      ; find inverse of |M1|
        NOP
        GFLD
        GFMLT   S02, TREG1
        STGP    ELP1                    ; store Lamda1 in ELP1
        JMP     CLRNOERR
        NOP
;
;
NOERR:
```

```
            LDA       REG2D
            OR        #80h           ; set bit 7 of REG2D if no error
            STA       REG2D
            NOP
            RET
            NOP
            NOP ;**********************************************************************
; FACTOR -
;         calculating offsets and masks, and checking if offsets are
;         within proper range
;
; On entry -
;         S01, S02, S03, S04, S05, S06
;         ELP3, ELP2, ELP1
; On exit -
;         ROOT0, ROOT1, ROOT2
;         OFFSETs and MASKs
;         REG2D
;         REG2A: error count for the ongoing interleave
;**********************************************************************

FACTOR:

; compute and store common terms
; REG20 = S01 + ELP1
; REG21 = S02 + S01*ELP1 + ELP2
; REG1F = 1/ELP1
            GFADD     S01, ELP1
            STGA      REG20
            NOP
            GFMLT     S01, ELP1
            GFADD     S02, GFP
            GFADD     GFA, ELP2
            STGA      REG21
            LDGA      ELP1
            GFLA      #0
            NOP
            GFLD
            STT1      REG1F LDA       ELP3
            JMPF      SECOND_ORD     ER      ;go to SECOND_ORDER if ELP3=0
            NOP
            LDA       ELP1
            GFMLT     ELP1, ACC
            GFADD     ELP2, GFP;
            STGA      REG1C                  ;REG1C=ELP2+ELP1^2
            LDA       GFA
            JMPF      CUBE2                  ;if REG1C=0, goto CUBE2
            NOP
            GFLA      #1                     ;take square root of REG1C
            NOP
            GFLD                             ;TREG1=square root of REG1C
            GFMLT     REG1C, TREG1   ;GFP = REG1C*TREG1=(ELP2+ELP1^2)^(3/2)
            STT1      REG1D                  ;REG1D=sqrt of (REG1C=ELP2+ELP1^2)
            LDGA      GFP
            GFLA      #0
            NOP
            GFLD                             ; TREG1 = inverse of (ELP2+ELP1^2)^(3/2)
            GFMLT     ELP1, ELP2
```

```
                GFADD         ELP3, GFP                ; GFA = ELP3+(ELP1*ELP2)
                GFMLT         GFA, TREG1               ; GFP = (ELP3+(ELP1*ELP2)) / (ELP2+ELP1^2)^(3/2)

LDGA          GFP                      ;LOOKUP FOR ROOT0
                GFLA          #3                       ;
                NOP
                GFLD                                   ;TREG2 = prescaled root0, TREG1 = prescaled root1
                GFADD  TREG1, TREG2
                STGA          REG22                    ;REG22=prescaled root2

;// scaling the roots and checking if any root is zero

GFMLT   REG1D, TREG2;
                GFADD   GFP, ELP1                ;GFA=ELP1+TREG2*(ELP2+ELP1^2)^(1/2)
                STGA          ROOT0;
                LDA           GFA
                JMPF          UNCORR            ;if ROOT0=0, goto uncorrectable subroutine
                NOP
                GFMLT REG1D, TREG1;
                GFADD GFP, ELP1;                 GFA=ELP1+TREG1*(ELP2+ELP1^2)^(1/2)
                STGA ROOT1;
                LDA GFA
                JMPF UNCORR;           if ROOT1=0, goto uncorrectable subroutine
                NOP
                GFMLT REG1D, REG22;
                GFADD GFP, ELP1;                 GFA=ELP1+REG22*(ELP2+ELP1^2)^(1/2)
                STGA ROOT2;
                LDA GFA
                JMPF UNCORR;           if ROOT2=0, goto uncorrectable subroutine
                NOP
                JMP CALOFFSET;          goto offset calculation
                NOP

CUBE2:

LDGA REG1E               ;REG1E=ELP3+(ELP1*ELP2)
                GFLA #2            ;LOOKUP FOR ROOT0
                NOP
                GFLD                     ;TREG2 = prescaled root0
                LDGA REG1E               ;LOOKUP FOR ROOT1
                GFLA #2          ;
                NOP
                GFLD                     ;TREG1 = prescaled root1
                GFADD TREG1, TREG2
                STGA REG22               ; REG22=prescaled root2

;// scaling the roots and checking if any root is zero

GFADD ELP1, TREG2;       GFA=ELP1+TREG2
                STGA ROOT0;
                LDA GFA
                JMPF UNCORR;             if ROOT0=0, goto uncorrectable subroutine
                NOP
                GFADD TREG1, ELP1                       ;GFA=ELP1+TREG1
                STGA ROOT1;
                LDA GFA
                JMPF UNCORR;             if ROOT1=0, goto uncorrectable subroutine
                NOP
                GFADD REG22, ELP1                       ;GFA=ELP1+REG22
                STGA ROOT2;
                LDA GFA
                JMPF UNCORR;             if ROOT2=0, goto uncorrectable subroutine
```

121

```
            NOP

CALOFFSET:
        LDGA ROOT0;             lookup for log of root0
        GFLA #0;
        NOP
        GFLD ;
        STT2 OFFSET20;          OFFSET20 = error location 0
        LDA     REG2B
        SUB     OFFSET20
        STA     OFFSET20

LDGA ROOT1;             lookup for log of root1
        GFLA #0;
        NOP
        GFLD ;
        STT2 OFFSET21;      OFFSET21 = error location 1
        LDA     REG2B
        SUB     OFFSET21
        STA     OFFSET21

LDGA ROOT2;             lookup for log of root2
        GFLA #0;
        NOP
        GFLD ;
        STT2 OFFSET22;          OFFSET22 = error location 2
        LDA     REG2B
        SUB     OFFSET22
        STA     OFFSET22

;// start FORNEY algorithm for t = 3

LDGA          S03;              GFA=S03
        GFMLT   S02, ELP1;      GFP=S02*ELP1
        GFMAC   S01, ELP2;      GFP=S01*ELP2, GFA=S03+(S02*ELP1)
        GFMAC   S01, ELP1;      GFP=S01*ELP1, GFA=S03+(S02*ELP1)+(S01*ELP2)
        GFADD   GFA, ELP3;
        STGA          REG1E;            REG1E=S03+(S02*ELP1)+(S01*ELP2)+ELP3
        LDA     ROOT0
        GFMLT   ROOT0, ACC;
        STGP          REG23;            REG23=ROOT0^2
        GFMLT   REG20, GFP      ;       GFP=(S01+ELP1)*ROOT^2
        GFMLD   ROOT0, REG23;   GFP=ROOT0^3, GFA=(S01+ELP1)*ROOT0^2
        GFMAC   REG21, ROOT0;   GFP=(S02+(S01*ELP1)+ELP2)*ROOT0
                                        ;GFA=(S01+ELP1)*ROOT0^2+ROOT0^3
        GFMAC   REG23, ELP1     ; GFP=ELP1*ROOT0^2
                                        ;GFA=(S01+ELP1)*ROOT0^2+ROOT0^3+
                                        ; (S02+(S01*ELP1)+ELP2)*ROOT0
        GFADD   GFA, REG1E;
        STGA          REG24             ;REG24=(S01+ELP1)*ROOT0^2+ROOT0^3+S03+(S02*ELP1)+
                                        ;(S01*ELP2)+ELP3+(S02+(S01*ELP1)+ELP2)*ROOT0
        GFADD   ELP3, GFP
        GFLA          #0;
        NOP
        GFLD
        GFMLT   REG24, TREG1;
        STGP          MASK20     ; MASK20=error magnitude 0

LDA           ROOT1
        GFMLT   ROOT1, ACC;
        STGP REG23;             REG23=ROOT1^2
```

```
        GFMLT REG20, GFP         ;         GFP=(S01+ELP1)*ROOT1^2
        GFMLD ROOT1, REG23;      GFP=ROOT1^3, GFA=(S01+ELP1)*ROOT1^2
        GFMAC REG21, ROOT1;      GFP=(S02+(S01*ELP1)+ELP2)*ROOT1, GFA=ROOT1^3+REG20*ROOT1^2
        GFMAC REG23, ELP1                ; GFP=ELP1*ROOT1^2,
                                 ; GFA=(S01+ELP1)*ROOT1^2+ROOT1^3+
                                 ; (S02+(S01*ELP1)+ELP2)*ROOT1
        GFADD GFA, REG1E;
        STGA REG24               ;
REG24=(S01+ELP1)*ROOT1^2+ROOT1^3+S03+(S02*ELP1)+                        ;
(S01*ELP2)+ELP3+(S02+(S01*ELP1)+ELP2)*ROOT1
        GFADD ELP3, GFP
        GFLA #0;
        NOP
        GFLD ;
        GFMLT REG24, TREG1;
        STGP MASK21              ;MASK21=error magnitude 1

LDA    ROOT2
        GFMLT ROOT2, ACC;
        STGP REG23;              REG23=ROOT2^2
        GFMLT REG20, GFP         ;         GFP=(S01+ELP1)*ROOT2^2
        GFMLD ROOT2, REG23;      GFP=ROOT2^3, GFA=(S01+ELP1)*ROOT2^2
        GFMAC REG21, ROOT2;      GFP=(S02+(S01*ELP1)+ELP2)*ROOT2
        GFMAC REG23, ELP1                ; GFP=ELP1*ROOT2^2,
                                 ; GFA=(S01+ELP1)*ROOT2^2+ROOT2^3+
                                 ; (S02+(S01*ELP1)+ELP2)*ROOT2

GFADD GFA, REG1E;
        STGA REG24               ;REG24=(S01+ELP1)*ROOT2^2+ROOT2^3+S03+(S02*ELP1)+
                                 ; (S01*ELP2)+ELP3+(S02+(S01*ELP1)+ELP2)*ROOT2

GFADD ELP3, GFP
        GFLA #0;
        NOP
        GFLD ;
        GFMLT REG24, TREG1;
        STGP MASK22              ; MASK22=error magnitude 2

LDA    #3
        STA    REG2A
        NOP

RET
        NOP
        NOP

SECOND_ORDER:
        LDA ELP2
        JMPF FIRST_ORDER;
        NOP
        LDA ELP1
        JMPF UNCORR;
        NOP
        LDA    ELP1
        GFMLT ELP1, ACC;
        LDGA GFP;
        GFLA #0;
        NOP
        GFLD ;                   TREG1=1/(ELP1^2)
        GFMLT ELP2, TREG1             ;GFP=ELP2/(ELP1^2)
        LDGA GFP;                lookup for root0
        GFLA #1;
        NOP
```

```
        GFLD ;                  TREG2 = prescaled root0
        LDA #1
        GFADD ACC, TREG2        ;GFA = prescaled root1
        GFMLT TREG2, ELP1;
        STGP ROOT0;
        GFMLT ELP1, GFA
        STGP ROOT1;
        LDA #000h;
        STA ROOT2;              clear ROOT2

LDA ROOT0
        JMPF UNCORR
        NOP
        LDGA ROOT0;             lookup for log of root0
        GFLA #0;
        NOP
        GFLD ;
        STT2 OFFSET20           ; OFFSET20 = error location 0
        LDA     REG2B
        SUB     OFFSET20
        STA     OFFSET20
        LDA ROOT1
        JMPF UNCORR
        NOP
        LDGA ROOT1; lookup for log of root1
        GFLA #0;
        NOP
        GFLD ;
        STT2 OFFSET21; OFFSET21 = error location 1
        LDA     REG2B
        SUB     OFFSET21
        STA     OFFSET21
    LDA #000h;
    STA OFFSET22;               clear OFFSET22

;// start FORNEY algorithm for t = 2

LDGA    ROOT0
    GFLA        #0
        NOP
    GFLD
    GFMLT               REG21, TREG1    ; GFP = (S02+(S01*ELP1)+ELP2)/ROOT0
        GFADD   GFP, REG20              ; GFA = S01+ELP1+(S02+(S01*ELP1)+ELP2)/ROOT0
        GFADD   GFA, ROOT0              ; GFA = ROOT0+S01+ELP1+(S02+(S01*ELP1)+ELP2)/ROOT0
    GFMLT               GFA, REG1F
        STGP            MASK20          ; MASK00 = error magnitude 0

LDGA    ROOT1
    GFLA        #0
        NOP
    GFLD
    GFMLT               REG21, TREG1    ; GFP = (S02+(S01*ELP1)+ELP2)/ROOT1
    GFADD               GFP, REG20      ; GFA = S01+ELP1+(S02+(S01*ELP1)+ELP2)/ROOT1
    GFADD               GFA, ROOT1      ; GFA = ROOT1+S01+ELP1+(S02+(S01*ELP1)+ELP2)/ROOT1
    GFMLT               GFA, REG1F
    STGP                MASK21          ; MASK01 = error magnitude 1

LDA         #000h;
    STA         MASK22          ; clear MASK22
        LDA             #2
        STA             REG2A
```

124

```
            NOP

RET
            NOP
            NOP
FIRST_ORDER:
            LDA       ELP1
            JMPF      UNCORR
            NOP
     LDGA             ELP1;    lookup for log of root0(ie. elp1)
            STA       ROOT0;           ROOT0=ELP1
     GFLA             #0
            NOP
     GFLD
            STT2      OFFSET20;  OFFSET20=error location 0
            LDA       REG2B
            SUB       OFFSET20
            STA       OFFSET20
            NOP
     GFMLT            S01, REG1F;
            STGP      MASK20;                  MASK20=error magnitude 0
            LDA       #000h;
     STA    OFFSET21;                  clear OFFSET21
     STA    OFFSET22;   clear OFFSET22
            STA       MASK21;          clear MASK21
     STA    MASK22;     clear MASK22
            LDA       #1
            STA       REG2A
            NOP

RET
            NOP
            NOP

;**********************************************************************
; CHK_SYND - Subroutine to compute syndromes using error location numbers and
;            error magnitudes, and compare computed syndromes with stored
;            syndromes as t = 2 or t = 1
;
; On Entry: ROOT0, ROOT1 = 8-tuple representation of error locations
;           MASK20, MASK21 = 8-tupe representation of error magnitudes
;           S01, S02, S03, S04, S05, S06 = stored syndromes
;
; On Exit:  REG2D[3:2] = {unchanged, unchanged}, if syndromes match
;           REG2D[3:2] = {1, 0}, if mismatch
;           The routine alters REG1C, REG1D, REG1E, and REG2D.
;
;**********************************************************************
;
;
CHK_SYND:
;
; Store the following terms to registers REG1C, REG1D, and REG1E, respectively
; REG1C = MASK20*ROOT0
; REG1D = MASK21*ROOT1
;
            GFMLT  MASK20, ROOT0   ; GFP=MASK20*ROOT0
```

```
            STGP        REG1C
            NOP
            GFMLD   MASK21, ROOT1   ; GFP=MASK21*ROOT1, GFA=MASK20*ROOT0
            STGP        REG1D
            NOP
;
; COMPUTE CS01 = MASK20*ROOT0 + MASK21*ROOT1
;
            GFADD   REG1C, REG1D    ; GFA=MASK20*ROOT0+MASK21*ROOT1
            GFADD   S01, GFA
            LDA         GFA
            JMPT        UNCORR
            NOP
;
; COMPUTE CS02 = MASK20*ROOT0^2 + MASK21*ROOT1^2
;
            GFMLT   ROOT0, REG1C    ; GFP = MASK20*ROOT0^2
            STGP        REG1C           ; REG1C = MASK20*ROOT0^2
            NOP
            GFMLD   ROOT1, REG1D    ; GFP = MASK21*ROOT1^2, GFA = MASK20*ROOT0^2
            STGP        REG1D           ; REG1D = MASK21*ROOT1^2
            NOP
            GFMAC       ROOT0, REG1C    ; GFP = MASK20*ROOT0^3
                                        ; GFA = MASK20*ROOT0^2 + MASK21*ROOT1^2
            GFADD   S02, GFA        ; CS02 = S02 ?
            LDA         GFA
            JMPT        UNCORR          ; IF NOT, UNCOR
            NOP
;
; COMPUTE CS03 = MASK20*ROOT0^3 + MASK21*ROOT1^3
;
            STGP        REG1C           ; REG1C = MASK20*ROOT0^3
            NOP
            GFMLD   ROOT1, REG1D    ; GFP = MASK21*ROOT1^3, GFA = MASK20*ROOT0^3
            STGP        REG1D           ; REG1D = MASK21*ROOT1^3
            NOP
            GFMAC       ROOT0, REG1C    ; GFP = MASK20*ROOT0^4
                                        ; GFA = MASK20*ROOT0^3 + MASK21*ROOT1^3

GFADD   S03, GFA
            LDA         GFA
            JMPT        UNCORR
            NOP
;
; COMPUTE CS04 = MASK20*ROOT0^4 + MASK21*ROOT1^4 + MASK22*ROOT2^4
;
            STGP        REG1C           ; REG1C = MASK20*ROOT0^4
            NOP
            GFMLD   ROOT1, REG1D    ; GFP = MASK21*ROOT1^4, GFA = MASK20*ROOT0^4
            STGP        REG1D
            NOP
            GFMAC       ROOT0, REG1C    ; GFP = MASK20*ROOT0^5
                                        ; GFA = MASK20*ROOT0^4 + MASK21*ROOT1^4

GFADD   S04, GFA
            LDA         GFA
            JMPT        UNCORR
            NOP
;
;COMPUTE CS05 = MASK20*ROOT0^5 + MASK21*ROOT1^5 + MASK22*ROOT2^5
;
            STGP        REG1C           ; REG1C = MASK20*ROOT0^5
```

```
             NOP
             GFMLD    ROOT1, REG1D    ; GFP = MASK21*ROOT1^5, GFA = MASK20*ROOT0^5
             STGP              REG1D
             NOP
             GFMAC             ROOT0, REG1C    ; GFP = MASK20*ROOT0^6
                                               ; GFA = MASK20*ROOT0^5 + MASK21*ROOT1^5

GFADD    S05, GFA
             LDA              GFA
             JMPT             UNCORR
             NOP
;
; COMPUTE CS06 = MASK20*ROOT0^6 + MASK21*ROOT1^6 + MASK22*ROOT2^6
;
             STGP             REG1C           ; REG1C = MASK20*ROOT0^6
             NOP
             GFMLD    ROOT1, REG1D    ; GFP = MASK21*ROOT1^6, GFA = MASK20*ROOT0^6
             GFMAC            ROOT0, REG1C    ; GFP = MASK20*ROOT0^7
                                              ; GFA = MASK20*ROOT0^6 + MASK21*ROOT1^6
             GFADD    S06, GFA                ; CS06 = S06 ?
             LDA              GFA
             JMPT             UNCORR          ; IF NOT, UNCOR
             NOP
             RET
             NOP
             NOP
;
;
;
;*****************************************************************************
; PREP_BC - Subroutine to prepare offsets and masks for buffer correction.
;           Count errors if errors occur in data or ecc field for each
;           interleave, and also move error counts, LBA and the qualified
;           offsets and masks to locations available for uP to read.
;
; On Entry -
;       OFFSET00, OFFSET01, OFFSET02,
;       OFFSET10, OFFSET11, OFFSET12,
;       OFFSET20, OFFSET21, OFFSET22,
;       MASK00, MASK01, MASK02
;       MASK10, MASK11, MASK12
;       MASK20, MASK21, MASK22
;       REG47, ..., REG4A
;       REG53, ..., REG56
;       REG5F, ..., REG62
;       REG2D[5], LBA error flag
;
; On Exit -
;       LBA3, LBA2, LBA1, LBA0 contain the corrected LBA if there is any
;       ERRCNT1, ERRCNT2, ERRCNT3 contains the error count, respectively
;       OFFSET LIFO, MASKH LIFO, AND MASKL LIFO loaded with word offsets and masks
;
;*****************************************************************************
;
;
PREP_BC:
;
             LDA      #0
             STA      LBA3
             STA      LBA2
             STA      LBA1
             STA      LBA0
```

```
            STA     ERRCNT1
            STA     ERRCNT2
            STA     ERRCNT3
;
; PREP OFFSETS AND MASKS FROM INTERLEAVE 0
;
            LDA     MASK00
            JMPF    INTLV1          ; mask00=0? if yes, do prep for next interleave
            NOP
            LDA     #1
            SLT     OFFSET00
            JMPF    LD0_LBA03       ; offset<2? if yes, load LBA3 or LBA0
            NOP
            LDA     ERRCNT1                     ; increment errcnt1 by 1
            ADD     #1
            STA     ERRCNT1
            LDA     OFFSET00
            SLT     #172
            JMPF    ITV0_DO1        ; offset<172? if no, do prep for next offset
            NOP
            LDA     REG53
            STA     MASKH           ; else, move REG53 & REG52 to MASKH & MASKL lifo
            LDA     REG52
            STA     MASKL
            GFDI    OFFSET00, #0    ; deinterleave offset00 and move it to lifo
            STGA    LIFO_OFS
            JMP     ITV0_DO1
            NOP
LD0_LBA03:
            LDA     OFFSET00
            JMPT    LD0_LBA0
            NOP
            LDA     MASK00
            STA     LBA3
            JMP     SET00_LBAFLAG
            NOP
LD0_LBA0:
            LDA     MASK00
            STA     LBA0
SET00_LBAFLAG:
            LDA     REG2D
            OR      #20H
            STA     REG2D ITV0_DO1:
            LDA     MASK01
            JMPF    INTLV1          ; mask01=0? if yes, do prep for next interleave
            NOP
            LDA     #1
            SLT     OFFSET01
            JMPF    LD1_LBA03       ; offset<2? if yes, load LBA3 or LBA0
            NOP
            LDA     ERRCNT1
            ADD     #1
            STA     ERRCNT1
            LDA     OFFSET01
            SLT     #172
            JMPF    ITV0_DO2        ; offset<172? if no, do prep for next offset
            NOP
            LDA     REG55
            STA     MASKH           ; else, move REG55 & REG54 to MASKH & MASKL lifo
            LDA     REG54
```

```
            STA     MASKL
            GFDI    OFFSET01, #0        ; deinterleave offset01 and move it to lifo
            STGA    LIFO_OFS
            JMP     ITV0_DO2
            NOP
LD1_LBA03:
            LDA     OFFSET01
            JMPT    LD1_LBA0
            NOP
            LDA     MASK01
            STA     LBA3
            JMP     SET01_LBAFLAG
            NOP
LD1_LBA0:
            LDA     MASK01
            STA     LBA0
SET01_LBAFLAG:
            LDA     REG2D
            OR      #20H
            STA     REG2D ITV0_DO2:
            LDA     MASK02
            JMPF    INTLV1              ; mask02=0? if yes, do prep for next interleave
            NOP
            LDA     #1
            SLT     OFFSET02
            JMPF    LD2_LBA03           ; offset<2? if yes, load LBA3 or LBA0
            NOP
            LDA     ERRCNT1
            ADD     #1
            STA     ERRCNT1
            LDA     OFFSET02
            SLT     #172
            JMPF    INTLV1              ; offset<172? if no, do prep for next offset
            NOP
            LDA     REG57
            STA     MASKH               ; else, move REG57 & REG56 to MASKH & MASKL lifo
            LDA     REG56
            STA     MASKL
            GFDI    OFFSET02, #0        ; deinterleave offset02 and move it to lifo
            STGA    LIFO_OFS
            JMP     INTLV1
            NOP
LD2_LBA03:
            LDA     OFFSET02
            JMPT    LD2_LBA0
            NOP
            LDA     MASK02
            STA     LBA3
            JMP     SET02_LBAFLAG
            NOP
LD2_LBA0:
            LDA     MASK02
            STA     LBA0
SET02_LBAFLAG:
            LDA     REG2D
            OR      #20H
            STA     REG2D
;
; PREP OFFSETS ANS MASKS FROM INTERLEAVE 1
;
```

```
INTLV1:
        LDA     MASK10
        JMPF    INTLV2          ; mask10=0? if yes, do prep for next interleave
        NOP
        LDA     OFFSET10
        JMPF    LD0_LBA2        ; offset=0? if yes, load LBA2
        NOP
        LDA     ERRCNT2
        ADD     #1
        STA     ERRCNT2
        LDA     OFFSET10
        SLT     #172
        JMPF    ITV1_DO1        ; offset<172? if no, do prep for next offset
        NOP
        LDA     REG59
        STA     MASKH           ; else, move REG59 & REG58 to MASKH & MASKL lifo
        LDA     REG58
        STA     MASKL
        GFDI    OFFSET10, #1    ; deinterleave offset10 and move it to lifo
        STGA    LIFO_OFS
        JMP     ITV1_DO1
        NOP
LD0_LBA2:
        LDA     MASK10
        STA     LBA2            ; load mask to LBA2
        LDA     REG2D
        OR      #20H
        STA     REG2D           ; set LBA error flag ITV1_DO1:
        LDA     MASK11
        JMPF    INTLV2          ; mask11=0? if yes, do prep for next interleave
        NOP
        LDA     OFFSET11
        JMPF    LD1_LBA2        ; offset=0? if yes, load LBA2
        NOP
        LDA     ERRCNT2
        ADD     #1
        STA     ERRCNT2
        LDA     OFFSET11
        SLT     #172
        JMPF    ITV1_DO2        ; offset<172? if no, do prep for next offset
        NOP
        LDA     REG5B
        STA     MASKH           ; else, move REG5B & REG5A to MASKH & MASKL lifo
        LDA     REG5A
        STA     MASKL
        GFDI    OFFSET11, #1    ; deinterleave offset11 and move it to lifo
        STGA    LIFO_OFS
        JMP     ITV1_DO2
        NOP
LD1_LBA2:
        LDA     MASK11
        STA     LBA2            ; load mask to LBA2
        LDA     REG2D
        OR      #20H
        STA     REG2D           ; set LBA error flag ITV1_DO2:
        LDA     MASK12
        JMPF    INTLV2          ; mask12=0? if yes, do prep for next interleave
        NOP
```

```
          LDA    OFFSET12
          JMPF   LD2_LBA2         ; offset=0? if yes, load LBA2
          NOP
          LDA    ERRCNT2
          ADD    #1
          STA    ERRCNT2
          LDA    OFFSET12
          SLT    #172
          JMPF   INTLV2           ; offset<172? if no, do prep for next offset
          NOP
          LDA    REG5D
          STA    MASKH            ; else, move REG5D & REG5C to MASKH & MASKL lifo
          LDA    REG5C
          STA    MASKL
          GFDI   OFFSET12, #1     ; deinterleave offset12 and move it to lifo
          STGA   LIFO_OFS
          JMP    INTLV2
          NOP
LD2_LBA2:
          LDA    MASK12
          STA    LBA2             ; load mask to LBA2
          LDA    REG2D
          OR     #20H
          STA    REG2D            ; set LBA error flag
;
; PREP OFFSETS AND MASKS FOR INTERLEAVE 2
;
INTLV2:
          LDA    MASK20
          JMPF   PREP_DN          ; mask20=0? if yes, exit
          NOP
          LDA    OFFSET20
          JMPF   LD0_LBA1         ; offset=0? if yes, load LBA1
          NOP
          LDA    ERRCNT3
          ADD    #1
          STA    ERRCNT3
          LDA    OFFSET20
          SLT    #172
          JMPF   ITV2_DO1         ; offset<172? if no, do prep for next offset
          NOP
          LDA    REG5F
          STA    MASKH            ; else, move REG5F & REG5E to MASKH & MASKL lifo
          LDA    REG5E
          STA    MASKL
          GFDI   OFFSET20, #2     ; deinterleave offset20 and move it to lifo
          STGA   LIFO_OFS
          JMP    ITV2_DO1
          NOP
LD0_LBA1:
          LDA    MASK20
          STA    LBA1             ; load mask to LBA1
          LDA    REG2D
          OR     #20H
          STA    REG2D            ; set LBA error flag ITV2_DO1:
          LDA    MASK21
          JMPF   PREP_DN          ; mask21=0? if yes, exit
          NOP
          LDA    OFFSET21
          JMPF   LD1_LBA1         ; offset=0? if yes, load LBA1
```

```
          NOP
          LDA     ERRCNT3
          ADD     #1
          STA     ERRCNT3
          LDA     OFFSET21
          SLT     #172
          JMPF    ITV2_DO2        ; offset<172? if no, do prep for next offset
          NOP
          LDA     REG61
          STA     MASKH           ; else, move REG61 & REG60 to MASKH & MASKL lifo
          LDA     REG60
          STA     MASKL
          GFDI    OFFSET21, #2    ; deinterleave offset21 and move it to lifo
          STGA    LIFO_OFS
          JMP     ITV2_DO2
          NOP
LD1_LBA1:
          LDA     MASK21
          STA     LBA1            ; load mask to LBA1
          LDA     REG2D
          OR      #20H
          STA     REG2D           ; set LBA error flag ITV2_DO2:
          LDA     MASK22
          JMPF    PREP_DN         ; mask22=0? if yes, exit
          NOP
          LDA     OFFSET22
          JMPF    LD2_LBA1        ; offset=0? if yes, load LBA1
          NOP
          LDA     ERRCNT3
          ADD     #1
          STA     ERRCNT3
          LDA     OFFSET22
          SLT     #172
          JMPF    PREP_DN         ; offset<172? if no, exit
          NOP
          LDA     REG63
          STA     MASKH           ; else, move REG63 & REG62 to MASKH & MASKL lifo
          LDA     REG62
          STA     MASKL
          GFDI    OFFSET22, #2    ; deinterleave offset22 and move it to lifo
          STGA    LIFO_OFS
          NOP
          RET
          NOP
          NOP
LD2_LBA1:
          LDA     MASK22
          STA     LBA1            ; load mask to LBA1
          LDA     REG2D
          OR      #20H
          STA     REG2D   ; set LBA error flag
          NOP
PREP_DN:
          RET
          NOP
          NOP
```

```
;***********************************************************************
; SF_CV - Perform deinterleaves of offsets, generate the error locator numbers
;         in subfield, and convert magnitudes from extended field to subfield.
;
; On Entry -
;         INTLV = interleave #
;         OFFSET20, OFFSET21, OFFSET22 = error locations
;         MASK20, MASK21, MASK22 = error magnitudes
;
; On Exit -
;         REG40, REG41, ......, REG51 = error locator numbers
;         , where {REG41, REG40} corresponding to OFFSET00 in interleave #0,
;         {REG43, REG42} corresponding to OFFSET01 in interleave #0,
;         {REG45, REG44} corresponding to OFFSET02 in interleave #0,
;         {REG47, REG46} corresponding to OFFSET10 in interleave #1,
;         {REG49, REG48} corresponding to OFFSET11 in interleave #1,
;         {REG4B, REG4A} corresponding to OFFSET12 in interleave #1,
;         {REG4D, REG4C} corresponding to OFFSET20 in interleave #2,
;         {REG4F, REG4E} corresponding to OFFSET21 in interleave #2,
;         {REG51, REG50} corresponding to OFFSET22 in interleave #2.
;
;         REG52, REG53, ......, REG63 = error magnitudes
;         , where {REG53, REG52} corresponding to MASK00 in interleave #0,
;         {REG55, REG54} corresponding to MASK01 in interleave #0,
;         {REG57, REG56} corresponding to MASK02 in interleave #0,
;         {REG59, REG58} corresponding to MASK10 in interleave #1,
;         {REG5B, REG5A} corresponding to MASK11 in interleave #1,
;         {REG5D, REG5C} corresponding to MASK12 in interleave #1,
;         {REG5F, REG5E} corresponding to MASK20 in interleave #2,
;         {REG61, REG60} corresponding to MASK21 in interleave #2,
;         {REG63, REG62} corresponding to MASK22 in interleave #2.
;
; The routine alters REG40, REG41, ..., REG63.
;
;
;
;***********************************************************************
;
;
SF_CV:
;
          LDA INTLV          ; interleave = 0?
          JMPF TEST_I0       ; if yes, jump to TEST_I0
          NOP
          SUB #1
          JMPF TEST_I1       ; if interleave = 1, jump to TEST_I1
          NOP
;
;
;***************
; interleave = 2
;***************
TEST_I2:
          LDA #0
          STA REG63          ; clear REG63 to REG5E
          STA REG62
          STA REG61
          STA REG60
          STA REG5F
          STA REG5E
;
          LDA #172           ; offset20 within valid range ?
```

```
            SLT OFFSET20
            JMPT T3_OFS1        ; jump if not
            NOP
    ;
            GFDI OFFSET20, #2   ; deinterleave OFFSET20
            GFLA #4             ; convert to subfield elements
            NOP
            GFLD
            STT1 REG4C
            LDT1 MASK20
            STT2 REG4D
    ;
            LDA OFFSET20        ; OFFSET20[0] = 0?
            AND #1
            JMPT ST_R5E         ; if not, load MASK20 to low byte
            NOP
            STT1 REG5F          ; else, load MASK20 to high byte
            JMP T3_OFS1
            NOP
    ST_R5E:
            STT1 REG5E
    ;
    T3_OFS1:
            LDA #172            ; offset21 within valid range ?
            SLT OFFSET21
            JMPT T3_OFS2        ; jump if not
            NOP GFDI OFFSET21, #2   ; deinterleave OFFSET21
            GFLA #4             ; convert to subfield elements
            NOP
            GFLD
            STT1 REG4E
            LDT1 MASK21
            STT2 REG4F
            LDA OFFSET21        ; OFFSET21[0] = 0?
            AND #1
            JMPT ST_R60         ; if not, load MASK21 to low byte
            NOP
            STT1 REG61          ; else, load MASK21 to high byte
            JMP T3_OFS2
            NOP
    ST_R60:
            STT1 REG60
    ;
    T3_OFS2:
            LDA #172            ; offset22 within valid range ?
            SLT OFFSET22
            JMPT SFCVDONE       ; jump if not
            NOP GFDI OFFSET22, #2   ; deinterleave OFFSET22
            GFLA #4             ; convert to subfield elements
            NOP
            GFLD
            STT1 REG50
            LDT1 MASK22
            STT2 REG51
            LDA OFFSET22        ; OFFSET22[0] = 0?
            AND #1
            JMPT ST_R62         ; if not, load MASK22 to low byte
            NOP
```

```
                STT1 REG63              ; else, load MASK22 to high byte
                NOP
                RET
                NOP
                NOP
ST_R62:
                STT1 REG62
                NOP
SFCVDONE:
                RET
                NOP
                NOP ;
;****************
; interleave = 0
;****************
TEST_I0:
;
                LDA #0
                STA REG53               ; clear REG52 to REG57
                STA REG52
                STA REG55
                STA REG54
                STA REG57
                STA REG56
;
                LDA MASK20
                STA MASK00
                LDA MASK21
                STA MASK01
                LDA MASK22
                STA MASK02
;
                LDA OFFSET20            ; offset20 within valid range ?
                STA OFFSET00
                SLT #174
                JMPF TST_OFS1           ; jump if not
                NOP GFDI OFFSET20, #0       ; deinterleave OFFSET20
                GFLA #4
                NOP
                GFLD                    ; convert to subfield elements
                STT1 REG40
                LDT1 MASK20
                STT2 REG41
;
; deinterleave and conversion of error magnitude LDA OFFSET20            ; OFFSET20[0] = 0?
                AND #1
                JMPT ST_R52             ; if not, load MASK20 to low byte
                NOP
                STT1 REG53              ; else, load MASK20 to high byte
                JMP TST_OFS1
                NOP
ST_R52:
                STT1 REG52
;
TST_OFS1:
                LDA OFFSET21            ; offset21 within valid range ?
```

```
                STA OFFSET01
                SLT #174
                JMPF TST_OFS2           ; jump if not
                NOP GFDI OFFSET21, #0       ; deinterleave OFFSET21
                GFLA #4                 ; convert to subfield elements
                NOP
                GFLD
                STT1 REG42
                LDT1 MASK21
                STT2 REG43
                LDA OFFSET21            ; OFFSET21[0] = 0?
                AND #1
                JMPT ST_R54             ; if not, load MASK21 to low byte
                NOP
                STT1 REG55              ; else, load MASK21 to high byte
                JMP TST_OFS2
                NOP
ST_R54:
                STT1 REG54
;
TST_OFS2:
                LDA OFFSET22            ; offset22 within valid range ?
                STA OFFSET02
                SLT #174
                JMPF SFCVDONE           ; jump if not
                NOP GFDI OFFSET22, #0       ; deinterleave OFFSET22
                GFLA #4                 ; convert to subfield elements
                NOP
                GFLD
                STT1 REG44
                LDT1 MASK22
                STT2 REG45
                LDA OFFSET22            ; OFFSET22[0] = 0?
                AND #1
                JMPT ST_R56             ; if not, load MASK22 to low byte
                NOP
                STT1 REG57              ; else, load MASK22 to high byte
                NOP
                RET
                NOP
                NOP
ST_R56:
                STT1 REG56
                NOP
                RET
                NOP
                NOP
;
;***************
; interleave = 1
;***************
TEST_I1:
                LDA #0
                STA REG58               ; clear REG58 to REG5D
                STA REG59
                STA REG5A
                STA REG5B
                STA REG5C
```

136

```
        STA REG5D
;
        LDA MASK20
        STA MASK10
        LDA MASK21
        STA MASK11
        LDA MASK22
        STA MASK12
;
        LDA OFFSET20          ; offset20 within valid range ?
        STA OFFSET10
        SLT #173         ;
        JMPF T2_OFS1          ; jump if not
        NOP GFDI OFFSET20, #1     ; deinterleave OFFSET20
        GFLA #4               ; convert to subfield elements
        NOP
        GFLD
        STT1 REG46
        LDT1 MASK20
        STT2 REG47
;
; deinterleave and conversion of error magnitude;
        ;LDT1 MASK20
        LDA OFFSET20          ; OFFSET20[0] = 0?
        AND #1
        JMPT ST_R59           ; if not, load MASK20 to high byte
        NOP
        STT1 REG58            ; else, load MASK20 to low byte
        JMP T2_OFS1
        NOP
ST_R59:
        STT1 REG59
;
T2_OFS1:
        LDA OFFSET21          ;
        STA OFFSET11
        SLT #173         ; offset21 within valid range ?
        JMPF T2_OFS2          ; jump if not
        NOP GFDI OFFSET21, #1     ; deinterleave OFFSET21
        GFLA #4               ; convert to subfield elements
        NOP
        GFLD
        STT1 REG48
        LDT1 MASK21
        STT2 REG49
        LDA OFFSET21          ; OFFSET21[0] = 0?
        AND #1
        JMPT ST_R5B           ; if not, load MASK21 to high byte
        NOP
        STT1 REG5A            ; else, load MASK21 to low byte
        JMP T2_OFS2
        NOP
ST_R5B:
        STT1 REG5B
;
T2_OFS2:
        LDA OFFSET22          ;
        STA OFFSET12
```

```
            SLT #173              ; offset22 within valid range ?
            JMPF SFCVDONE         ; jump if not
            NOP GFDI OFFSET22, #1     ; deinterleave OFFSET22
            GFLA #4               ; convert to subfield elements
            NOP
            GFLD
            STT1 REG4A
            LDT1 MASK22
            STT2 REG4B
            LDA OFFSET22          ; OFFSET22[0] = 0?
            AND #1
            JMPT ST_R5D           ; if not, load MASK22 to high byte
            NOP
            STT1 REG5C            ; else, load MASK22 to low byte
            NOP
            RET
            NOP
            NOP
ST_R5D:
            STT1 REG5D
            NOP
            RET
            NOP
            NOP ;***********************************************************************
; SF_SCHK - Perform 16-bit RS code Syndrome check over subfield GF(2^8).
;
; Assumption -
;       The 16-bit RS code uses generator polynomial g(x)=(x+1)(x+a), where
;       a is a primitive element of GF(2^16).
;
;       The primitive polynomial q(x)=x^2+x+b^101 over GF(2^8) is used to
;       generate GF(2^16), where b is a primitive element of GF(2^8).
;
; On Entry -
;       ES0, ES1, ES2, ES3 = extended field syndromes, where
;       (ES1, ES0) represents the first partial syndrome, and
;       (ES3, ES2) represents the second partial syndrome.
;
;       REG40, REG41, ......, REG51 = error locations
; , where {REG41, REG40} corresponding to OFFSET0 in interleave #1,
;       {REG43, REG42} corresponding to OFFSET1 in interleave #1,
;       {REG45, REG44} corresponding to OFFSET2 in interleave #1,
;       {REG47, REG46} corresponding to OFFSET0 in interleave #2,
;       {REG49, REG48} corresponding to OFFSET1 in interleave #2,
;       {REG4B, REG4A} corresponding to OFFSET2 in interleave #2,
;       {REG4D, REG4C} corresponding to OFFSET0 in interleave #3,
;       {REG4F, REG4E} corresponding to OFFSET1 in interleave #3,
;       {REG51, REG50} corresponding to OFFSET2 in interleave #3.
;
;       REG52, REG53, ......, REG63 = error magnitudes
; , where {REG53, REG52} corresponding to MASK0 in interleave #1,
;       {REG55, REG54} corresponding to MASK1 in interleave #1,
;       {REG57, REG56} corresponding to MASK2 in interleave #1,
;       {REG59, REG58} corresponding to MASK0 in interleave #2,
;       {REG5B, REG5A} corresponding to MASK1 in interleave #2,
;       {REG5D, REG5C} corresponding to MASK2 in interleave #2,
```

```
;       {REG5F, REG5E} corresponding to MASK0 in interleave #3,
;       {REG61, REG60} corresponding to MASK1 in interleave #3,
;       {REG63, REG62} corresponding to MASK2 in interleave #3.
;
; On Exit -
;       REG2D[3] = 1, if mismatch
;             The routine alters REG28, REG29, REG2A, and REG2D
;
;
;
;****************************************************************************
;
SF_SCHK:
;
;..........................................................
; Compute the first partial syndrome and perform syndromes comparison
;..........................................................
;
; compute the high byte of the 1st syndrome
        LDA REG63
        XOR REG61
        XOR REG5F
        XOR REG5D
        XOR REG5B
        XOR REG59
        XOR REG57
        XOR REG55
        XOR REG53              ; ACC has high byte syndrome
        XOR ES1                ; high byte of first syndrome = ES1?
        JMPT UNCORR
        NOP
;
; compute the low byte of the 1st syndrome
        LDA REG62
        XOR REG60
        XOR REG5E
        XOR REG5C
        XOR REG5A
        XOR REG58
        XOR REG56
        XOR REG54
        XOR REG52              ; ACC has low byte syndrome
        XOR ES0                ; low byte of first syndrome = ES0?
        JMPT UNCORR
        NOP
;
;
;..........................................................
; Compute the second partial syndrome and perform syndromes comparison
;..........................................................
;
;
; the 8-tuple representation of b^101 = 22h
;
        LDA #22h               ; store b^101 in REG2A
;
; Multiply the first error magnitude with error location
        GFMLT REG53, REG41     ; GFP=x1.w1
        STGP REG29             ; REG29=x1.w1
        LDGA GFP               ; GFA=x1.w1
        GFMLT REG53, REG40     ; GFP=x1.w0
        GFMAC REG52, REG41     ; GFP=x0.w1, GFA=x1.w1+x1.w0
```

139

```
            GFMAC REG29, ACC       ; GFP=x1.w1.k, GFA=x1.w1+x1.w0+x0.w1
            STGA REG29             ; REG29=x1.w1+x1.w0+x0.w1
            NOP
            GFMLD REG52, REG40     ; GFP=x0.w0, GFA=x1.w1.k
            GFMAC REG55, REG43     ; GFP=x1.w1(for next mult), GFA=x1.w1.k+x0.w0
            STGA REG28             ; REG28=x1.w1.k+x0.w0
;
; Multiply the 2nd err mag. with err location and accumulate with previous value
            LDGA REG29
            STGP REG29
            NOP                    ; REG29=x1.w1
            GFMAC REG55, REG42     ; GFP=x1.w0, GFA=ph+x1.w1
            GFMAC REG54, REG43     ; GFP=x0.w1, GFA=ph+x1.w1+x1.w0
            GFMAC REG29, ACC       ; GFP=x1.w1.k, GFA=ph+x1.w1+x1.w0+x0.w1
            STGA REG29             ; REG29=ph+x1.w1+x1.w0+x0.w1
            LDGA REG28             ; GFA=pl (previous value-low byte)
            GFMAC REG54, REG42     ; GFP=x0.w0, GFA=pl+x1.w1.k
            GFMAC REG57, REG45     ; GFP=x1.w1(for next mult), GFA=pl+x1.w1.k+x0.w0
            STGA REG28             ; REG28=pl+x1.w1.k+x0.w0
;
; Multiply the 3rd err mag. with err location and accumulate with previous value
            LDGA REG29
            STGP REG29             ; REG29=x1.w1
            NOP
            GFMAC REG57, REG44     ; GFP=x1.w0, GFA=ph+x1.w1
            GFMAC REG56, REG45     ; GFP=x0.w1, GFA=ph+x1.w1+x1.w0
            GFMAC REG29, ACC       ; GFP=x1.w1.k, GFA=ph+x1.w1+x1.w0+x0.w1
            STGA REG29             ; REG29=ph+x1.w1+x1.w0+x0.w1
            LDGA REG28             ; GFA=pl
            GFMAC REG56, REG44     ; GFP=x0.w0, GFA=pl+x1.w1.k
            GFMAC REG59, REG47     ; GFP=x1.w1, GFA=pl+x1.w1.k+x0.w0
            STGA REG28             ; REG28=pl+x1.w1.k+x0.w0
;
; Multiply the 4th err mag. with err location and accumulate with previous value
            LDGA REG29
            STGP REG29             ; REG29=x1.w1
            NOP
            GFMAC REG59, REG46     ; GFP=x1.w0, GFA=ph+x1.w1
            GFMAC REG58, REG47     ; GFP=x0.w1, GFA=ph+x1.w1+x1.w0
            GFMAC REG29, ACC       ; GFP=x1.w1.k, GFA=ph+x1.w1+x1.w0+x0.w1
            STGA REG29             ; REG29=ph+x1.w1+x1.w0+x0.w1
            LDGA REG28             ; GFA=pl
            GFMAC REG58, REG46     ; GFP=x0.w0, GFA=pl+x1.w1.k
            GFMAC REG5B, REG49     ; GFP=x1.w1, GFA=pl+x1.w1.k+x0.w0
            STGA REG28             ; REG28=pl+x1.w1.k+x0.w0
;
; Multiply the 5th err mag. with err location and accumulate with previous value
            LDGA REG29
            STGP REG29             ; REG29=x1.w1
            NOP
            GFMAC REG5B, REG48     ; GFP=x1.w0, GFA=ph+x1.w1
            GFMAC REG5A, REG49     ; GFP=x0.w1, GFA=ph+x1.w1+x1.w0
            GFMAC REG29, ACC       ; GFP=x1.w1.k, GFA=ph+x1.w1+x1.w0+x0.w1
            STGA REG29             ; REG29=ph+x1.w1+x1.w0+x0.w1
            LDGA REG28             ; GFA=pl
            GFMAC REG5A, REG48     ; GFP=x0.w0, GFA=pl+x1.w1.k
            GFMAC REG5D, REG4B     ; GFP=x1.w1, GFA=pl+x1.w1.k+x0.w0
            STGA REG28             ; REG28=pl+x1.w1.k+x0.w0
;
; Multiply the 6th err mag. with err location and accumulate with previous value
            LDGA REG29
            STGP REG29             ; REG29=x1.w1
```

```
            NOP
            GFMAC REG5D, REG4A      ; GFP=x1.w0, GFA=ph+x1.w1
            GFMAC REG5C, REG4B      ; GFP=x0.w1, GFA=ph+x1.w1+x1.w0
            GFMAC REG29, ACC        ; GFP=x1.w1.k, GFA=ph+x1.w1+x1.w0+x0.w1
            STGA REG29              ; REG29=ph+x1.w1+x1.w0+x0.w1
            LDGA REG28              ; GFA=pl
            GFMAC REG5C, REG4A      ; GFP=x0.w0, GFA=pl+x1.w1.k
            GFMAC REG5F, REG4D      ; GFP=x1.w1, GFA=pl+x1.w1.k+x0.w0
            STGA REG28              ; REG28=pl+x1.w1.k+x0.w0
;
; Multiply the 7th err mag. with err location and accumulate with previous value
            LDGA REG29
            STGP REG29              ; REG29=x1.w1
            NOP
            GFMAC REG5F, REG4C      ; GFP=x1.w0, GFA=ph+x1.w1
            GFMAC REG5E, REG4D      ; GFP=x0.w1, GFA=ph+x1.w1+x1.w0
            GFMAC REG29, ACC        ; GFP=x1.w1.k, GFA=ph+x1.w1+x1.w0+x0.w1
            STGA REG29              ; REG29=ph+x1.w1+x1.w0+x0.w1
            LDGA REG28              ; GFA=pl
            GFMAC REG5E, REG4C      ; GFP=x0.w0, GFA=pl+x1.w1.k
            GFMAC REG61, REG4F      ; GFP=x1.w1, GFA=pl+x1.w1.k+x0.w0
            STGA REG28              ; REG28=pl+x1.w1.k+x0.w0
;
; Multiply the 8th err mag. with err location and accumulate with previous value
            LDGA REG29
            STGP REG29              ; REG29=x1.w1
            NOP
            GFMAC REG61, REG4E      ; GFP=x1.w0, GFA=ph+x1.w1
            GFMAC REG60, REG4F      ; GFP=x0.w1, GFA=ph+x1.w1+x1.w0
            GFMAC REG29, ACC        ; GFP=x1.w1.k, GFA=ph+x1.w1+x1.w0+x0.w1
            STGA REG29              ; REG29=ph+x1.w1+x1.w0+x0.w1
            LDGA REG28              ; GFA=pl
            GFMAC REG60, REG4E      ; GFP=x0.w0, GFA=pl+x1.w1.k
            GFMAC REG63, REG51      ; GFP=x1.w1, GFA=pl+x1.w1.k+x0.w0
            STGA REG28              ; REG28=pl+x1.w1.k+x0.w0
;
; Multiply the 9th err mag. with err location and accumulate with previous value
            LDGA REG29
            STGP REG29              ; REG29=x1.w1
            NOP
            GFMAC REG63, REG50      ; GFP=x1.w0, GFA=ph+x1.w1
            GFMAC REG62, REG51      ; GFP=x0.w1, GFA=ph+x1.w1+x1.w0
            GFMAC REG29, ACC        ; GFP=x1.w1.k, GFA=ph+x1.w1+x1.w0+x0.w1
            STGA REG29              ; REG29=ph+x1.w1+x1.w0+x0.w1
            LDGA REG28              ; GFA=pl
            GFMAC REG62, REG50      ; GFP=x0.w0, GFA=pl+x1.w1.k
            GFMAC REG63, REG51      ; GFP=don't care, GFA=pl+x1.w1.k+x0.w0
            STGA REG28              ; REG28=pl+x1.w1.k+x0.w0
;
; Compare syndromes
            LDA ES3                 ; ES3=REG29?
            XOR REG29
            JMPT UNCORR             ; jump if not
            NOP
            LDA ES2                 ; ES2=REG28?
            XOR REG28
            JMPT UNCORR             ; jump if not
            NOP
            RET
            NOP
            NOP
;
```

```
UNCORR:
        LDA REG2D           ; if uncorrectable, set bit 3 REG2D
        OR #8
        AND #7fh
        STA REG2D
        NOP
        RET
        NOP
        NOP
```

APPENDIX C

Look-Up Table Definitions

| Table # | high byte | low byte |
|---|---|---|
| 0 | LOG_TAB | INV_TAB |
| 1 | QUAD_TAB0 | SQRT_TAB |
| 2 | CUBE2_TAB0 | CUBE2_TAB1 |
| 3 | CUBE1_TAB0 | CUBE1_TAB1 |
| 4 | SUBFIELD_TAB | SUBFIELD_TAB |

The tables are defined as follows:

LOG_TAB = Log table (256 x 8).

SQRT_TAB = Square root table (256 x 8).

INV_TAB = Inverse table (256 x 8).

QUAD_TAB0 = A table that contains one root of $x^2+x+C$ (256 x 8). The other root is 1 plus the first root. In the case where there are no valid roots, the contents of the table should be 00H.

CUBE2_TAB0 and CUBE2_TAB1 = Tables that contain the roots of $x^3+C$ (256 x 8 x 2 roots), for root1 and root2. The third root is the sum of root1 and root2. In the case where there are no valid roots, the contents of the table should be 00H.

CUBE 1_TAB0 and CUBE1_TAB = Tables that contain the roots of $x^3+x+C$ (256 x 8 x 2 roots), for root1 and root2. The

143 third root is the sum of root1 and root2. In the case where there are no valid roots, the contents of the table should be 00H.

SUBFIELD_TAB = A subfield table (260 x 16) for $GF(2^{16})$ Reed-Solomon detection used in generating the cyclic redundancy code across the interleaves.

APPENDIX D

GFMAC Verilog Code

```
module eegmac
        (// inputs
        datao_a, datao_b, ir1, ir2, rdat, acc,
        dsel, esel, ldga2, ldgp2, gfdi2, gfla2, ldt1_2, ldt2_2, resetb, bclk, // outputs
        gfpd, gfad, treg1d, treg2d, radr,
        dex_a, dex_b
        );

input   [7:0] datao_a;      // DPRAM port a data
input   [7:0] datao_b;      // DPRAM port b data
input   [16:0] ir1;         // from instruction reg
input   [16:0] ir2;         // from delayed version of instruction reg
input   [16:0] rdat;    // data from ROM
input   [7:0] acc;  // data from accumulator
input   [2:0] dsel;         // mux selection for dopr
input   [2:0] esel;         // mux selection for eopr
input   ldga2;
input   ldgp2;
input   gfdi2;
input   gfla2;
input   ldt1_2;
input   ldt2_2;

input   resetb;             // reset
input   bclk;
```

```
output   [7:0] gfpd;         // data from GFP register
output   [8:0] gfad;         // data from GFA register
output   [7:0] treg1d;       // data from TREG1 register
output   [7:0] treg2d;       // data from TREG2 register
output   [11:0] radr;        // ROM word address for GF table lookup
output   [7:0] dex_a;
output   [7:0] dex_b;

reg      [11:0] b_adr;       // base address for GF lookup tables
reg      [7:0] rdex_a, rdex_b;
reg      [7:0] dopr, eopr;
reg      [7:0] rtreg1d, rtreg2d, rgfpd;
reg      [8:0] rgfad, prgfad;

wire     [7:0] m;            // results of GF multiplication
wire     [7:0] sum;          // results of GF addition
wire     ld_gfp, ld_gfa, ld_treg1, ld_treg2;
//wire   [9:0] ofsx3;        // offset multiplied by 3
wire     [9:0] diofs;        // deinterleaved byte offset
wire     [8:0] diofs1;

/**********************************************************************/
/* arithmatic unit performing GF elements addition and multiplication */ eegfma eegfma1
    (// inputs
        eopr, dopr,
    // outputs
        m, sum
    );

/*********************************************/
/* generating address for table lookup       */
/* - table starts from 0, code from 504      */

// base address parameter ba_ofs_inv    = 12'h000;    // offset = (177 - data from log table)
parameter ba_quad_sqrt  = 12'h100;
parameter ba_cube2      = 12'h200;
parameter ba_cube1      = 12'h300;
parameter ba_subf       = 12'h400;    // from 400 to 501 always @ (ir1)
  case(ir1[10:8])              // synopsys parallel_case full_case
    3'b000: b_adr = ba_ofs_inv;
    3'b001: b_adr = ba_quad_sqrt;
    3'b010: b_adr = ba_cube2;
    3'b011: b_adr = ba_cube1;
    3'b100: b_adr = ba_subf;
    default: b_adr = 12'b0;
  endcase // lookup address assign radr[11:0] = b_adr[11:0] + {3'b0, prgfad[8:0]};
```

```
/*****************************/
/* latching data from DPRAM */ assign dex_a = rdex_a;
assign dex_b = rdex_b;

//always @ (bclk or datao_a or resetb)
// if (!resetb)
//   rdex_a = 8'b0;
// else
always @ (bclk or datao_a)
   if (bclk)
      rdex_a = datao_a;

//always @ (bclk or datao_b or resetb)
// if (!resetb)
//   rdex_b = 8'b0;
// else
always @ (bclk or datao_a)
   if (bclk)
      rdex_b = datao_b;

/******************************************/
/* muxing data for arithmatic unit gfma.v */ always @ (dsel or dex_a or treg1d or treg2d or gfad or gfpd or acc)
   case (dsel[2:0])            // synopsys parallel_case full_case
      3'b000: dopr = gfpd;
      3'b001: dopr = gfad[7:0];
      3'b010: dopr = treg1d;
      3'b011: dopr = treg2d;
      3'b100: dopr = acc;
      default: dopr = dex_a;
   endcase always @ (esel or dex_b or treg1d or treg2d or gfad or gfpd or acc)
   case (esel[2:0])            // synopsys parallel_case full_case
      3'b000: eopr = gfpd;
      3'b001: eopr = gfad[7:0];
      3'b010: eopr = treg1d;
      3'b011: eopr = treg2d;
      3'b100: eopr = acc;
      default: eopr = dex_b;
   endcase /****************************************************/
/* muxing data and loading results to GFP register */ assign gfpd = rgfpd;
assign ld_gfp = (ir2[16] & (ir2[15] | ir2[14])) | ldgp2;
                                    // gfmlt, gfmac, gfmld, ldgp always @ (posedge bclk or negedge resetb)
   if (!resetb)
      rgfpd = 8'b0;
   else
      if (ld_gfp)
         rgfpd = ir2[16] ? m : dopr;
      else
         rgfpd = gfpd;
```

147

```
/***********************************************************/
/* computing and muxing data, and loading results to GFA reg */ assign gfad = rgfad;
assign ld_gfa = (ir2[16] & ~(ir2[15] & ir2[14])) | ldga2 | gfdi2;
                // gfadd, gfmac, gfmld, ldga, gfdi always @ (ld_gfa or ir2 or dopr or diofs or sum or gfad or gfpd)
   case ({ld_gfa, ir2[16:14]})          // synopsys parallel_case full_case
         4'b1010: prgfad = {1'b0, dopr};                    // ldga
         4'b1011: prgfad = diofs[9:1];         // gfdi
         4'b1100: prgfad = {1'b0, sum};                     // gfadd
         4'b1101: prgfad = {1'b0, gfad[7:0] ^ gfpd};   // gfmac
         4'b1110: prgfad = {1'b0, gfpd};                    // gfmld
      default: prgfad = gfad;
   endcase always @ (posedge bclk or negedge resetb)
  if (!resetb)
     rgfad = 9'b0;
  else
     rgfad = prgfad;

// generating deinterleaved offset

// Restructure adders to improve speed
//assign ofsx3[9:0] = {1'b0, dopr[7:0]} + {dopr[7:0], 1'b0};
//assign diofs[9:0] = ofsx3[9:0] + {8'b0, ir2[9:8]};

assign diofs1[8:0] = {dopr[7:0], 1'b0} + {7'b0, ir2[9:8]};
assign diofs[9:0] = {1'b0, diofs1[8:0]} + {2'b0, dopr[7:0]};

/***************************/
/* loading TREG1 and TREG2 */ assign treg1d = rtreg1d;
assign treg2d = rtreg2d;
assign ld_treg1 = ldt1_2 | gfla2;
assign ld_treg2 = ldt2_2 | gfla2;

always @ (posedge bclk or negedge resetb)
  if (!resetb)
     rtreg1d = 8'b0;
  else
     if (ld_treg1)
        rtreg1d = ir2[15] ? dopr : rdat[7:0];
     else
        rtreg1d = treg1d;

always @ (posedge bclk or negedge resetb)
  if (!resetb)
     rtreg2d = 8'b0;
  else
     if (ld_treg2)
        rtreg2d = ir2[15] ? dopr : rdat[15:8];
     else
        rtreg2d = treg2d;

endmodule
```

```
module eegfma
        ( // inputs
                a, b,
        // outputs
                m, sum
        );

input [7:0] a, b;
output [7:0] m;                 // results of GF multiplication
output [7:0] sum;               // results of GF addition // GF multiplication wire [14:0] c;
wire [7:0] addc8, addc9, addc10, addc11, addc12, addc13, addc14;

parameter [7:0] tup_8  = 8'd29;         // 8-tuple rep. of x^8
parameter [7:0] tup_9  = 8'd58;         // 8-tuple rep. of x^9
parameter [7:0] tup_10 = 8'd116;        // 8-tuple rep. of x^10
parameter [7:0] tup_11 = 8'd232;        // 8-tuple rep. of x^11
parameter [7:0] tup_12 = 8'd205;        // 8-tuple rep. of x^12
parameter [7:0] tup_13 = 8'd135;        // 8-tuple rep. of x^13
parameter [7:0] tup_14 = 8'd19;         // 8-tuple rep. of x^14 assign c[0] = b[0] & a[0];
assign c[1] = (b[0] & a[1]) ^ (b[1] & a[0]);
assign c[2] = (b[0] & a[2]) ^ (b[1] & a[1]) ^ (b[2] & a[0]);
assign c[3] = (b[0] & a[3]) ^ (b[1] & a[2]) ^ (b[2] & a[1]) ^ (b[3] & a[0]);
assign c[4] = (b[0] & a[4]) ^ (b[1] & a[3]) ^ (b[2] & a[2]) ^ (b[3] & a[1]) ^
              (b[4] & a[0]);
assign c[5] = (b[0] & a[5]) ^ (b[1] & a[4]) ^ (b[2] & a[3]) ^ (b[3] & a[2]) ^
              (b[4] & a[1]) ^ (b[5] & a[0]);
assign c[6] = (b[0] & a[6]) ^ (b[1] & a[5]) ^ (b[2] & a[4]) ^ (b[3] & a[3]) ^
              (b[4] & a[2]) ^ (b[5] & a[1]) ^ (b[6] & a[0]);
assign c[7] = (b[0] & a[7]) ^ (b[1] & a[6]) ^ (b[2] & a[5]) ^ (b[3] & a[4]) ^
              (b[4] & a[3]) ^ (b[5] & a[2]) ^ (b[6] & a[1]) ^ (b[7] & a[0]);
assign c[8] = (b[1] & a[7]) ^ (b[2] & a[6]) ^ (b[3] & a[5]) ^ (b[4] & a[4]) ^
              (b[5] & a[3]) ^ (b[6] & a[2]) ^ (b[7] & a[1]);
assign c[9] = (b[2] & a[7]) ^ (b[3] & a[6]) ^ (b[4] & a[5]) ^ (b[5] & a[4]) ^
              (b[6] & a[3]) ^ (b[7] & a[2]);
assign c[10] = (b[3] & a[7]) ^ (b[4] & a[6]) ^ (b[5] & a[5]) ^ (b[6] & a[4]) ^
              (b[7] & a[3]);
assign c[11] = (b[4] & a[7]) ^ (b[5] & a[6]) ^ (b[6] & a[5]) ^ (b[7] & a[4]);
assign c[12] = (b[5] & a[7]) ^ (b[6] & a[6]) ^ (b[7] & a[5]);
assign c[13] = (b[6] & a[7]) ^ (b[7] & a[6]);
assign c[14] = b[7] & a[7];

assign addc8[7:0]  = {c[8],c[8],c[8],c[8],c[8],c[8],c[8],c[8]} & tup_8;
assign addc9[7:0]  = {c[9],c[9],c[9],c[9],c[9],c[9],c[9],c[9]} & tup_9;
assign addc10[7:0] = {c[10],c[10],c[10],c[10],c[10],c[10],c[10],c[10]} & tup_10;
assign addc11[7:0] = {c[11],c[11],c[11],c[11],c[11],c[11],c[11],c[11]} & tup_11;
assign addc12[7:0] = {c[12],c[12],c[12],c[12],c[12],c[12],c[12],c[12]} & tup_12;
assign addc13[7:0] = {c[13],c[13],c[13],c[13],c[13],c[13],c[13],c[13]} & tup_13;
assign addc14[7:0] = {c[14],c[14],c[14],c[14],c[14],c[14],c[14],c[14]} & tup_14;

assign m[0] = c[0] ^ addc8[0] ^ addc9[0] ^ addc10[0] ^ addc11[0] ^ addc12[0] ^
              addc13[0] ^ addc14[0];
assign m[1] = c[1] ^ addc8[1] ^ addc9[1] ^ addc10[1] ^ addc11[1] ^ addc12[1] ^
              addc13[1] ^ addc14[1];
assign m[2] = c[2] ^ addc8[2] ^ addc9[2] ^ addc10[2] ^ addc11[2] ^ addc12[2] ^
              addc13[2] ^ addc14[2];
assign m[3] = c[3] ^ addc8[3] ^ addc9[3] ^ addc10[3] ^ addc11[3] ^ addc12[3] ^
```

```
            addc13[3] ^ addc14[3];
assign m[4] = c[4] ^ addc8[4] ^ addc9[4] ^ addc10[4] ^ addc11[4] ^ addc12[4] ^
            addc13[4] ^ addc14[4];
assign m[5] = c[5] ^ addc8[5] ^ addc9[5] ^ addc10[5] ^ addc11[5] ^ addc12[5] ^
            addc13[5] ^ addc14[5];
assign m[6] = c[6] ^ addc8[6] ^ addc9[6] ^ addc10[6] ^ addc11[6] ^ addc12[6] ^
            addc13[6] ^ addc14[6];
assign m[7] = c[7] ^ addc8[7] ^ addc9[7] ^ addc10[7] ^ addc11[7] ^ addc12[7] ^
            addc13[7] ^ addc14[7];

// GF addition assign sum[0] = a[0] ^ b[0];
assign sum[1] = a[1] ^ b[1];
assign sum[2] = a[2] ^ b[2];
assign sum[3] = a[3] ^ b[3];
assign sum[4] = a[4] ^ b[4];
assign sum[5] = a[5] ^ b[5];
assign sum[6] = a[6] ^ b[6];
assign sum[7] = a[7] ^ b[7];

endmodule
```

What is claimed is:

1. A disk drive, adapted for storing user data provided from a host, the disk drive comprising:
   a disk having a recording surface with a plurality of data tracks thereon;
   means for reading and writing data to and from the data tracks; and
   a host interface and disk controller, coupled to receive host commands and data from, and to send data to, the host, the host interface and disk controller comprising a single integrated circuit including:
   check symbol/syndrome generator means for generating error correction code check symbols to be appended to the user data to be written to the data tracks and for generating error correction code syndromes during read operations;
   programmable error corrector means employing the error correction code syndromes for correcting errors in the user data read from the data tracks, the error corrector means including finite field processor means for calculating over a finite field, and means for storing an error correction control program including instructions executable by the finite field processor means;
   the finite field processor means including:
      finite field multiplication means having first and second multiplier inputs for receiving operands, a multiplier output, and circuit means for providing via the multiplier output a product of the operands received via the first and second multiplier inputs;
      finite field addition means having first and second adder inputs, an adder output; and circuit means for providing via the adder output a sum of the operands received via the first and second adder inputs;
      first gating means responsive to a predetermined instruction for providing operands to the first and second multiplier inputs; and
      second gating means responsive to the predetermined instruction for providing operands to the first and second adder inputs; whereby the finite field processor means in execution of a single predetermined instruction calculates both a product and a sum.

2. The disk drive of claim 1, wherein the programmable error corrector means further comprises an accumulator register for storing the sum.

3. The disk drive of claim 2, wherein the programmable error corrector means further comprises a product register for storing the product.

4. The disk drive of claim 3, wherein the first gating means provides selected operands referred to in the predetermined instruction.

5. The disk drive of claim 4, wherein the second gating means operates during execution of the predetermined instruction to provide operands to the adder inputs from the accumulator register and from the product register.

6. The disk drive of claim 1, wherein the finite field processor means performs calculations over $GF(2^8)$ and wherein the error correction code check symbols are each 8 bits.

7. The disk drive of claim 1, wherein the programmable error corrector means further comprises a dual ported register file.

8. The disk drive of 1, wherein the circuit means in the finite field multiplication means includes a combinatorial logic array for performing single step finite field multiplication operations.

9. The disk drive of claim 1, wherein the programmable error corrector means includes arithmetic logic means, separate from the finite field processor means, for performing arithmetic and logic operations.

10. The disk drive of claim 1, wherein the programmable error corrector means includes a register file including an accumulator register for storing the sum.

11. The disk drive of claim 10, wherein the register file includes a product register for storing the product.

12. The disk drive of claim 11, wherein the first gating means provides selected operands referred to in the predetermined instruction.

13. The disk drive of claim 12, wherein the second gating means operates during execution of the predetermined instruction to provide operands to the adder inputs from the accumulator register and from the product register.

14. A disk drive, adapted for storing user data provided from a host, the disk drive comprising:
   a disk having a recording surface with a plurality of data tracks thereon;
   means for reading and writing data to and from the data tracks; and
   a host interface and disk controller, coupled to receive host commands and data from, and to send data to, the host, the host interface and disk controller comprising a single integrated circuit including:
   check symbol/syndrome generator means for generating error correction code check symbols to be appended to the user data to be written to the data tracks and for generating error correction code syndromes during read operations;
   programmable error corrector means employing the error correction code syndromes for correcting errors in the user data read from the data tracks, the error corrector means including finite field processor means for calculating over a finite field, and means for storing an error correction control program including instructions executable by the finite field processor means;
   the finite field processor means including:
      a first register;
      a second register;
      finite field multiplication means responsive to a predetermined instruction for executing a multiplying operation to produce a product and store the product in the first register; and
      finite field addition means responsive to the predetermined instruction for executing an addition operation to produce a sum and store the sum in the second register.

15. The disk drive of claim 14, wherein the finite field multiplication means has first and second multiplier inputs for receiving operands, a multiplier output, and circuit means for providing via the multiplier output a product of the operands received via the first and second multiplier inputs; the finite field addition means has first and second adder inputs, an adder output; and circuit means for providing via the adder output a sum of the operands received via the first and second adder inputs; and wherein the finite field processor means includes first gating means responsive to the predetermined instruction for providing operands to the first and second multiplier inputs; and second gating means responsive to the predetermined instruction for providing operands to the first and second adder inputs.

16. The disk drive of claim 15, wherein the first gating means provides selected operands referred to in the predetermined instruction.

17. The disk drive of claim 16, wherein the second gating means operates during execution of the predetermined instruction to provide operands to the adder inputs from the accumulator register and from the product register.

18. The disk drive of claim 14, wherein the finite field processor means performs calculations over $GF(2^8)$ and wherein the error correction code check symbols are each 8 bits.

19. The disk drive of claim 14, wherein the programmable error corrector means further comprises a dual ported register file.

20. The disk drive of 14, wherein the circuit means in the finite field multiplication means includes a combinatorial logic array for performing single step finite field multiplication operations.

21. The disk drive of claim 14, wherein the programmable error corrector means includes arithmetic logic means, separate from the finite field processor means, for performing arithmetic and logic operations.

22. The disk drive of claim 14, wherein the programmable error corrector means includes a register file including an accumulator register for storing the sum.

23. The disk drive of claim 14, wherein the register file includes a product register for storing the product.

24. An integrated circuit disk drive controller for incorporation into a disk drive, the controller comprising:

means for receiving user data supplied to the disk drive;

check symbol generator means for generating error correction code check symbols;

means for appending the error correction code check symbols to the user data;

means for receiving read data generated within the disk drive;

syndrome generator means for generating error correction code syndromes from the read data; and programmable error corrector means for correcting the detected errors employing the error correction code syndromes, the error corrector means including finite field processor means for calculating over a finite field, and means for storing an error correction control program including instructions executable by the finite field processor means, wherein the finite field processor means comprises:

finite field multiplication means having first and second multiplier inputs for receiving operands, a multiplier output, and circuit means for providing via the multiplier output a product of the operands received via the first and second multiplier inputs;

finite field addition means having first and second adder inputs, an adder output; and circuit means for providing via the adder output a sum of the operands received via the first and second adder inputs;

first gating means responsive to a predetermined instruction for providing operands to the first and second multiplier inputs; and second gating means responsive to the predetermined instruction for providing operands to the first and second adder inputs; whereby the finite field processor means in execution of a single predetermined instruction calculates both a product and a sum.

25. The controller of claim 24, wherein the programmable error corrector means further comprises an accumulator register for storing the sum.

26. The controller of claim 25, wherein the programmable error corrector means further comprises a product register for storing the product.

27. The controller of claim 26, wherein the first gating means provides selected operands referred to in the predetermined instruction.

28. The controller of claim 27, wherein the second gating means operates during execution of the predetermined instruction to provide operands to the adder inputs from the accumulator register and from the product register.

29. The controller of claim 24, wherein the finite field processor means performs calculations over $GF(2^8)$ and wherein the error correction code check symbols are each 8 bits.

30. The controller of claim 24, wherein the programmable error corrector means further comprises a dual ported register file.

31. The controller of claim 24, wherein the circuit means in the finite field multiplication means includes a combinatorial logic array for performing single step finite field multiplication operations.

32. The controller of claim 24, wherein the programmable error corrector means includes arithmetic logic means, separate from the finite field processor means, for performing arithmetic and logic operations.

33. The controller of claim 24, wherein the programmable error corrector means includes a register file including an accumulator register for storing the sum.

34. The controller of claim 33, wherein the register file includes a product register for storing the product.

35. The controller of claim 34, wherein the first gating means provides selected operands referred to in the predetermined instruction.

36. The controller of claim 35, wherein the second gating means operates during execution of the predetermined instruction to provide operands to the adder inputs from the accumulator register and from the product register.

* * * * *